United States Patent
Nakahara et al.

(10) Patent No.: US 10,312,739 B2
(45) Date of Patent: Jun. 4, 2019

(54) NON-CONTACT POWER TRANSMISSION DEVICE

(71) Applicant: Yazaki Corporation, Tokyo (JP)

(72) Inventors: Takahiro Nakahara, Shizuoka (JP); Takashi Shiroki, Shizuoka (JP); Yo Yanagida, Shizuoka (JP); Antony Wambugu Ngahu, Shizuoka (JP); Keisuke Ueta, Shizuoka (JP)

(73) Assignee: YAZAKI CORPORATION, Tokyo (JP)

(*) Notice: Subject to any disclaimer, the term of this patent is extended or adjusted under 35 U.S.C. 154(b) by 148 days.

(21) Appl. No.: 15/467,448

(22) Filed: Mar. 23, 2017

(65) Prior Publication Data

US 2017/0288463 A1 Oct. 5, 2017

(30) Foreign Application Priority Data

Mar. 30, 2016 (JP) ................. 2016-069143

(51) Int. Cl.
| | |
|---|---|
| *H02J 50/12* | (2016.01) |
| *H03H 7/40* | (2006.01) |
| *H02J 50/40* | (2016.01) |
| *H02J 50/70* | (2016.01) |

(52) U.S. Cl.
CPC ............ *H02J 50/12* (2016.02); *H02J 50/40* (2016.02); *H02J 50/70* (2016.02); *H03H 7/40* (2013.01)

(58) Field of Classification Search
USPC ........................................... 307/104
See application file for complete search history.

(56) References Cited

U.S. PATENT DOCUMENTS

| | | | |
|---|---|---|---|
| 9,796,281 B2* | 10/2017 | Park ................ | B60L 11/182 |
| 2011/0241440 A1 | 10/2011 | Sakoda et al. | |
| 2011/0248572 A1 | 10/2011 | Kozakai et al. | |
| 2012/0038220 A1* | 2/2012 | Kim ................. | H02J 7/025 |
| | | | 307/104 |
| 2012/0161532 A1 | 6/2012 | Ogawa et al. | |

FOREIGN PATENT DOCUMENTS

| | | |
|---|---|---|
| JP | 2010-141977 A | 6/2010 |
| JP | 2010-233354 A | 10/2010 |
| JP | 2011-223739 A | 11/2011 |

(Continued)

OTHER PUBLICATIONS

Japanese Office Action for the related Japanese Patent Application No. 2016-069143 dated Aug. 21, 2018.

*Primary Examiner* — Rexford N Barnie
*Assistant Examiner* — Xuan Ly
(74) *Attorney, Agent, or Firm* — Kenealy Vaidya LLP

(57) ABSTRACT

A non-contact power transmission device includes a resonance coil and a resonance capacitor, and includes impedance variable circuits the impedance of which can be changed. In the non-contact power transmission device, a power transmission side controller changes impedance of one of the impedance variable circuits, a power reception side controller changes impedance of the other one of the impedance variable circuits, and output impedance on a power supply side with respect to a power transmission coil unit and input impedance on a load side with respect to the power transmission coil unit are matched.

15 Claims, 35 Drawing Sheets

(56) References Cited

FOREIGN PATENT DOCUMENTS

| | | |
|---|---|---|
| JP | 2012-34494 A | 2/2012 |
| JP | 2012-135117 A | 7/2012 |
| JP | 2012-205485 A | 10/2012 |
| JP | 2012205485 * | 10/2012 |
| JP | 2013-226041 A1 | 10/2013 |
| WO | 2014/136257 A1 | 9/2014 |
| WO | 2013/080285 A1 | 4/2015 |

* cited by examiner

AXIAL DIRECTION

| SWITCH INPUT SIGNAL | ON/OFF |
|---|---|
| SW1 | ON |
| SW2 | ON |
| SW3 | OFF |

→

| SWITCH INPUT SIGNAL | CORRE-SPONDING LOAD | CURRENT VALUE |
|---|---|---|
| SW1 | FIRST LOAD | 0.5 A |
| SW2 | SECOND LOAD | 2.0 A |
| SW3 | THIRD LOAD | 5.0 A |

→ TOTAL: 2.5 A

TOTAL CURRENT VALUE: 2.5 A →

| CURRENT CONDITION | RESONANCE L CHANGEOVER SWITCH | | | OUTPUT FREQUENCY |
|---|---|---|---|---|
| | L1_SW1 | L1_SW2 | L1_SW3 | |
| 0.0 A < CURRENT VALUE ≤ 1.0 A | OFF | OFF | ON | 100 kHz |
| 1.0 A < CURRENT VALUE ≤ 5.0 A | OFF | ON | OFF | 25 kHz |
| 5.0 A < CURRENT VALUE | ON | OFF | OFF | |

NON-CONTACT POWER TRANSMISSION DEVICE

CROSS-REFERENCE TO RELATED APPLICATION(S)

The present application claims priority to and incorporates by reference the entire contents of Japanese Patent Application No. 2016-069143 filed in Japan on Mar. 30, 2016.

BACKGROUND OF THE INVENTION

1. Field of the Invention

The present invention relates to a non-contact power transmission device.

2. Description of the Related Art

In the related art, there is known a non-contact power transmission device that transmits electric power in a non-contact manner. For example, the non-contact power transmission device transmits electric power from a power transmission coil unit connected to a power supply to a power reception coil unit by magnetic resonance, and supplies electric power to a load connected to the power reception coil unit via a rectifier (for example, refer to Japanese Patent Application Laid-open No. 2012-34494). The non-contact power transmission device matches output impedance of a circuit on the power supply side connected to the power transmission coil unit and input impedance of the power transmission coil unit using a matching circuit in accordance with a change in impedance of the load and the like.

However, the non-contact power transmission device still has room for improvement in matching the output impedance and the input impedance.

SUMMARY OF THE INVENTION

The present invention is made in view of such a situation, and provides a non-contact power transmission device that properly matches the output impedance and the input impedance.

In order to solve the above mentioned problem and achieve the object, a non-contact power transmission device according to one aspect of the present invention includes a power supply that supplies electric power; a power transmission coil unit that is connected to the power supply and transmits electric power in a non-contact manner; a power reception coil unit that is connected to a load that consumes electric power, receives the electric power transmitted from the power transmission coil unit in a non-contact manner, and supplies the received electric power to the load; and a controller configured to control the power transmission coil unit and the power reception coil unit, wherein at least one of the power transmission coil unit and the power reception coil unit includes an impedance variable circuit an impedance of which is variable, the impedance variable circuit includes at least one of a resonance coil capable of changing an inductance value of the impedance variable circuit and a resonance capacitor capable of changing a capacitance of the impedance variable circuit, and the controller configured to change impedance of the impedance variable circuit, and match an output impedance on the power supply side with respect to the power transmission coil unit and an input impedance on the load side with respect to the power transmission coil unit.

According to another aspect of the present invention, in the non-contact power transmission device, it is preferable that the impedance variable circuit includes a plurality of LC circuits including a pair of a resonance coil and a resonance capacitor, and the controller configured to switch the LC circuits to be connected in series or in parallel to change the inductance value and the capacitance, and match the output impedance and the input impedance.

According to still another aspect of the present invention, in the non-contact power transmission device, it is preferable that the impedance variable circuit includes a plurality of resonance coils and one resonance capacitor, and the controller configured to switch the resonance coils to be connected in series or in parallel to change the inductance value, and match the output impedance and the input impedance.

According to still another aspect of the present invention, in the non-contact power transmission device, it is preferable that the resonance coils are sequentially connected in series, and a conductor cross-sectional area of the resonance coil at a later stage is smaller than a conductor cross-sectional area of the resonance coil at a former stage.

According to still another aspect of the present invention, in the non-contact power transmission device, it is preferable that the impedance variable circuit includes a plurality of resonance capacitors and one resonance coil, and the controller configured to switch connection states of the resonance capacitors to change the capacitance, and match the output impedance and the input impedance.

According to still another aspect of the present invention, in the non-contact power transmission device, it is preferable that the load is operated with an operation switch that causes electric current to flow when being turned on and causes the electric current to be stopped when being turned off, and the controller configured to change impedance of the impedance variable circuit based on an on or off operation of the operation switch.

According to still another aspect of the present invention, in the non-contact power transmission device, it is preferable that the controller configured to further change the impedance of the impedance variable circuit based on time that has elapsed after the operation switch is turned on.

According to still another aspect of the present invention, in the non-contact power transmission device, it is preferable that the controller configured to report anomaly when a current value of electric current actually supplied to the load does not satisfy a predetermined threshold value of electric current.

According to still another aspect of the present invention, in the non-contact power transmission device, it is preferable to further include a matching circuit including a variable coil different from the resonance coil and a variable capacitor different from the resonance capacitor, wherein the controller preferably configured to cause the impedance variable circuit to cooperate with the matching circuit, and match the output impedance and the input impedance.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 28 is a diagram illustrating a configuration example of a load current table according to the second embodiment;
FIG. 29 is a diagram illustrating a configuration example of a resonance L circuit selection table according to the second embodiment.

DETAILED DESCRIPTION OF THE PREFERRED EMBODIMENTS

The following describes modes for carrying out the invention (embodiments) in detail with reference to the drawings. The present invention is not limited to the embodiments described below. Components described below include a component that is easily conceivable by those skilled in the art and components that are substantially the same. The components described below can be appropriately combined. The components can be various omitted, replaced, or modified without departing from the gist of the present invention.

First Embodiment

Figure 1:
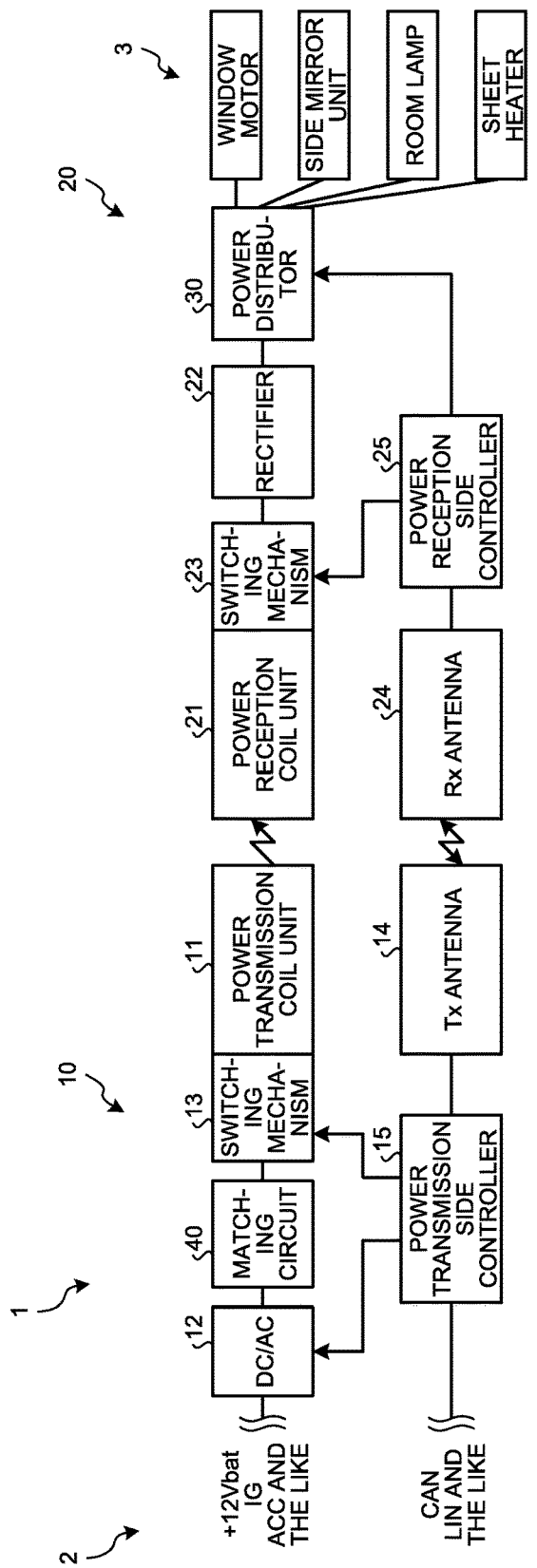
FIG. 1 is a schematic diagram illustrating a configuration example of a non-contact power transmission device according to a first embodiment.

A non-contact power transmission device 1 according to a first embodiment transmits electric power in a non-contact manner. As illustrated in FIG. 1, the non-contact power transmission device 1 includes a power transmission unit 10, a power reception unit 20, and a power distributor 30. The non-contact power transmission device 1 is arranged, for example, at a door hinge unit, a steering column unit, a sheet unit, and the like of a vehicle (not illustrated). The power transmission unit 10 of the non-contact power transmission device 1 is connected to a power supply 2 of the vehicle, the power reception unit 20 thereof is connected to the power distributor 30, and the power distributor 30 is connected to loads 3 of the vehicle. The non-contact power transmission device 1 transmits electric power of the power supply 2 from the power transmission unit 10 to the power reception unit 20 by magnetic resonance, and distributes the electric power received by the power reception unit 20 to the loads 3 with the power distributor 30. The following describes the non-contact power transmission device 1 in detail.

The following describes the power transmission unit 10. The power transmission unit 10 transmits electric power to the power reception unit 20 by magnetic resonance in a non-contact manner. The power transmission unit 10 is configured as one unit including a power transmission coil unit 11, an inverter (DC/AC) 12, a switching mechanism 13, a Tx antenna 14, and a power transmission side controller 15. The power transmission unit 10 may be configured as one unit including the power transmission coil unit 11, may be configured as one unit excluding the power transmission coil unit 11, and may be configured as one unit excluding the inverter (DC/AC) 12 and the Tx antenna 14. In the power transmission unit 10, places at which individual circuits are mounted are not limited so long as an operation of a system is not limited.

Figure 2:
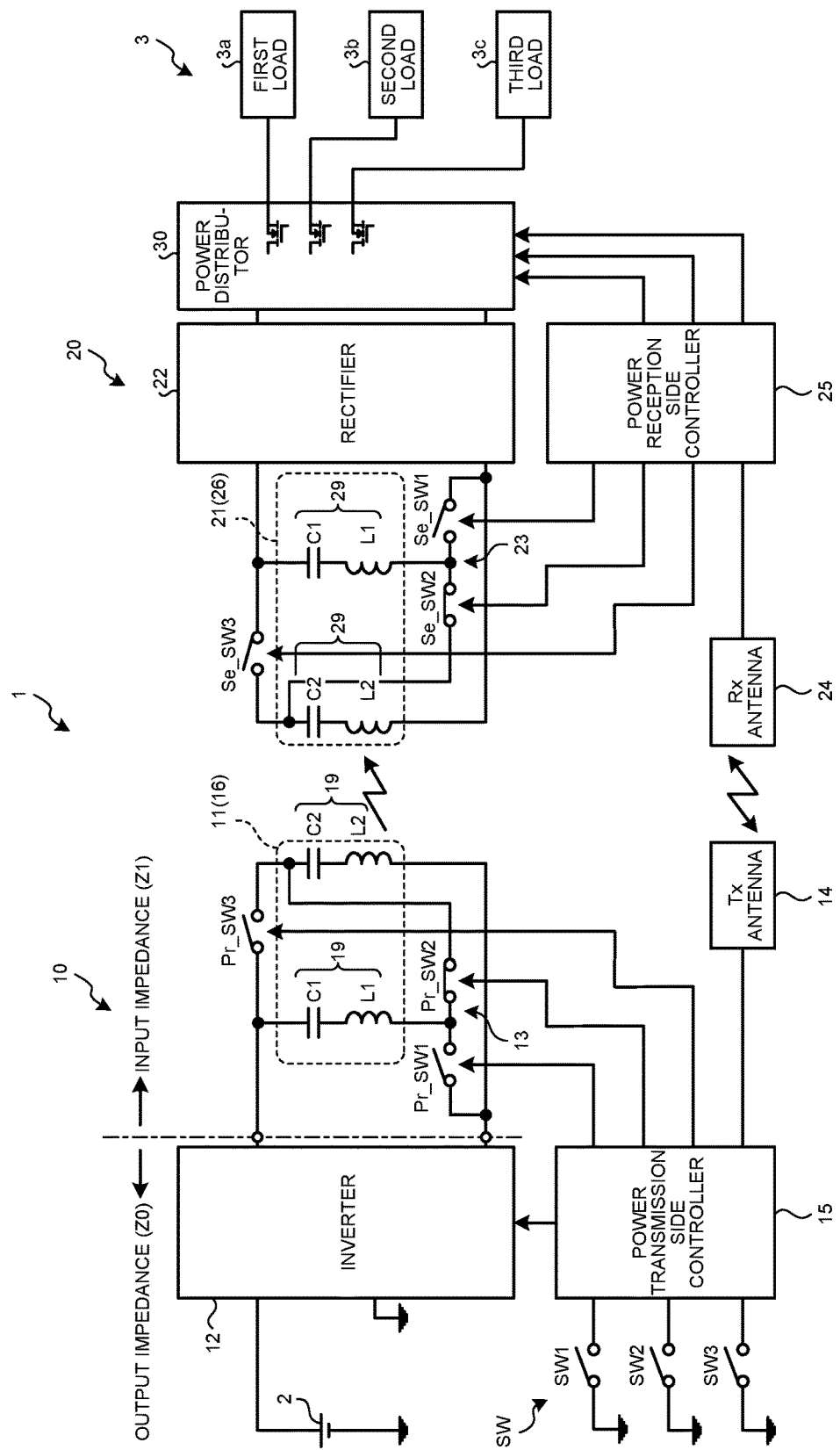
FIG. 2 is a block diagram illustrating a configuration example of the non-contact power transmission device according to the first embodiment.

The power transmission coil unit 11 transmits electric power in a non-contact manner. As illustrated in FIG. 2, the power transmission coil unit 11 includes an impedance variable circuit 16 the impedance of which is variable. The impedance variable circuit 16 includes resonance coils L (L1, L2) that can change an inductance value of the impedance variable circuit 16 and resonance capacitors C (C1, C2) that can change capacitance of the impedance variable circuit 16. For example, the impedance variable circuit 16 includes a plurality of LC circuits 19 including a pair of the resonance coil L and the resonance capacitor C. In the impedance variable circuit 16, the individual LC circuits 19 may be connected in parallel or in series via the switching mechanism 13, or the individual LC circuits 19 may be selectively connected. Accordingly, in the impedance variable circuit 16, the inductance value of the resonance coil L and the capacitance of the resonance capacitor C are changed, and the impedance of the impedance variable circuit 16 is changed.

The inverter 12 is connected to the power supply 2, and converts a direct current supplied from the power supply 2 into an alternating current. For example, a switching element (not illustrated) of the inverter 12 is controlled to be turned ON/OFF, and the inverter 12 converts a direct current into an alternating current. The inverter 12 outputs the converted AC (alternating current) power to the switching mechanism 13.

The switching mechanism 13 is connected to the inverter 12, and switches a path through which the alternating current output from the inverter 12 flows. For example, the switching mechanism 13 includes a plurality of resonance LC changeover switches Pr_SW (Pr_SW1 to Pr_SW3), and connection of the individual LC circuits 19 in the power transmission coil unit 11 is switched when the resonance LC changeover switches Pr_SW are controlled to be turned ON/OFF. Specifically, the switching mechanism 13 causes the individual LC circuits 19 to be connected in parallel or in series, or causes the LC circuits 19 to be selectively connected. For example, when the resonance LC changeover switch Pr_SW2 is turned ON and the resonance LC changeover switches Pr_SW1 and Pr_SW3 are turned OFF, the switching mechanism 13 causes the individual LC circuits 19 to be connected in series. When the resonance LC changeover switches Pr_SW1 and Pr_SW3 are turned ON and the resonance LC changeover switch Pr_SW2 is turned OFF, the switching mechanism 13 causes the individual LC circuits 19 to be connected in parallel. As the resonance LC changeover switch Pr_SW of the switching mechanism 13, a semiconductor switch, a mechanical switch, or the like is used.

The Tx antenna 14 is connected to the power transmission side controller 15, and transmits, to the power reception unit 20, information transmitted from the power transmission side controller 15. For example, the Tx antenna 14 transmits, to the power reception unit 20, switch information indicating an ON/OFF operation of operation switches SW (SW1 to SW3) that cause an electric current to flow when being turned ON and cause the electric current to be stopped when being turned OFF.

The power transmission side controller 15 is a controller connected to the inverter 12, and controls the switching element of the inverter 12 to be turned ON/OFF to convert the direct current into the alternating current. The power transmission side controller 15 is connected to the operation switch SW. When the operation switch SW is operated by a user to be turned ON/OFF, the power transmission side controller 15 receives the switch information from the operation switch SW. The power transmission side controller 15 is connected to the switching mechanism 13, controls the resonance LC changeover switch Pr_SW of the switching mechanism 13 to be turned ON/OFF based on the received switch information and the like, and switches connection of the individual LC circuits 19 in the impedance variable circuit 16. Accordingly, even when impedance of the load 3 consuming electric power is changed, the power transmission side controller 15 changes the impedance of the impedance variable circuit 16 by changing the inductance value and the capacitance of the impedance variable circuit 16, and matches output impedance Z0 on the power supply 2 side with respect to the power transmission coil unit 11 and input impedance Z1 on the load 3 side with respect to the power transmission coil unit 11 in cooperation with impedance control performed by a power reception side controller 25 described later. In this case, "matches the output impedance Z0 and the input impedance Z1" means that impedance matching is performed so that power transmission can be performed with high efficiency. Typically, assumed are a case in which the output impedance Z0 and the input impedance Z1 are completely matched, a case in which the output impedance Z0 and the input impedance Z1 are slightly different, and the like. When only the resonance coil L is considered without considering the resonance capacitor C, for example, the input impedance Z1 is obtained through the following expression (1) assuming that the inductance value is Lx and that the resonance frequency is f. According to the expression (1), the input impedance Z1 is changed when the inductance value Lx or the resonance frequency f is changed.

$$Z1 = 2\pi f Lx \quad (1)$$

Next, the following describes the power reception unit 20. The power reception unit 20 receives the electric power transmitted from the power transmission unit 10 by magnetic resonance, and supplies the received electric power to loads 3 (a first load 3a to a third load 3c). The power reception unit 20 is configured as one unit including a power reception coil unit 21, a rectifier 22, a switching mechanism 23, an Rx antenna 24, and the power reception side controller 25. The power reception unit 20 may be configured as one unit including the power reception coil unit 21, may be configured as one unit excluding the power reception coil unit 21, and may be configured as one unit excluding the rectifier 22 and the Rx antenna 24. In the power reception unit 20, places at which individual circuits are mounted are not limited so long as the operation of the system is not limited.

The power reception coil unit 21 receives electric power in a non-contact manner. The power reception coil unit 21 has the same configuration as that of the power transmission coil unit 11, and includes an impedance variable circuit 26 the impedance of which is variable. The impedance variable circuit 26 includes the resonance coils L (L1, L2) that can change the inductance value of the impedance variable circuit 26 and resonance capacitors C (C1, C2) that can change capacitance of the impedance variable circuit 26. For example, the impedance variable circuit 26 includes a plurality of LC circuits 29 including a pair of the resonance coil L and the resonance capacitor C. In the impedance variable circuit 26, the individual LC circuits 29 may be connected in parallel or in series via the switching mechanism 23, or the individual LC circuits 29 may be selectively connected. Accordingly, in the impedance variable circuit 26, the inductance value of the resonance coil L and the capacitance of the resonance capacitor C are changed, and the impedance of the impedance variable circuit 26 is changed.

The switching mechanism 23 is connected to the power reception coil unit 21, and switches a path through which the electric current output from the power reception coil unit 21 flows. For example, the switching mechanism 23 includes a plurality of resonance LC changeover switches Se_SW (Se_SW1 to Se_SW3) similarly to the switching mechanism 13 of the power transmission unit 10, and connection of the individual LC circuits 29 in the power reception coil unit 21 is switched when the resonance LC changeover switches Se_SW are controlled to be turned ON/OFF. Specifically, the switching mechanism 23 causes the LC circuits 29 to be connected in parallel or in series, or causes the individual LC circuits 29 to be selectively connected. As the resonance LC changeover switch Se_SW of the switching mechanism 23, a semiconductor switch, a mechanical switch, or the like is used.

The rectifier 22 is connected to the power reception coil unit 21 via the switching mechanism 23, and converts the alternating current into the direct current. For example, the rectifier 22 performs full-wave rectification with a rectifier element (not illustrated). The rectifier 22 outputs rectified DC (direct current) power to the power distributor 30.

The power distributor 30 is connected to the rectifier 22 and the loads 3, and distributes the DC power rectified by the rectifier 22 to the loads 3. For example, the power distributor 30 distributes the DC power to the loads 3 such as a window motor, a side mirror unit, a room lamp, and a sheet heater.

The Rx antenna 24 is connected to the power reception side controller 25, and outputs information received from the Tx antenna 14 to the power reception side controller 25. For example, the Rx antenna 24 receives the switch information from the Tx antenna 14, and transmits the switch information to the power reception side controller 25. Described above is an example of the non-contact power transmission device 1 in which information is transmitted between the power transmission unit 10 and the power reception unit 20 through wireless communication using the Tx antenna 14 and the Rx antenna 24. However, the embodiment is not limited thereto. For example, for a communication system such as CAN, the non-contact power transmission device 1 may transmit information between the power transmission unit 10 and the power reception unit 20 through wired communication using a wired communication line instead of wireless communication using antennas.

The power reception side controller 25 is a controller that controls a distribution switch of the power distributor 30 to be turned ON/OFF based on the switch information received by the Rx antenna 24 so that the power distributor 30 distributes the electric current flowing in the loads 3. The power reception side controller 25 controls the resonance LC changeover switches Se_SW of the switching mechanism 23 to be turned ON/OFF based on the switch information so that the resonance LC changeover switches Se_SW switch connections of the individual LC circuits 29 in the impedance variable circuit 26. Accordingly, even when the impedance of the load 3 is changed, the power reception side controller 25 changes the impedance of the impedance variable circuit 26 by changing the inductance value and the capacitance of the impedance variable circuit 26, and matches the output impedance Z0 on the power supply 2 side with respect to the power transmission coil unit 11 and the input impedance Z1 on the load 3 side with respect to the power transmission coil unit 11 in cooperation with impedance control performed by the power transmission side controller 15 described above.

Figure 3:
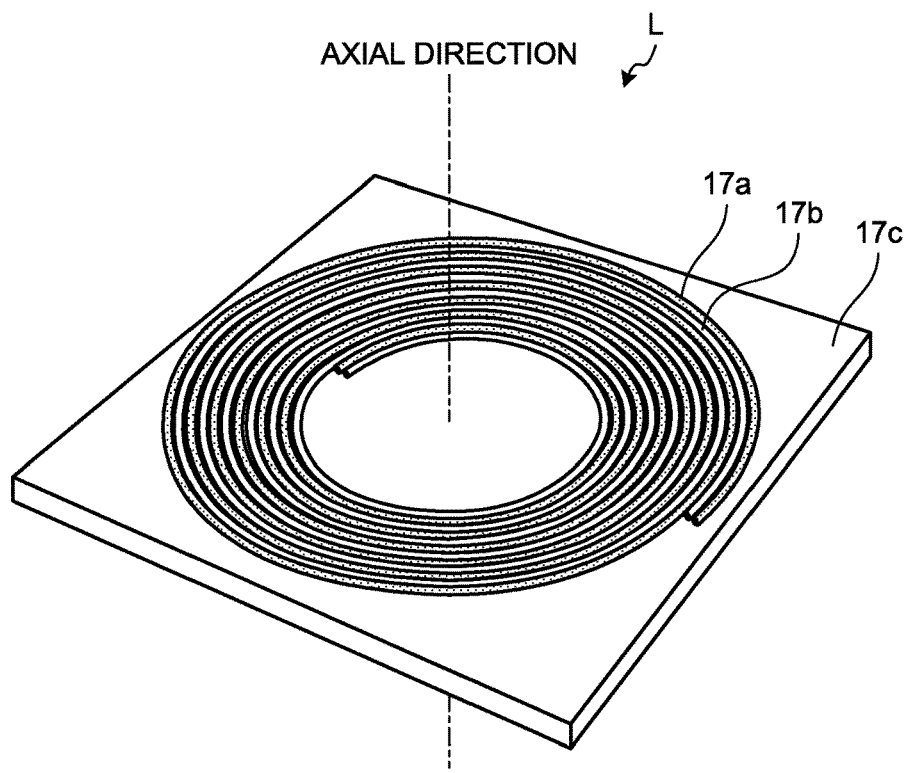
FIG. 3 is a perspective view illustrating a configuration example of a resonance coil according to the first embodiment.

Next, the following describes a configuration example of the resonance coil L. As illustrated in FIG. 3, the resonance coil L has a spiral shape, for example. The resonance coil L is formed in a spiral shape such that a plurality of (for example, two) coil wires 17a and 17b are arranged side by side in a direction orthogonal to an axial direction of the resonance coil L. In the resonance coil L, for example, the coil wires 17a and 17b are wound six times in a spiral shape.

The size of the resonance coil L can be reduced by using a plurality of coil wires 17a and 17b. The resonance coil L can be adjusted to have a plurality of inductance values by connecting the coil wires 17a and 17b in parallel or in series. In the resonance coil L, for example, a magnetic body 17c made of ferrite or the like is arranged to be opposed to the axial direction. As the magnetic body 17c, one plate-shaped magnetic member having substantially the same size as that of the resonance coil L may be arranged to be opposed to the resonance coil L, or divided magnetic members may be arranged side by side along the resonance coil L. The resonance coil L may have a different shape, and does not necessarily include the magnetic body 17c so long as a desired inductance value and a desired coupling coefficient can be obtained.

Next, the following describes switching control of the LC circuit 19 in the impedance variable circuit 16 of the power transmission coil unit 11. Switching control for the impedance variable circuit 26 of the power reception coil unit 21 is the same as that for the impedance variable circuit 16 of the power transmission coil unit 11, so that description thereof will not be repeated.

Figure 4:
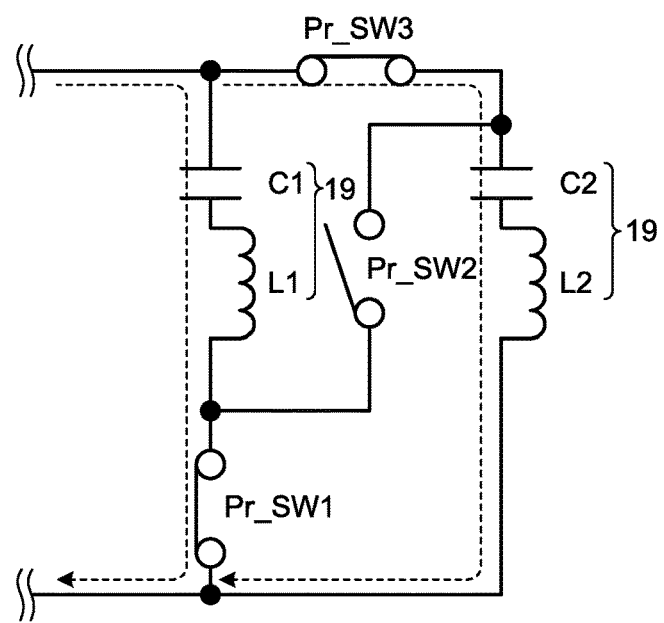
FIG. 4 is a circuit diagram illustrating a switching example (parallel) of an LC circuit according to the first embodiment.
Figure 6:
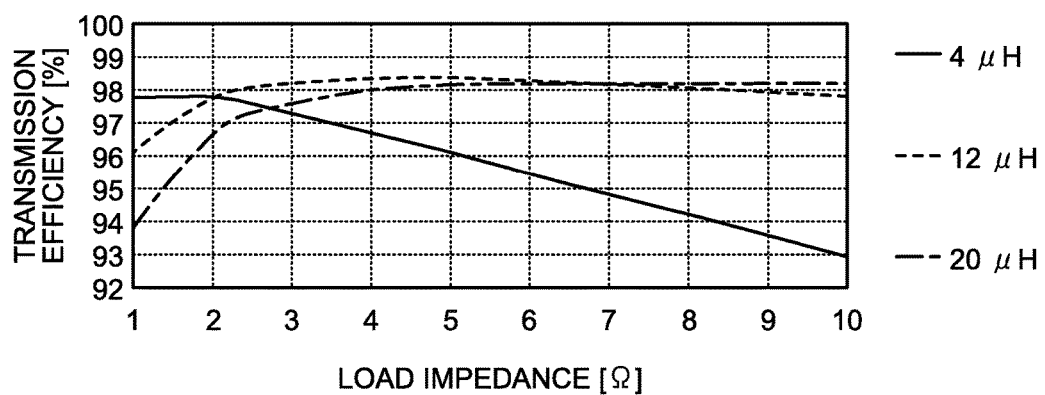
FIG. 6 is a diagram illustrating a relation between impedance of a load and transmission efficiency according to the first embodiment.

If it is determined that a current value of the electric current flowing in the load 3 is relatively large and that the impedance of the load 3 is relatively small based on the switch information, the power transmission side controller 15 sets the resonance LC changeover switches Pr_SW1 and Pr_SW3 of the switching mechanism 13 to be ON and sets the resonance LC changeover switch Pr_SW2 to be OFF as illustrated in FIG. 4 to connect the individual LC circuits 19 in parallel. In this case, as illustrated in FIG. 6, the power transmission side controller 15 connects the individual LC circuits 19 in parallel so that the inductance value of the resonance coil L is 4 μH until the impedance of the load 3 reaches, for example, about 2Ω. As described above, when the impedance of the load 3 is small, the inductance value of the resonance coil L becomes small as compared with a case of series connection, so that the power transmission side controller 15 can improve transmission efficiency. The resonance coils L are connected in parallel in the impedance variable circuit 16, so that the resonance coils L can be assumed to be one resonance coil L, and that a conductor cross-sectional area of the resonance coil L per unit current can be increased. Thus, the impedance variable circuit 16 can reduce a resistance value of the resonance coil L, and can suppress a loss in power transmission by the resonance coil L. Accordingly, the impedance variable circuit 16 can suppress heat generation, and can simplify and downsize a heat radiation structure. The impedance variable circuit 16 can use the resonance coil L having a small conductor cross-sectional area, so that the size of the resonance coil L can be reduced.

Figure 5:
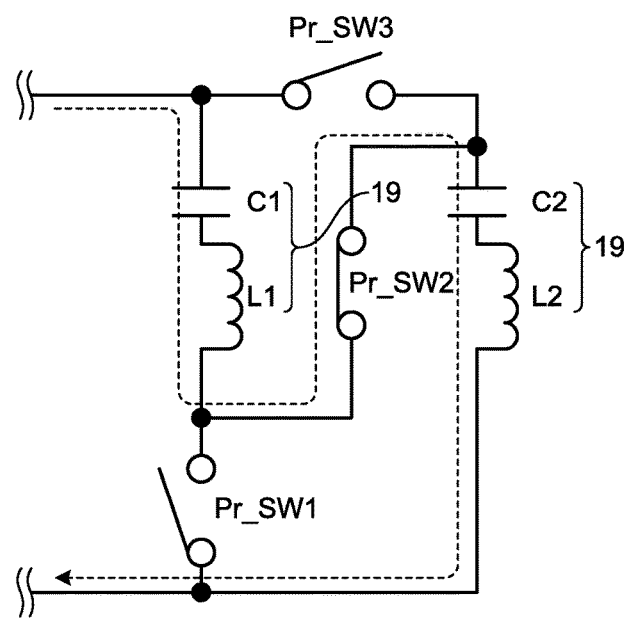
FIG. 5 is a circuit diagram illustrating a switching example (series) of the LC circuit according to the first embodiment.

If it is determined that the current value of the electric current flowing in the load 3 is relatively small and that the impedance of the load 3 is relatively large based on the switch information, the power transmission side controller 15 sets the resonance LC changeover switch Pr_SW2 of the switching mechanism 13 to be ON and sets the resonance LC changeover switches Pr_SW1 and Pr_SW3 to be OFF as illustrated in FIG. 5 to connect the individual LC circuits 19 in series. In this case, as illustrated in FIG. 6, the power transmission side controller 15 connects the individual LC circuits 19 in series so that the inductance value of the resonance coil L is 12 μH while the impedance of the load 3 is in a range from, for example, about 2Ω to about 7Ω. The power transmission side controller 15 connects the individual LC circuits 19 in series so that the inductance value of the resonance coil L is 20 μH while the impedance of the load 3 is in a range from, for example, about 7Ω to about 10Ω. FIG. 5 illustrates an example in which two resonance coils L are connected in series to cause the inductance value of the resonance coil L to be 12 μH. Alternatively, three resonance coils L may be connected in series to cause the inductance value of the resonance coil L to be 20 μH. The resonance coil L having the inductance value of 4 μH and the resonance coil L having the inductance value of 12 μH may be connected in series to cause the inductance value of the resonance coil L to be 20 μH. When the impedance of the load 3 is relatively large, the inductance value of the resonance coil L becomes large as compared with a case of parallel connection, so that the power transmission side controller 15 can improve transmission efficiency. The current value of the electric current flowing in the load 3 is small, so that the impedance variable circuit 16 can suppress a loss in power transmission by the resonance coil L even when the conductor cross-sectional area of the resonance coil L is reduced. The impedance variable circuit 16 can use the resonance coil L having a small conductor cross-sectional area, so that the size of the resonance coil L can be reduced. In the impedance variable circuit 16, the inductance value is increased but the capacitance is reduced, so that the resonance frequency is not changed. In this example, the resonance frequency is 100 kHz.

Figure 7:
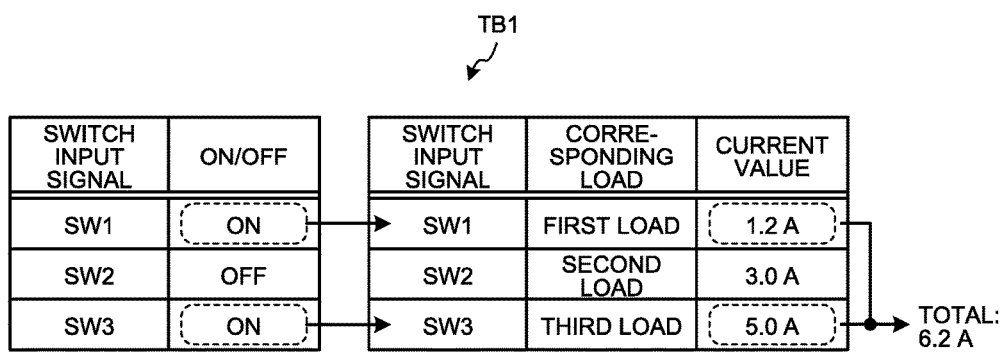
FIG. 7 is a diagram illustrating a configuration example of a load current table according to the first embodiment.
Figure 8:
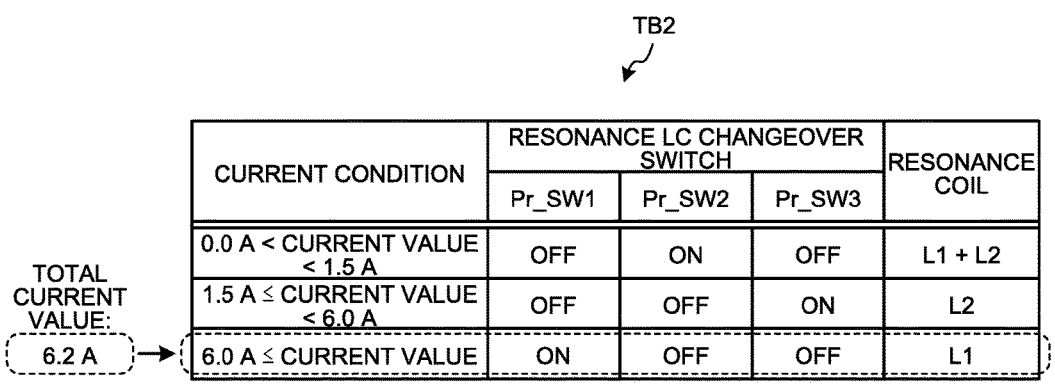
FIG. 8 is a diagram illustrating a configuration example of a resonance LC circuit selection table according to the first embodiment.

Next, the following describes a load current table TB1 and a resonance LC circuit selection table TB2. As illustrated in FIGS. 7 and 8, the non-contact power transmission device 1 includes the load current table TB1 and the resonance LC circuit selection table TB2. The load current table TB1 and the resonance LC circuit selection table TB2 are arranged in the power transmission unit 10 and the power reception unit 20, respectively.

The load current table TB1 is a table indicating a correspondence relation between the loads 3 (the first load 3a to the third load 3c) and the current value of the electric current flowing in the load 3. In the load current table TB1, the load 3 the operation switch SW of which is turned ON is specified based on the switch information, and the current value of the specified load 3 is specified. In the load current table TB1, the current value of the load 3 is constant without being changed with a lapse of time. The resonance LC circuit selection table TB2 is a table indicating a correspondence relation between a total current value obtained by totaling current values of all loads 3 and the resonance LC changeover switches Pr_SW (Pr_SW1 to Pr_SW3) for switching the individual LC circuits 19. The correspondence relation between the total current value of the resonance LC circuit selection table TB2 and the resonance LC changeover switch Pr_SW is determined so that the output impedance Z0 on the power supply 2 side with respect to the power transmission coil unit 11 and the input impedance Z1 on the load 3 side with respect to the power transmission coil unit 11 can be matched by switching the resonance LC changeover switch Pr_SW based on the total current value of the loads 3. In the resonance LC circuit selection table TB2, the resonance LC changeover switch Pr_SW is specified when the total current value of the loads 3 is determined. The impedance of the impedance variable circuit 16 is changed when the individual LC circuits 19 are connected in series or in parallel, or the individual LC circuits 19 are selectively connected, based on the specified resonance LC changeover switches Pr_SW. Accordingly, the impedance variable circuit 16 can match the output impedance Z0 and the input impedance Z1. The resonance LC circuit selection table TB2 illustrated in FIG. 8 is an exemplary table arranged in the power transmission unit 10. When the resonance LC circuit selection table TB2 is arranged in the power reception unit 20, although not illustrated, the resonance LC changeover switches Se_SW1 to Se_SW3 corresponding to the power reception unit 20 are set to items of the resonance LC changeover switches Pr_SW. The resonance LC changeover switch Pr_SW may be switched by turning ON/OFF the operation switch SW without using the total current value. In this case, used is a table indicating a correspondence relation between ON/OFF information of the operation switch SW and the resonance LC changeover switch Pr_SW.

Figure 9:
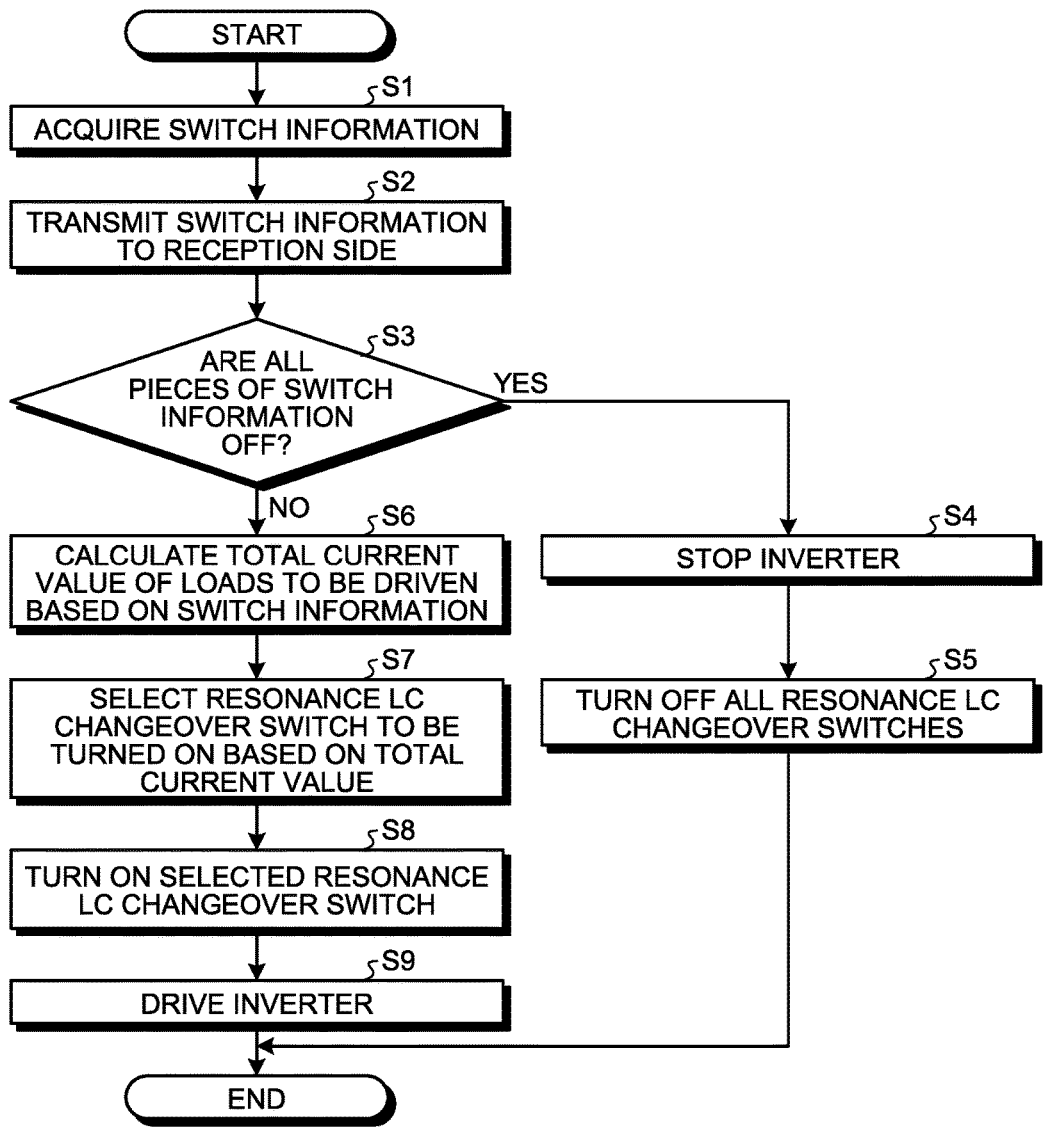
FIG. 9 is a flowchart illustrating an operation example of a power transmission side controller according to the first embodiment.

Next, the following describes an operation example of the non-contact power transmission device 1 according to the first embodiment. As illustrated in FIG. 9, the power transmission side controller 15 acquires the switch information indicating ON or OFF of the loads 3 from the operation switch SW (Step S1). Next, the power transmission side controller 15 transmits the switch information to the power reception unit 20 via the Tx antenna 14 (Step S2). The power transmission side controller 15 then determines whether all the loads 3 are set to be switched OFF based on the switch information (Step S3). If all the loads 3 are set to be switched OFF (Yes at Step S3), the power transmission side controller 15 stops the inverter 12 (Step S4), sets all the resonance LC changeover switches Pr_SW to be turned OFF (Step S5), and ends the processing.

If not all the load 3 are set to be switched OFF at Step S3 described above (No at Step S3), the power transmission side controller 15 calculates the total current value of the loads 3 to be driven based on the switch information (Step S6). For example, the power transmission side controller 15 refers to the load current table TB1, and calculates the total current value (6.2 A) obtained by totaling the current value (1.2 A) of the first load 3a the operation switch SW of which is turned ON and the current value (5.0 A) of the third load 3c the operation switch SW of which is turned ON. Next, the power transmission side controller 15 selects the resonance LC changeover switch Pr_SW to be turned ON based on the total current value (Step S7), and turns ON the selected resonance LC changeover switch Pr_SW (Step S8). For example, the power transmission side controller 15 refers to the resonance LC circuit selection table TB2, and according to the total current value (6.2 A), sets the resonance LC changeover switch Pr_SW1 to be ON, and sets the resonance LC changeover switches Pr_SW2 and Pr_SW3 to be OFF. Accordingly, when the total current value of the loads 3 is large and the impedance of the load 3 is small, the power transmission side controller 15 can set the LC circuit 19 including the resonance coil L1 that is wound six times in the impedance variable circuit 16 to perform power transmission. Thus, the power transmission side controller 15 can change the inductance value and the capacitance of the impedance variable circuit 16, and change the impedance of the impedance variable circuit 16. Accordingly, the power transmission side controller 15 can match the output impedance Z0 and the input impedance Z1 in cooperation with impedance control performed by the power reception side controller 25 (described later). Subsequently, the power transmission side controller 15 drives the inverter 12 to transmit electric power to the power reception unit 20 by magnetic resonance (Step S9), and ends the processing.

Figure 10:
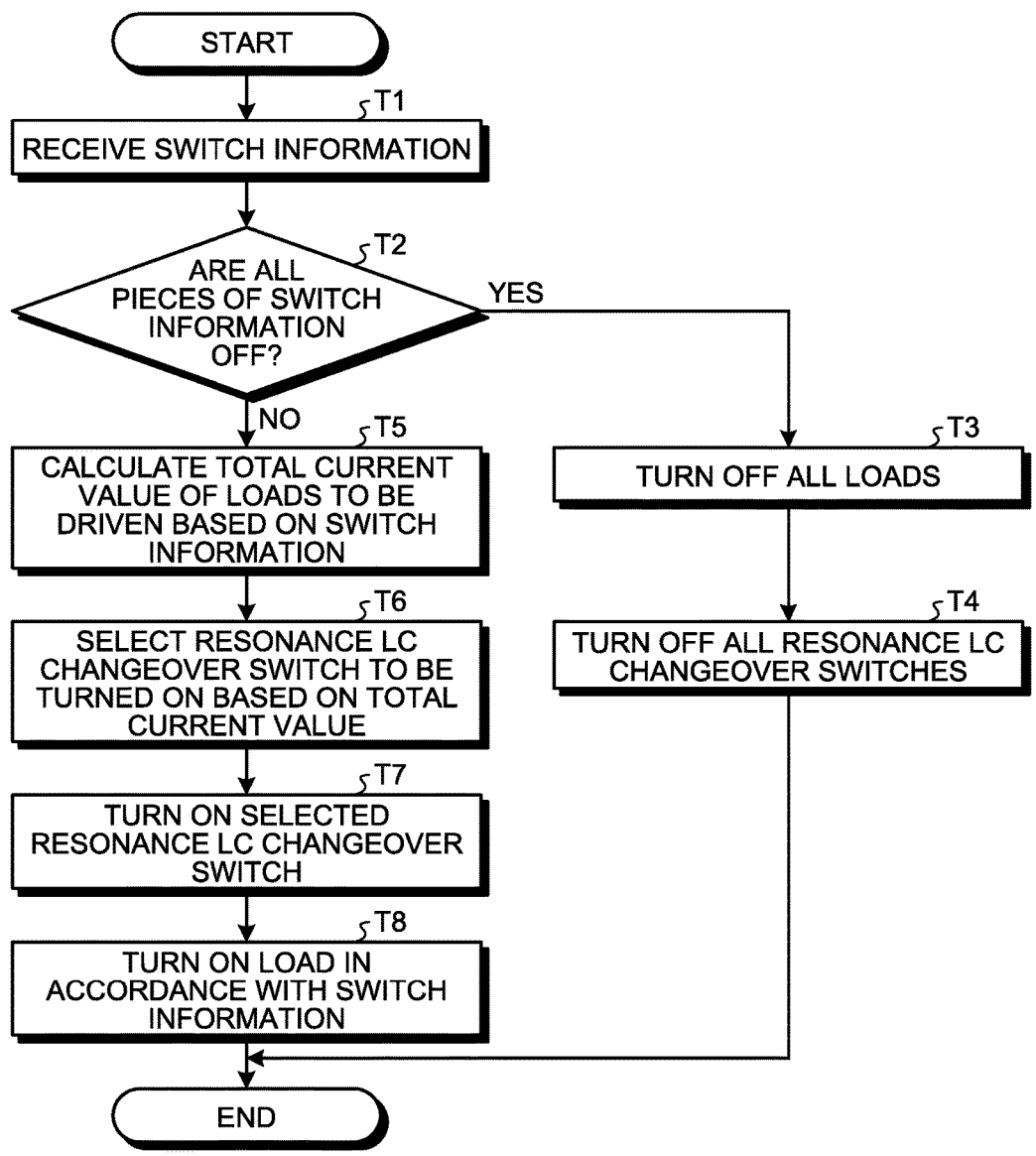
FIG. 10 is a flowchart illustrating an operation example of a power reception side controller according to the first embodiment.

Next, the following describes an operation example of the power reception side controller 25. As illustrated in FIG. 10, the power reception side controller 25 receives the switch information transmitted from the power transmission unit 10 (Step T1). Next, the power reception side controller 25 determines whether all the loads 3 are set to be switched OFF based on the switch information (Step T2). If all the loads 3 are set to be switched OFF (Yes at Step T2), the power reception side controller 25 sets all the loads 3 to be OFF (Step T3), sets all the resonance LC changeover switches Se_SW to be OFF (Step T4), and ends the processing.

If not all the loads 3 are set to be switched OFF at Step T2 described above (No at Step T2), the power reception side controller 25 calculates the total current value of the loads 3 to be driven based on the switch information (Step T5). For example, the power reception side controller 25 refers to the load current table TB1, and calculates the total current value (6.2 A) obtained by totaling the current value (1.2 A) of the first load 3a the operation switch SW of which is turned ON and the current value (5.0 A) of the third load 3c the operation switch SW of which is turned ON. Next, the power reception side controller 25 selects the resonance LC changeover switch Se_SW to be turned ON based on the total current value (Step T6), and turns ON the selected resonance LC changeover switch Se_SW (Step T7). For example, the power transmission side controller 15 refers to a resonance LC circuit selection table (not illustrated), and according to the total current value (6.2 A), sets the resonance LC changeover switch Se_SW1 to be ON, and sets the resonance LC changeover switches Se_SW2 and Se_SW3 to be OFF. Accordingly, when the total current value of the loads 3 is large and the impedance of the load 3 is small, the power reception side controller 25 can set the LC circuit 29 including the resonance coil L1 that is wound six times to perform power transmission. Thus, the power reception side controller 25 can change the inductance value and the capacitance of the impedance variable circuit 26, and change the impedance of the impedance variable circuit 26. Accordingly, the power reception side controller 25 can match the output impedance Z0 and the input impedance Z1 in cooperation with impedance control performed by the power transmission side controller 15. Next, the power reception side controller 25 sets the load 3 to be ON in accordance with the switch information (Step T8). For example, when the switch information indicates to turn ON the first load 3a and the third load 3c, the power reception side controller 25 instructs the power distributor 30 to turn ON the first load 3a and the third load 3c. The power distributor 30 sets the first load 3a and the third load 3c to be ON, and distributes the electric current to the first load 3a and the third load 3c.

Figure 11:
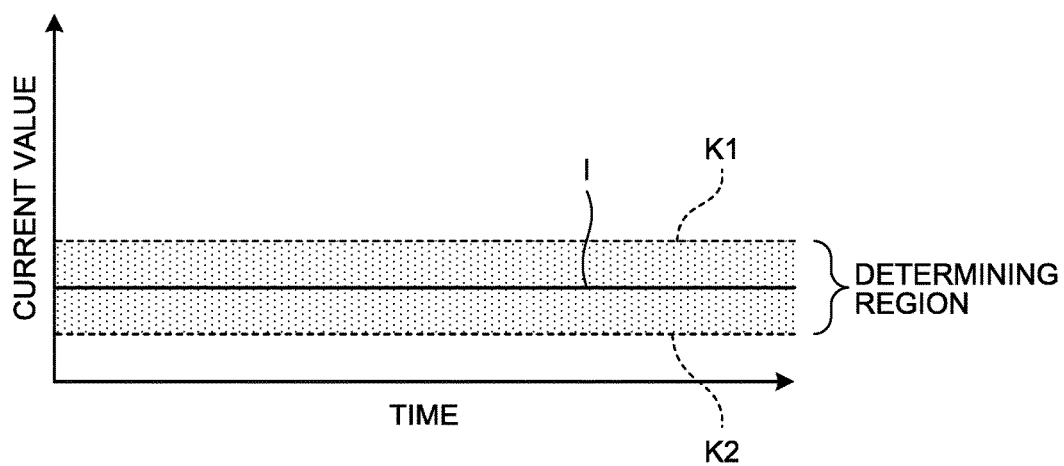
FIG. 11 is a diagram illustrating an example of anomaly determination of a current value of the load according to the first embodiment.
Figure 12:
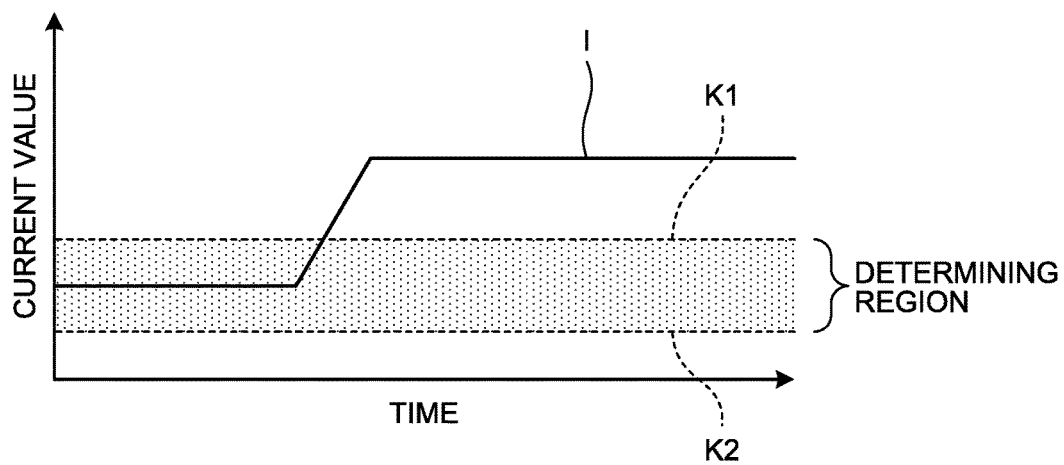
FIG. 12 is a diagram illustrating an example of anomaly determination of the current value of the load according to the first embodiment.

Next, the following describes anomaly detection of the current value of the electric current flowing in the load 3. At least one of the power transmission side controller 15 or the power reception side controller 25 reports anomaly when the current value of the electric current actually supplied to the load 3 does not satisfy a predetermined threshold value of the electric current. For example, as illustrated in FIGS. 11 and 12, the power transmission side controller 15 has a determining region in advance for determining anomaly as the threshold value. The determining region is a region in which the current value of the electric current has a constant width, and constituted of a range including an upper limit value K1 as an upper limit of the determining region and a lower limit value K2 as a lower limit of the determining region. The load 3 to be connected to the power reception unit 20 is specified, so that the current value of the electric current to be supplied to the load 3 can be estimated. Thus, a region having a constant width is set in advance as the determining region. The determining region is determined by taking account of a fluctuation of the current value caused by a manufacturing error, a mounting error, and the like to the current value determined for the load 3.

If the current value of the electric current actually supplied to the load 3 is within the determining region, the power transmission side controller 15 determines the current value to be normal. If the current value of the electric current actually supplied to the load 3 is outside the determining region, the power transmission side controller 15 determines the current value to be abnormal. For example, when a foreign substance is mixed between the resonance coil L of the power transmission coil unit 11 and the resonance coil L of the power reception coil unit 21 or the transmission path is short-circuited, and a current value I of the electric current flowing in the load 3 exceeds the upper limit value K1 in the determining region as illustrated in FIG. 12, the power transmission side controller 15 determines the current value to be abnormal. When a distance between the resonance coil L of the power transmission coil unit 11 and the resonance coil L of the power reception coil unit 21 becomes large or the transmission path is disconnected, and the current value I of the electric current flowing in the load 3 falls below the lower limit value K2 in the determining region although the electric current flows in the load 3 based on the switch information, the power transmission side controller 15 determines the current value to be abnormal. If the current value is determined to be abnormal, the power transmission side controller 15 reports anomaly with an alarm lamp, an alarm buzzer, or the like (not illustrated) arranged in the vehicle, and stops the inverter 12 or lowers an output from the inverter 12.

As described above, in the non-contact power transmission device 1 according to the first embodiment, the power transmission side controller 15 changes the impedance of the impedance variable circuit 16, the power reception side controller 25 changes the impedance of the impedance variable circuit 26, and the output impedance Z0 on the power supply 2 side with respect to the power transmission coil unit 11 and the input impedance Z1 on the load 3 side with respect to the power transmission coil unit 11 are matched. Accordingly, the non-contact power transmission device 1 can perform impedance matching in accordance with misregistration between the power transmission coil unit 11 and the power reception coil unit 21, variation in the impedance of the load 3, and the like. The non-contact power transmission device 1 can perform impedance matching without using a matching circuit 40 (described later), so that a circuit scale can be reduced. Thus, the non-contact power transmission device 1 can perform power transmission with high efficiency using a small scale circuit. The non-contact power transmission device 1 can perform power transmission with high efficiency, so that an electromagnetic wave can be prevented from leaking.

In the non-contact power transmission device 1, the power transmission side controller 15 switches the LC circuits 19 to be connected in series or in parallel to change the inductance value and the capacitance, the power reception side controller 25 switches the LC circuits 29 to be connected in series or in parallel to change the inductance value and the capacitance, and the output impedance Z0 and the input impedance Z1 are matched. Accordingly, in the non-contact power transmission device 1, when the LC circuits 19 and 29 are switched to be connected in parallel in a case in which the impedance of the load 3 is small, the inductance value of the resonance coil L is reduced as compared with a case of series connection, so that transmission efficiency can be improved. In addition, in the non-contact power transmission device 1, when the LC circuits 19 and 29 are switched to be connected in series in a case in which the impedance of the load 3 is large, the inductance value of the resonance coil L is increased as compared with a case of parallel connection, so that transmission efficiency can be improved.

In the non-contact power transmission device 1, the power transmission side controller 15 changes the impedance of the impedance variable circuit 16 based on the ON/OFF operation of the operation switch SW, and the power reception side controller 25 changes the inductance value and the capacitance of the impedance variable circuit 26 based on the ON/OFF operation of the operation switch SW. Accordingly, the non-contact power transmission device 1 changes the impedance of the impedance variable circuits 16 and 26 by simple control, so that an arithmetic amount can be suppressed.

In the non-contact power transmission device 1, when the current value of the electric current actually supplied to the load 3 does not satisfy the predetermined threshold value of the electric current, the power transmission side controller 15 reports anomaly. Accordingly, in the non-contact power transmission device 1, circuits can be prevented from being damaged in a case in which an overcurrent flows and the like. The non-contact power transmission device 1 can detect anomaly without adding sensors such as a thermistor thereto, so that the size of the device can be prevented from being increased.

Modification of First Embodiment

Figure 13:
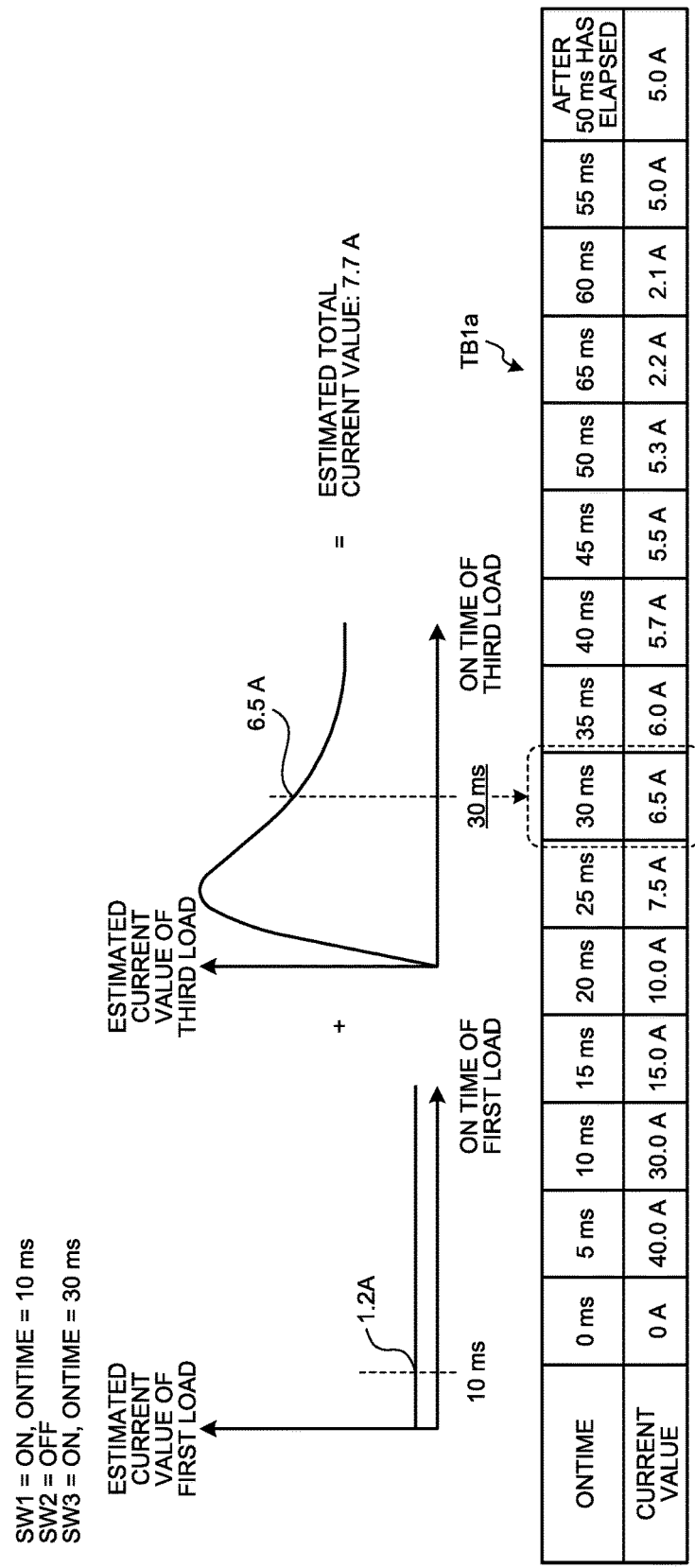
FIG. 13 is a diagram illustrating a configuration example of a load current table according to a modification of the first embodiment.

Next, the following describes a modification of the first embodiment. Described above is an example of the load current table TB1 in which the current value of the electric current flowing in the load 3 is constant, but there may be a case in which the current value of the electric current flowing in the load 3 varies with a lapse of time. As illustrated in FIG. 13, a load current table TB1a is a table assuming that the load 3 is a lamp and the like, for example, and the current value of the electric current flowing in the load 3 varies with a lapse of time. For example, the load current table TB1a is a table assuming that the third load 3c is a lamp, the current value of the third load 3c is increased immediately after the third load 3c is switched ON, the current value reaches a peak in 5 ms after the third load 3c is switched ON, and the current value of the third load 3c gradually falls after 5 ms has elapsed after the third load 3c is switched ON. In addition to estimation of the current value of the load 3, a varying current value of the load 3 may be measured in real time. In the load current table TB1a, the current value of the electric current flowing in the first load 3a is constant. In this case, according to the load current table TB1a, for example, in a state in which the first load 3a is switched ON and 30 ms has elapsed after the third load 3c is switched ON, an estimated total current value of the electric current flowing in the first load 3a and the third load 3c is 7.7 A obtained by adding the current value (1.2 A) of the first load 3a to the current value (6.5 A) of the third load 3c.

Figure 14:
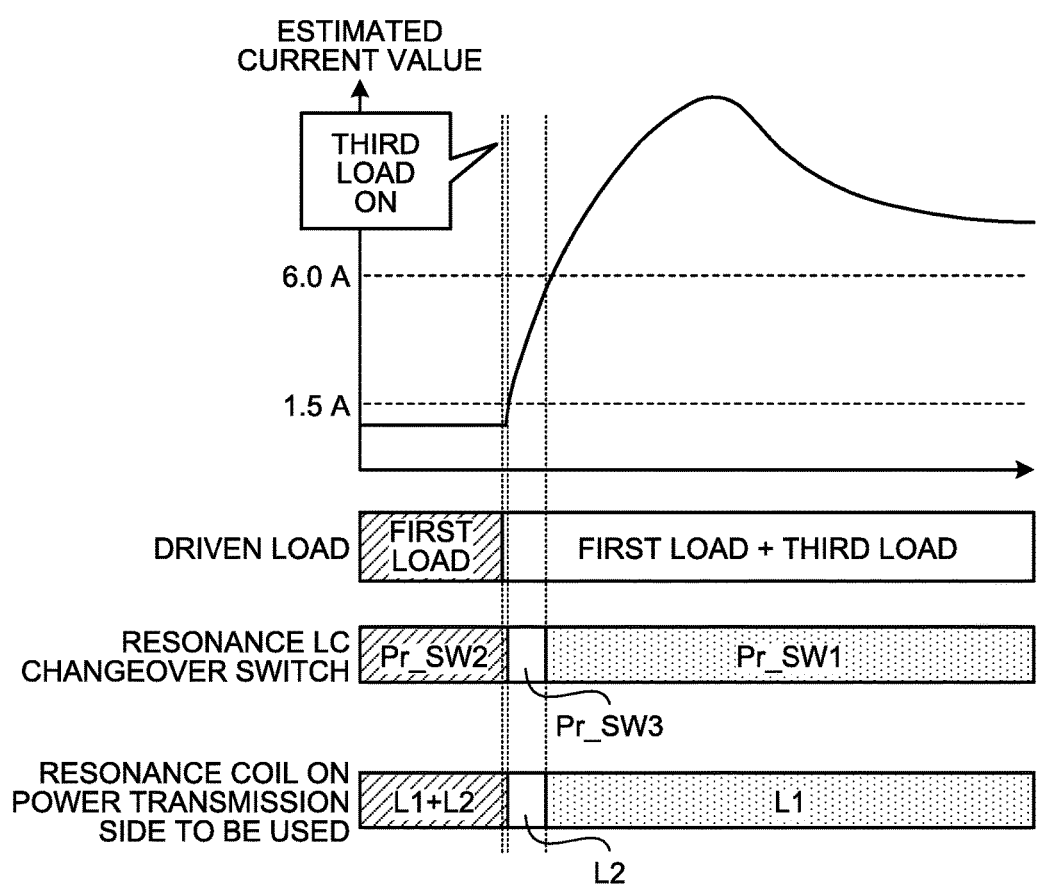
FIG. 14 is a diagram illustrating a relation between an estimated current value of a load and a resonance coil according to the modification of the first embodiment.

The power transmission side controller 15 switches the resonance LC changeover switch Pr_SW based on the estimated total current value of each load 3. For example, as illustrated in FIG. 14, when the operation switch SW of only the first load 3a is turned ON and the estimated total current value of the first load 3a and the third load 3c does not exceed 1.5 A, the power transmission side controller 15 sets the resonance LC changeover switch Pr_SW2 to be ON and sets the resonance LC changeover switches Pr_SW1 and Pr_SW3 to be OFF to connect the resonance coil L1 (wound six times) and L2 (wound twelve times) of the LC circuit 19.

When the operation switches SW of the first load 3a and the third load 3c are turned ON, and the estimated total current value of the first load 3a and the third load 3c the current values of which vary with a lapse of time is increased to be in a range from 1.5 A to 6.0 A, the power transmission side controller 15 sets the resonance LC changeover switch Pr_SW3 to be ON, and sets the resonance LC changeover switches Pr_SW1 and Pr_SW2 to be OFF to connect the resonance coil L2 (wound twelve times) of the LC circuit 19. When the operation switches SW of the first load 3a and the third load 3c are turned ON, and the estimated total current value of the first load 3a and the third load 3c the current values of which vary with a lapse of time is further increased to exceed 6.0 A, the power transmission side controller 15 sets the resonance LC changeover switch Pr_SW1 to be ON, and sets the resonance LC changeover switches Pr_SW2 and Pr_SW3 to be OFF to connect the resonance coil L1 (wound six times) of the LC circuit 19. In this way, the power transmission side controller 15 calculates the estimated total current value while monitoring the current value of the electric current flowing in the third load 3c the current value of which varies with a lapse of time to switch the resonance LC changeover switches Pr_SW1 to Pr_SW3.

Figure 15:
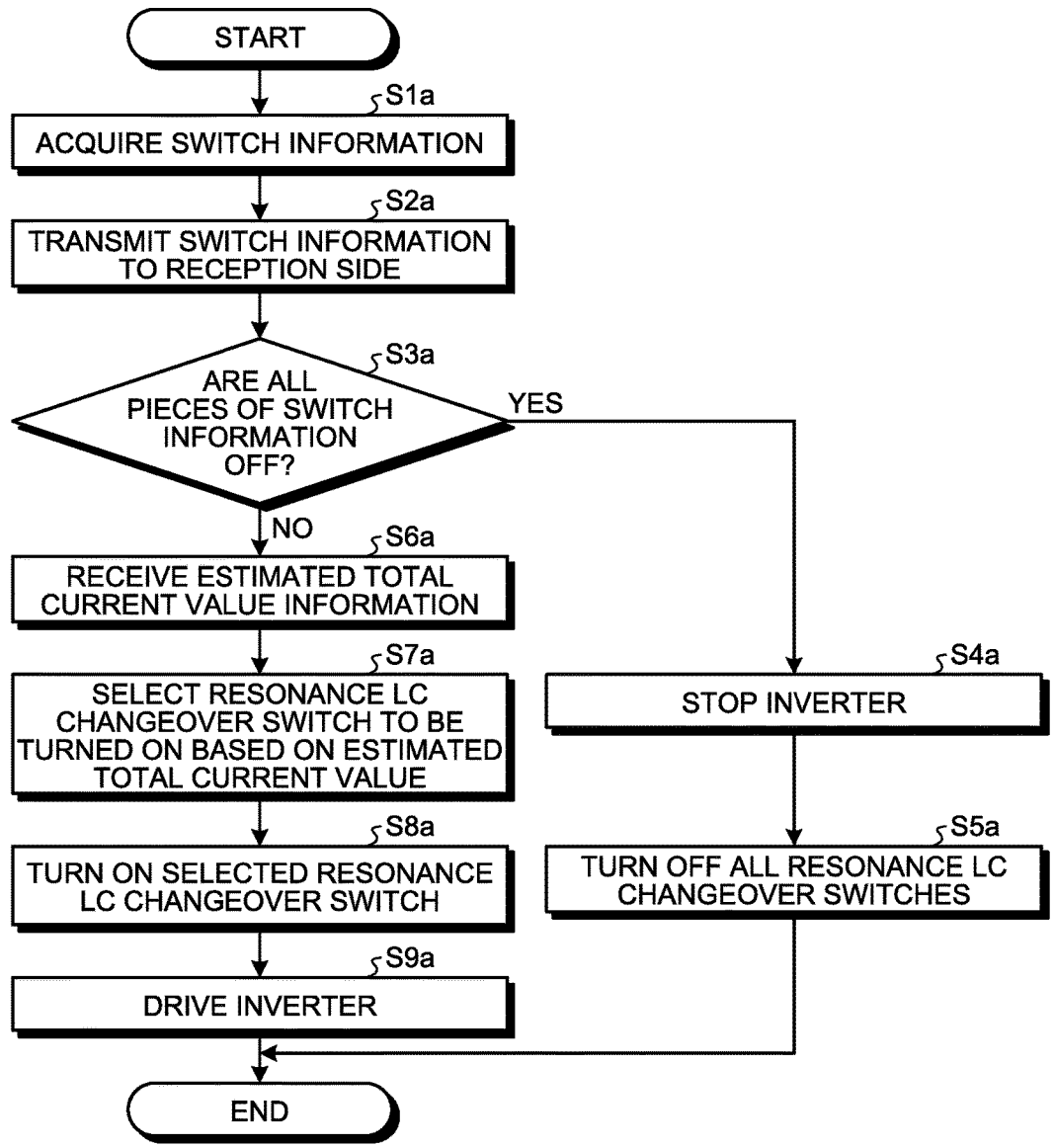
FIG. 15 is a flowchart illustrating an operation example of a power transmission side controller according to the modification of the first embodiment.

Next, the following describes an example in which the current value of the electric current of the load 3 varies with a lapse of time with reference to a flowchart. The same content as the operation example of the non-contact power transmission device 1 according to the first embodiment will not be repeated in some cases. As illustrated in FIG. 15, the power transmission side controller 15 acquires the switch information indicating ON or OFF of the load 3 from the operation switch SW (Step S1a), and transmits the switch information to the power reception unit 20 via the Tx antenna 14 (Step S2a). Next, the power transmission side controller 15 determines whether all the loads 3 are set to be switched OFF based on the switch information (Step S3a). If all the loads 3 are set to be switched OFF (Yes at Step S3a), the power transmission side controller 15 stops the inverter 12 (Step S4a), sets all the resonance LC changeover switches Pr_SW to be OFF (Step S5a), and ends the processing.

If not all the loads 3 are set to be switched OFF at Step S3a described above (No at Step S3a), the power transmission side controller 15 receives the estimated total current value of the load 3 to be driven from the power reception unit 20 (Step S6a). For example, the power transmission side controller 15 refers to the load current table TB1, and receives the estimated total current value (7.7 A) obtained by totaling the current value (1.2 A) of the first load 3a the operation switch SW of which is turned ON and the current value (6.5 A) of the third load 3c the current value of which varies with a lapse of time. Next, the power transmission side controller 15 refers to the resonance LC circuit selection table TB2, selects the resonance LC changeover switch Pr_SW1 to be turned ON based on the estimated total current value (Step S7a), and turns ON the selected resonance LC changeover switch Pr_SW1 (Step S8a). Accordingly, even when the current value of the load 3 varies with a lapse of time, the power transmission side controller 15 can match the output impedance Z0 and the input impedance Z1 in cooperation with impedance control performed by the power reception side controller 25. Subsequently, the power transmission side controller 15 drives the inverter 12 to transmit electric power to the power reception unit 20 by magnetic resonance (Step S9a), and ends the processing.

Figure 16:
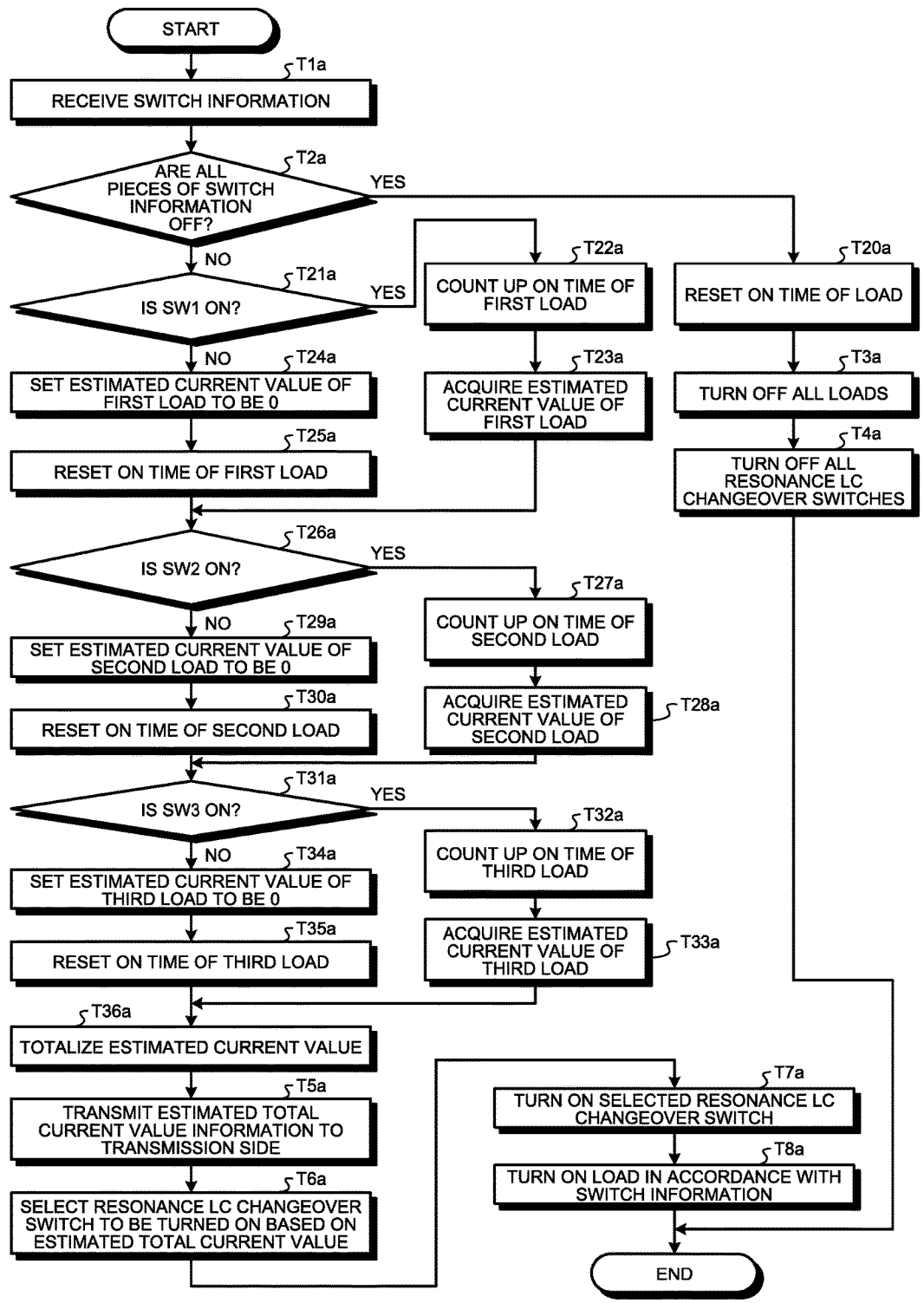
FIG. 16 is a flowchart illustrating an operation example of a power reception side controller according to the modification of the first embodiment.

Next, the following describes an operation example of the power reception side controller 25. As illustrated in FIG. 16, the power reception side controller 25 receives the switch information transmitted from the power transmission unit 10 (Step T1a). The power reception side controller 25 then determines whether all the loads 3 are set to be switched OFF based on the switch information (Step T2a). If all the loads 3 are set to be switched OFF (Yes at Step T2a), the power transmission side controller 15 rests ON time of the operation switch SW of each load 3 (Step T20a). Next, the power reception side controller 25 sets all the loads 3 to be OFF (Step T3a), sets all the resonance LC changeover switches Se_SW to be OFF (Step T4a), and ends the processing.

If not all the loads 3 are set to be switched OFF at Step T2a described above (No at Step T2a), the power reception side controller 25 determines whether the operation switch SW1 is turned ON (Step T21a). If it is determined that the operation switch SW1 is turned ON (Yes at Step T21a), the power reception side controller 25 counts up the ON time of the operation switch SW1 of the first load 3a (Step T22a), and acquires the estimated current value of the first load 3a (Step T23a). If it is determined that the operation switch SW1 is not turned ON (No at Step T21a), the power reception side controller 25 sets the estimated current value of the first load 3a to be zero (0) (Step T24a), and resets the ON time of the operation switch SW1 of the first load 3a (Step T25a).

Next, the power reception side controller 25 determines whether the operation switch SW2 is turned ON (Step T26a). If it is determined that the operation switch SW2 is turned ON (Yes at Step T26a), the power reception side controller 25 counts up the ON time of the operation switch SW2 of the second load 3b (Step T27a), and acquires the estimated current value of the second load 3b (Step T28a). If it is determined that the operation switch SW2 is not turned ON (No at Step T26a), the power reception side controller 25 sets the estimated current value of the second load 3b to be zero (0) (Step T29a), and resets the ON time of the operation switch SW2 of the second load 3b (Step T30a).

Next, the power reception side controller 25 determines whether the operation switch SW3 is turned ON (Step T31a). If it is determined that the operation switch SW3 is turned ON (Yes at Step T31a), the power reception side controller 25 counts up the ON time of the operation switch SW3 of the third load 3c (Step T32a), and acquires the estimated current value of the third load 3c (Step T33a). If it is determined that the operation switch SW3 is not turned ON (No at Step T31a), the power reception side controller 25 sets the estimated current value of the third load 3c to be zero (0) (Step T34a), and resets the ON time of the operation switch SW3 of the third load 3c (Step T35a).

Next, the power reception side controller 25 obtains the estimated total current value by totaling estimated current values of the individual loads 3 (Step T36a), and transmits the estimated total current value to the power transmission unit 10 (Step T5a). The power reception side controller 25 then selects the resonance LC changeover switch Se_SW to be turned ON based on the estimated total current value (Step T6a), and turns ON the selected resonance LC changeover switch Se_SW (Step T7a). Accordingly, even when the current value of the load 3 varies with a lapse of time, the power reception side controller 25 can match the output impedance Z0 and the input impedance Z1 in cooperation with impedance control performed by the power transmission side controller 15. Next, the power reception side controller 25 sets the load 3 to be ON in accordance with the switch information (Step T8a), and ends the processing.

As described above, in the non-contact power transmission device 1 according to the modification of the first embodiment, the power transmission side controller 15 and the power reception side controller 25 change the inductance value and the capacitance of the impedance variable circuits 16 and 26 based on time elapsed after the operation switch SW is turned ON. Accordingly, even when the impedance of the load 3 varies with a lapse of time, the non-contact power transmission device 1 can match the output impedance Z0 and the input impedance Z1.

In the non-contact power transmission device 1, the impedance variable circuit 16 is installed in the power transmission unit 10, and the impedance variable circuit 26 is installed in the power reception unit 20. However, the embodiment is not limited thereto. In the non-contact power transmission device 1, the impedance variable circuit 26 is not necessarily installed in the power reception unit 20, and only the impedance variable circuit 16 may be installed in the power transmission unit 10. In the non-contact power transmission device 1, the impedance variable circuit 16 is not necessarily installed in the power transmission unit 10, and only the impedance variable circuit 26 may be installed in the power reception unit 20.

The non-contact power transmission device 1 may include the matching circuit 40 (refer to FIG. 1). For example, in the non-contact power transmission device 1, the matching circuit 40 is installed between the inverter 12 and the power transmission coil unit 11. In the non-contact power transmission device 1, the matching circuit 40 may be mounted on the inverter 12 or mounted on the power supply 2. The matching circuit 40 includes a variable coil different from the resonance coil L and a variable capacitor different from the resonance capacitor C. The non-contact power transmission device 1 causes the impedance variable circuits 16 and 26 to cooperate with the matching circuit 40 to match the output impedance Z0 and the input impedance Z1. In this way, impedance matching is performed with the matching circuit 40 and the impedance variable circuits 16 and 26, so that the non-contact power transmission device 1 can cope with wide impedance variation even when an adjustment width of the matching circuit 40 is small, and that the circuit scale of the matching circuit 40 can be reduced. The non-contact power transmission device 1 may perform impedance matching using the impedance variable circuits 16 and 26 without the matching circuit 40.

Figure 17:
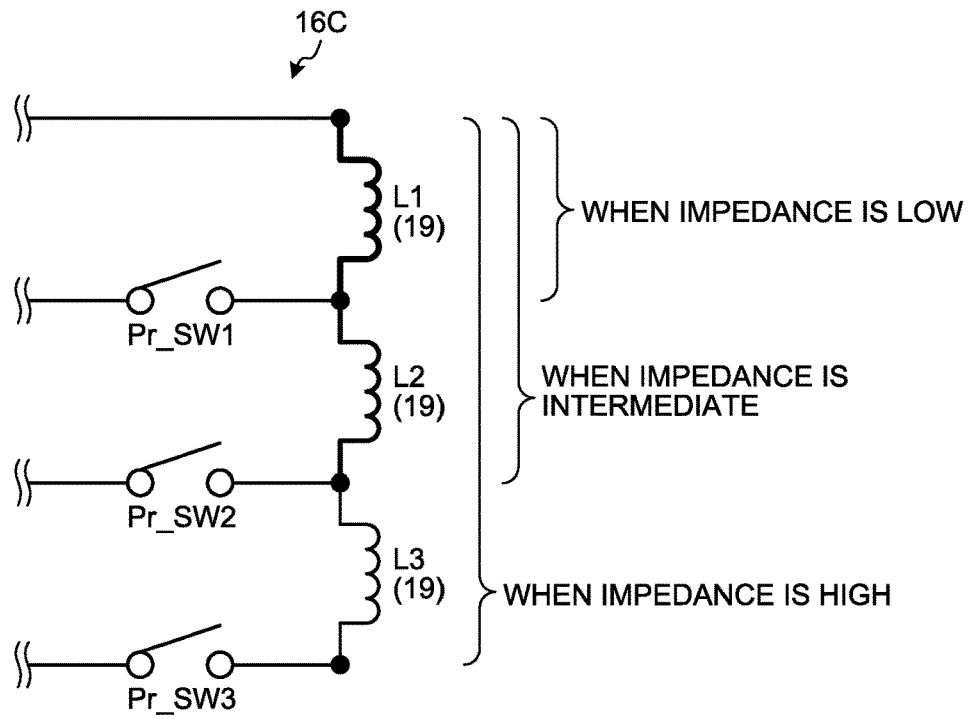
FIG. 17 is a diagram illustrating a configuration example of an impedance variable circuit according to the modification of the first embodiment.

As illustrated in FIG. 17, the impedance variable circuit 16 may be an impedance variable circuit 16C including a plurality of LC circuits 19 (resonance coils L (L1 to L3)) arranged in series, and the resonance LC changeover switches Pr_SW (Pr_SW1 to Pr_SW3) that sequentially switch the number of the LC circuits 19 connected in series. Although the resonance capacitor C of the LC circuit 19 is not illustrated in this example of the impedance variable circuit 16C, for example, the resonance capacitor C is arranged in series for each resonance coil L. In this case, in the impedance variable circuit 16C, the LC circuits 19 connected in series are sequentially increased or decreased to change the impedance of the impedance variable circuit 16C, and the output impedance Z0 and the input impedance Z1 are matched.

Among resonance coils L of the individual LC circuits 19 that are sequentially connected in series, the conductor cross-sectional area of the resonance coil L at a later stage is smaller than the conductor cross-sectional area of the resonance coil L at a former stage. For example, three LC circuits 19 are arranged in series in the impedance variable circuit 16C, the resonance coil L1 of the LC circuit 19 that is connected first has the largest conductor cross-sectional area, the resonance coil L2 of the LC circuit 19 that is subsequently connected has the second largest conductor cross-sectional area, and the resonance coil L3 of the LC circuit 19 that is lastly connected has the smallest conductor cross-sectional area. This is because the coil wire of the resonance coil L corresponding to the impedance of the load 3 can be thinner as the impedance of the load 3 increases. For example, in the impedance variable circuit 16C, only the LC circuit 19 of the resonance coil L1 having the largest conductor cross-sectional area is connected when the impedance of the load 3 is the smallest, the LC circuit 19 of the resonance coil L1 having the largest conductor cross-sectional area and the LC circuit 19 of the resonance coil L2 having the second largest conductor cross-sectional area are connected when the impedance of the load 3 is the second smallest, and all the LC circuits 19 are connected when the impedance of the load 3 is the largest. Accordingly, with the impedance variable circuit 16C, the conductor cross-sectional area of the resonance coil L can be reduced, and the size and the weight of the resonance coil L can be reduced. In addition, with the impedance variable circuit 16C, an amount of usage of the coil wire of the resonance coil L can be reduced, and production cost can be reduced.

Figure 18:
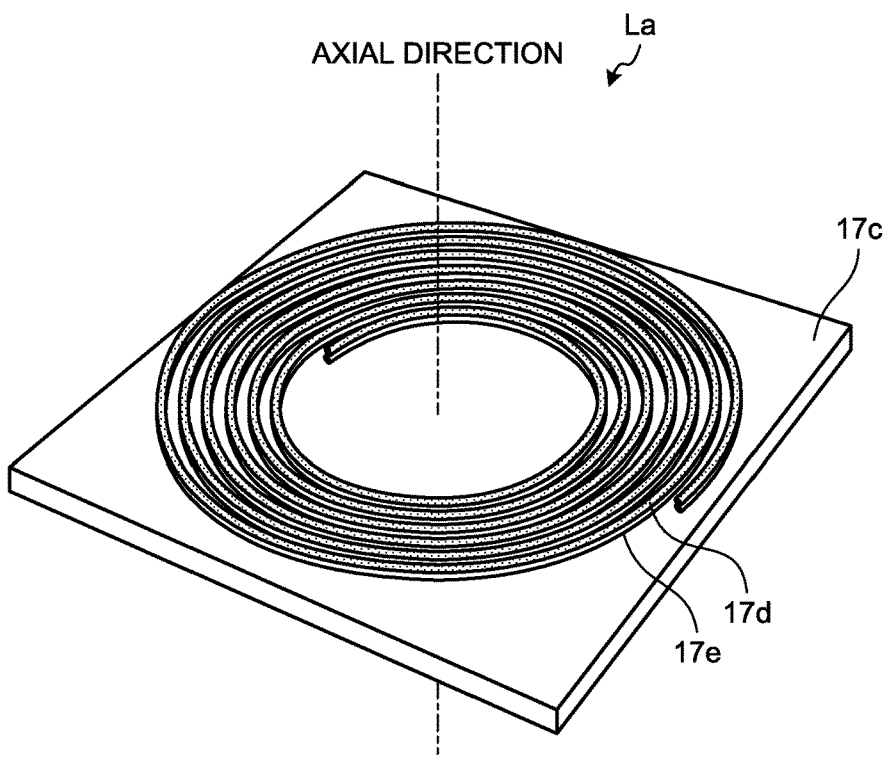
FIG. 18 is a perspective view illustrating a configuration example of the resonance coil according to the modification of the first embodiment.

Next, the following describes a modification of the resonance coil L. For example, as illustrated in FIG. 18, a resonance coil La is formed in a spiral shape such that a plurality of (for example, two) coil wires 17d and 17e are arranged side by side in an axial direction of the resonance coil La. In the resonance coil La, the magnetic body 17c made of ferrite or the like is arranged to be opposed to the axial direction. In this way, the resonance coil La may be formed such that a plurality of coil wires 17d and 17e are arranged side by side in the axial direction of the resonance coil La. The resonance coil La has the same effect as that of the resonance coil L.

Figure 19:
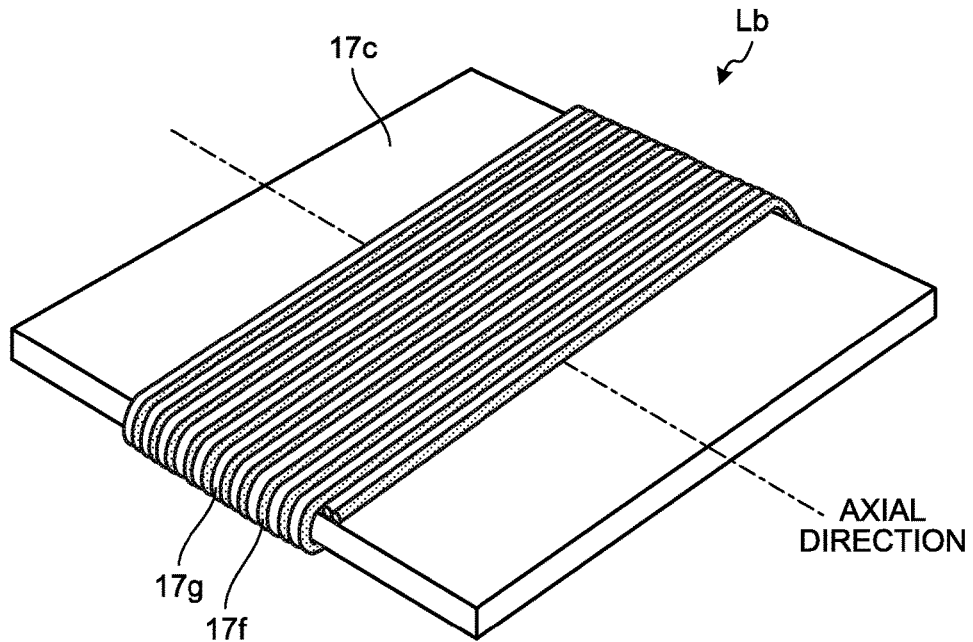
FIG. 19 is a perspective view illustrating a configuration example of the resonance coil according to the modification of the first embodiment.

As illustrated in FIG. 19, a resonance coil Lb has a shape wound around a plate-shaped member in a spiral manner. The resonance coil Lb is formed in a spiral manner such that a plurality of (for example, two) coil wires 17f and 17g are arranged side by side in an axial direction of the resonance coil Lb. The size of the resonance coil Lb can be reduced by using a plurality of coil wires 17f and 17g. The resonance coil Lb can be adjusted to have a plurality of inductance values by connecting the coil wires 17f and 17g in parallel or in series. The resonance coil Lb is, for example, wound around the magnetic body 17c made of ferrite or the like in a spiral manner. As the magnetic body 17c, one plate-shaped magnetic member may be used, or a divided magnetic member may be used. The resonance coil Lb may have a different shape, and does not necessarily include the magnetic body 17c so long as a desired inductance value and a desired coupling coefficient can be obtained.

Figure 20:
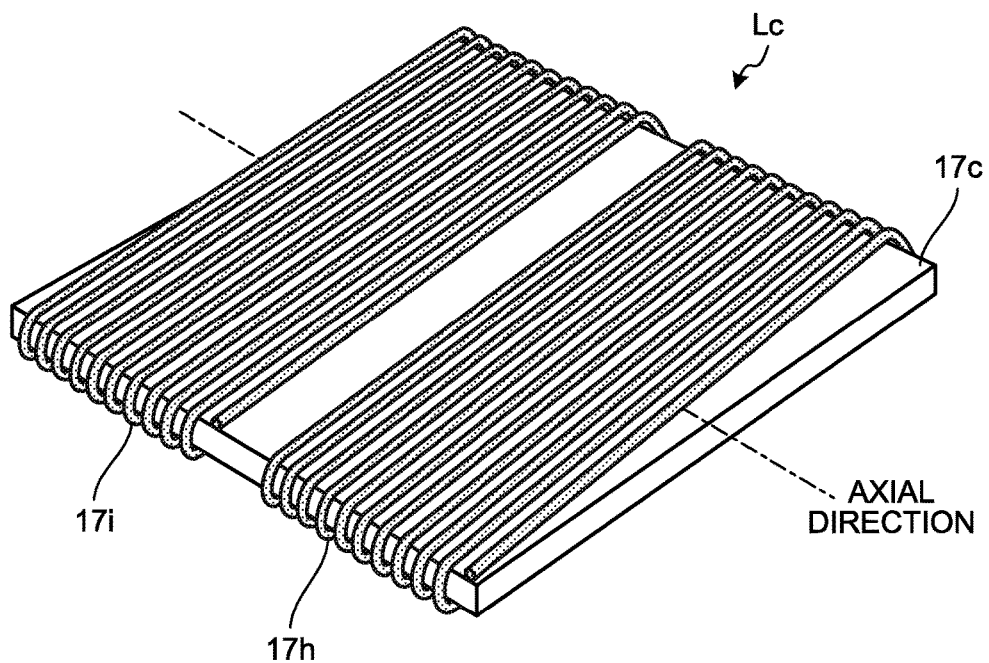
FIG. 20 is a perspective view illustrating a configuration example of the resonance coil according to the modification of the first embodiment.

As illustrated in FIG. 20, a resonance coil Lc has a shape wound around a plate-shaped member in a spiral manner such that a plurality of (for example, two) coil wires 17h and 17i are individually arranged side by side in an axial direction of the resonance coil Lc in a spiral manner. The resonance coil Lc can be adjusted to have a plurality of inductance values by connecting the coil wires 17h and 17i in parallel or in series. The resonance coil Lc is, for example, wound around the magnetic body 17c made of ferrite or the like in a spiral manner. The resonance coil Lc may have a different shape, and does not necessarily include the magnetic body 17c so long as a desired inductance value and a desired coupling coefficient can be obtained.

Figure 21:
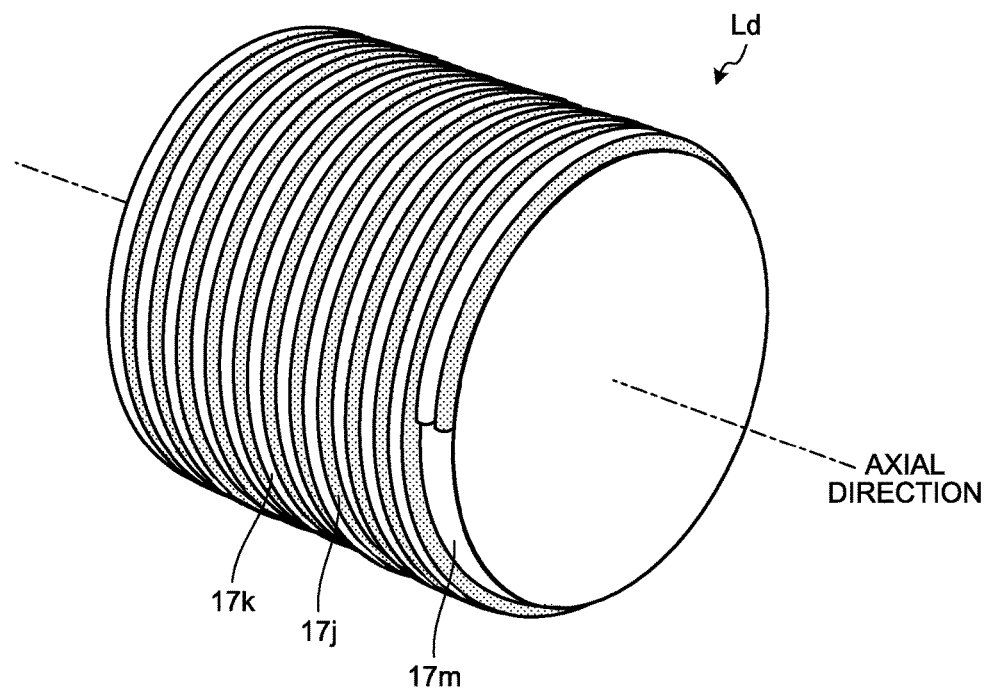
FIG. 21 is a perspective view illustrating a configuration example of the resonance coil according to the modification of the first embodiment.

As illustrated in FIG. 21, a resonance coil Ld has a shape wound around a cylindrical or a round pillar-shaped member in a spiral manner. The resonance coil Ld is formed in a spiral manner such that a plurality of (for example, two) coil wires 17j and 17k are arranged side by side in an axial direction of the resonance coil Ld. The size of the resonance coil Ld can be reduced by using a plurality of coil wires 17j and 17k. The resonance coil Ld can be adjusted to have a plurality of inductance values by connecting the coil wires 17j and 17k in parallel or in series. The resonance coil Ld is, for example, wound around a magnetic body 17m made of ferrite or the like in a spiral manner. As the magnetic body 17m, one cylindrical or round pillar-shaped magnetic member may be used, or a divided magnetic member formed in a cylindrical shape or a round pillar shape may be used. The resonance coil Ld may have a different shape, and does not necessarily include the magnetic body 17m so long as a desired inductance value and a desired coupling coefficient can be obtained.

Figure 22:
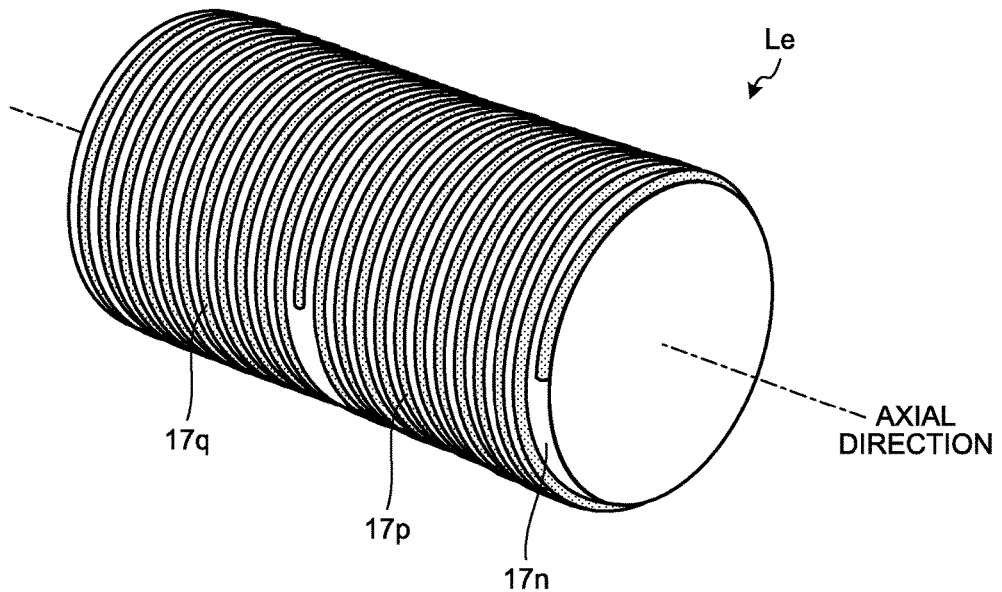
FIG. 22 is a perspective view illustrating a configuration example of the resonance coil according to the modification of the first embodiment.

As illustrated in FIG. 22, the resonance coil Le has a shape wound around a cylindrical or a round pillar-shaped member in a spiral manner such that a plurality of (for example, two) coil wires 17p and 17q are individually arranged side by side in an axial direction of the resonance coil Le in a spiral manner. The resonance coil Le can be adjusted to have a plurality of inductance values by connecting the coil wires 17p and 17q in parallel or in series. The resonance coil Le is, for example, wound around a magnetic body 17n made of ferrite or the like in a spiral manner. As the magnetic body 17n, one cylindrical or round pillar-shaped magnetic member may be used, or a divided magnetic member formed in a cylindrical shape or a round pillar shape may be used. The resonance coil Le may have a different shape, and does not necessarily include the magnetic body 17h so long as a desired inductance value and a desired coupling coefficient can be obtained.

In the non-contact power transmission device 1, the impedance variable circuits 16 and 26 may be configured using a variable resonance coil L the inductance value of which can be adjusted and a variable resonance capacitor C the capacitance of which can be adjusted. In this case, by changing at least one of the inductance value of the variable resonance coil L or the capacitance of the variable resonance capacitor C, the non-contact power transmission device 1 changes the impedance of the impedance variable circuits 16 and 26 to match the output impedance Z0 and the input impedance Z1. The non-contact power transmission device 1 may include three or more LC circuits 19 to change the impedance of the impedance variable circuit 16 in a multi-stage way. As described above, a method is not limited so long as the impedance of the impedance variable circuit 16 can be changed by the non-contact power transmission device 1.

To perform impedance matching in accordance with misregistration between the power transmission coil unit 11 and the power reception coil unit 21, the non-contact power transmission device 1 may detect a gap between the power transmission coil unit 11 and the power reception coil unit 21 with a sensor (not illustrated), switch the resonance LC changeover switches Pr_SW and Se_SW in accordance with the detected gap, and match the output impedance Z0 and the input impedance Z1.

Second Embodiment

Next, the following describes a non-contact power transmission device 1A according to a second embodiment. The non-contact power transmission device 1A according to the second embodiment is different from the non-contact power transmission device 1 according to the first embodiment in that impedance matching is performed by switching connection of only the resonance coils L (L1 to L3) of impedance variable circuits 16A and 26A. In the second embodiment, the same component as that of the non-contact power transmission device 1 according to the first embodiment is denoted by the same reference numeral, and detailed description thereof will not be repeated.

Figure 23:
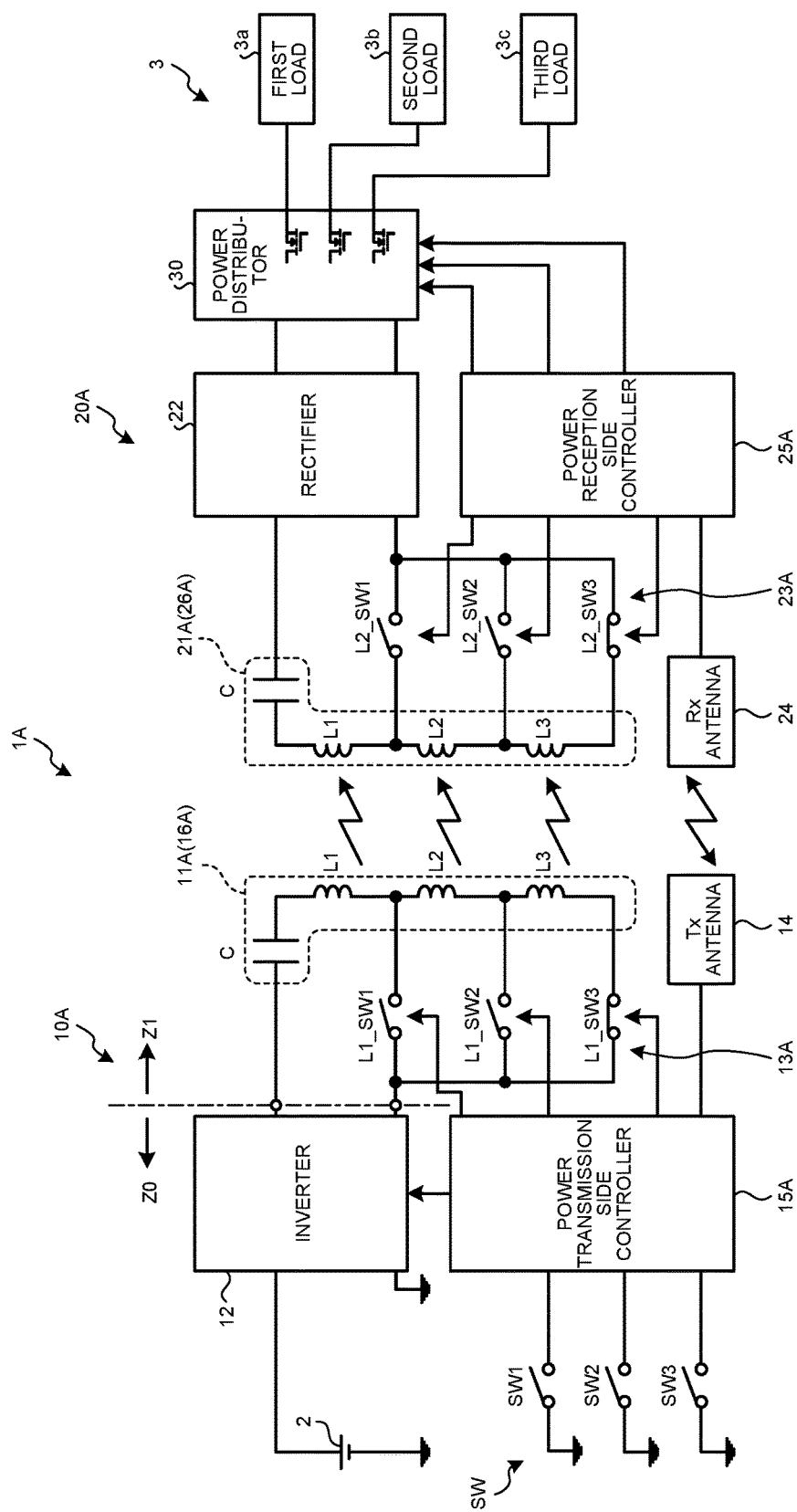
FIG. 23 is a block diagram illustrating a configuration example of a non-contact power transmission device according to a second embodiment.

As illustrated in FIG. 23, the impedance variable circuit 16A of a power transmission coil unit 11A includes a plurality of resonance coils L (L1 to L3) and one resonance capacitor C. In the impedance variable circuit 16A, the individual resonance coils L may be connected in parallel or in series by a switching mechanism 13A, or the individual resonance coils L may be selectively connected. Accordingly, in the impedance variable circuit 16A, the inductance value of the resonance coil L is changed, and the impedance of the impedance variable circuit 16A is changed. As illustrated in FIG. 17, among the resonance coils L of the impedance variable circuit 16A, the conductor cross-sectional area of the resonance coil L at a later stage may be smaller than the conductor cross-sectional area of the resonance coil L at a former stage. For example, in the impedance variable circuit 16A, the resonance coil L1 that is connected first has the largest conductor cross-sectional area, the resonance coil L2 that is subsequently connected has the second largest conductor cross-sectional area, and the resonance coil L3 that is lastly connected has the smallest conductor cross-sectional area.

The switching mechanism 13A of the power transmission coil unit 11A includes a plurality of resonance L changeover switches L1_SW (L1_SW1 to L1_SW3), and switches connection of the individual resonance coils L of the power transmission coil unit 11A when the resonance L changeover switch L1_SW is controlled to be ON/OFF. Specifically, the switching mechanism 13A connects the individual resonance coils L in parallel or in series, and sequentially switches the number of the resonance coils L to be connected. The switching mechanism 13A connects, for example, the resonance coil L1 to the power supply 2 when the resonance L changeover switch L1_SW1 is turned ON and the resonance L changeover switches L1_SW2 and L1_SW3 are turned OFF. The switching mechanism 13A connects the resonance coils L1 and L2 in series when the resonance L changeover switch L1_SW2 is turned ON and the resonance L changeover switches L1_SW1 and L1_SW3 are turned OFF. The switching mechanism 13A connects the resonance coils L1, L2, and L3 in series when the resonance L changeover switch L1_SW3 is turned ON and the resonance L changeover switches L1_SW1 and L1_SW2 are turned OFF. As the resonance L changeover switch L1_SW of the switching mechanism 13A, a semiconductor switch, a mechanical switch, or the like is used.

A power transmission side controller 15A controls the resonance L changeover switch L1_SW of the switching mechanism 13A to be ON/OFF based on the received switch information, and switches connection of the individual resonance coils L in the impedance variable circuit 16A. Accordingly, even when the impedance of the load 3 is changed, the power transmission side controller 15A changes the impedance of the impedance variable circuit 16A by changing the inductance value of the impedance variable circuit 16A, and matches the output impedance Z0 and the input impedance Z1 in cooperation with impedance control performed by a power reception side controller 25A (described later).

Next, the following describes the impedance variable circuit 26A of a power reception coil unit 21A. Similarly to the impedance variable circuit 16A of the power transmission unit 10A, the impedance variable circuit 26A of the power reception coil unit 21A includes a plurality of resonance coils (L1 to L3) and one resonance capacitor C. In the impedance variable circuit 26A, the individual resonance coils L may be connected in parallel or in series via a switching mechanism 23A, or the individual resonance coils L may be selectively connected. Accordingly, in the impedance variable circuit 26A, the inductance value of the resonance coil L is changed, and the impedance of the impedance variable circuit 26A is changed.

Similarly to the switching mechanism 13A of the power transmission unit 10A, the switching mechanism 23A of the power reception coil unit 21A includes a plurality of resonance L changeover switches L2_SW (L2_SW1 to L2_SW3), and switches connection of the individual resonance coils L of the power reception coil unit 21A when the resonance L changeover switches L2_SW are controlled to be ON/OFF. Specifically, the switching mechanism 23A connects the individual resonance coils L in parallel or in series, or sequentially switches the number of the resonance coils L to be connected. The switching mechanism 23A connects, for example, the resonance coil L1 to the load 3 via the rectifier 22 and the power distributor 30 when the resonance L changeover switch L2_SW1 is turned ON and the resonance L changeover switches L2_SW2 and L2_SW3 are turned OFF. The switching mechanism 23A connects the individual resonance coils L1 and L2 in series when the resonance L changeover switch L2_SW2 is turned ON and the resonance L changeover switches L1_SW1 and L1_SW3 are turned OFF. The switching mechanism 23A connects the individual resonance coils L1, L2, and L3 in series when the resonance L changeover switch L2_SW3 is turned ON and the resonance L changeover switches L2_SW1 and L2_SW2 are turned OFF. As the resonance L changeover switch L2_SW of the switching mechanism 23A, a semiconductor switch, a mechanical switch, or the like is used.

The power reception side controller 25A controls the resonance L changeover switch L2_SW of the switching mechanism 23A to be ON/OFF based on the received switch information, and switches connection of the individual resonance coils L in the impedance variable circuit 26A. Accordingly, even when the impedance of the load 3 is changed, the power reception side controller 25A changes the impedance of the impedance variable circuit 26A by changing the inductance value of the impedance variable circuit 26A, and matches the output impedance Z0 and the input impedance Z1 in cooperation with impedance control performed by the power transmission side controller 15A described above.

Next, the following describes switching control of the resonance coils L of the impedance variable circuits 16A and 26A. The control for the impedance variable circuit 16A of the power transmission coil unit 11A is the same as that for the impedance variable circuit 26A of the power reception coil unit 21A, so that the following describes only the impedance variable circuit 16A of the power transmission coil unit 11A. The following describes an example in which the resonance coils L of the impedance variable circuit 16A are connected in series or in parallel.

Figure 24:
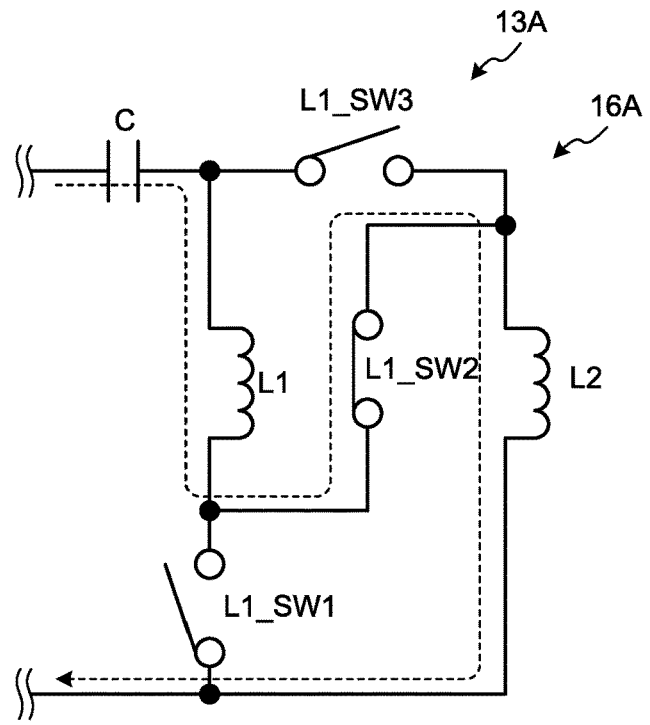
FIG. 24 is a circuit diagram illustrating a switching example (series) of a resonance coil according to the second embodiment.
Figure 26:
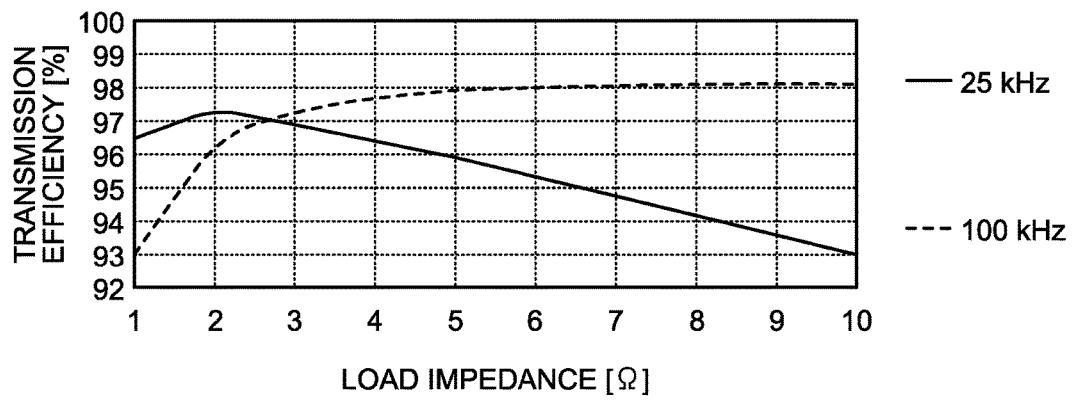
FIG. 26 is a diagram illustrating a relation between impedance of a load and a resonance frequency according to the second embodiment.
Figure 27:
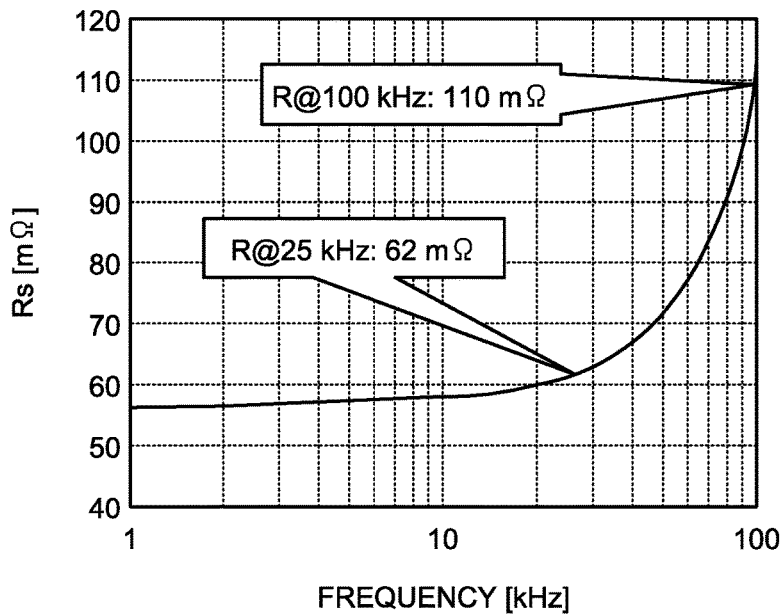
FIG. 27 is a diagram illustrating high-frequency resistance of the resonance coil according to the second embodiment.

If it is determined that the current value of the electric current flowing in the load 3 is large and that the impedance of the load 3 is small based on the switch information, as illustrated in FIG. 24, the power transmission side controller 15A of the power transmission coil unit 11A sets the resonance L changeover switch L1_SW2 of the switching mechanism 13A to be ON and sets the resonance L changeover switches L1_SW1 and L1_SW3 to be OFF to connect the resonance coils L1 and L2 in series. With the power transmission side controller 15A, the inductance value of the resonance coil L becomes large as compared with a case of parallel connection, so that the resonance frequency is lowered and that the current value of the electric current is increased, but that an influence of a skin effect of the resonance coil L can be suppressed. Accordingly, transmission efficiency can be improved (refer to FIG. 26). For example, in the impedance variable circuit 16A, the resonance frequency of the electric current is about 25 kHz, and the influence of the skin effect of the resonance coil L can be suppressed as illustrated in FIG. 27. The impedance variable circuit 16A can suppress the influence of the skin effect, so that a loss in power transmission by the resonance coil L can be suppressed even when the conductor cross-sectional area of the resonance coil L per unit current is reduced. In the impedance variable circuit 16A, the resonance coil L having a small conductor cross-sectional area can be used, so that the size of the resonance coil L can be reduced.

Figure 25:
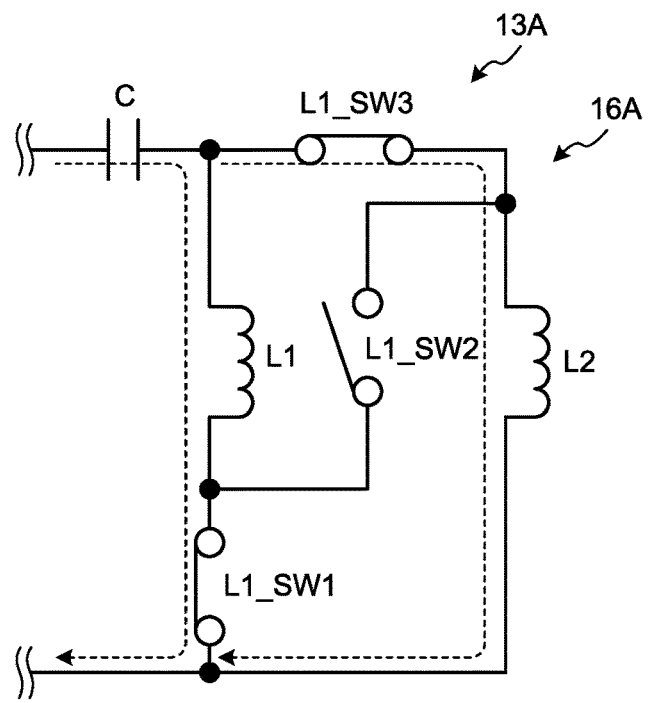
FIG. 25 is a circuit diagram illustrating a switching example (parallel) of the resonance coil according to the second embodiment.

On the other hand, if it is determined that the current value of the electric current flowing in the load 3 is small and that the impedance of the load 3 is large based on the switch information, as illustrated in FIG. 25, the power transmission side controller 15A sets the resonance L changeover switches L1_SW1 and L1_SW3 of the switching mechanism 13A to be ON and sets the resonance L changeover switch L1_SW2 to be OFF to connect the resonance coils L in parallel. With the power reception side controller 25A, the inductance value of the resonance coil L becomes small as compared with a case of series connection, so that the resonance frequency is increased and that the influence of the skin effect of the resonance coil L is increased, but that the current value of the electric current is reduced because the impedance of the load 3 is high. Accordingly, the transmission efficiency is not deteriorated (refer to FIG. 26). In the impedance variable circuit 16A, the current value of the electric current is reduced although the influence of the skin effect is increased, so that a loss in power transmission by the resonance coil L can be suppressed even when the conductor cross-sectional area of the resonance coil L per unit current is reduced. Accordingly, the impedance variable circuit 16A can suppress heat generation, and can simplify and downsize a heat radiation structure. The impedance variable circuit 16A can use the resonance coil L having a small conductor cross-sectional area, so that the size of the resonance coil L can be reduced.

Figure 30:
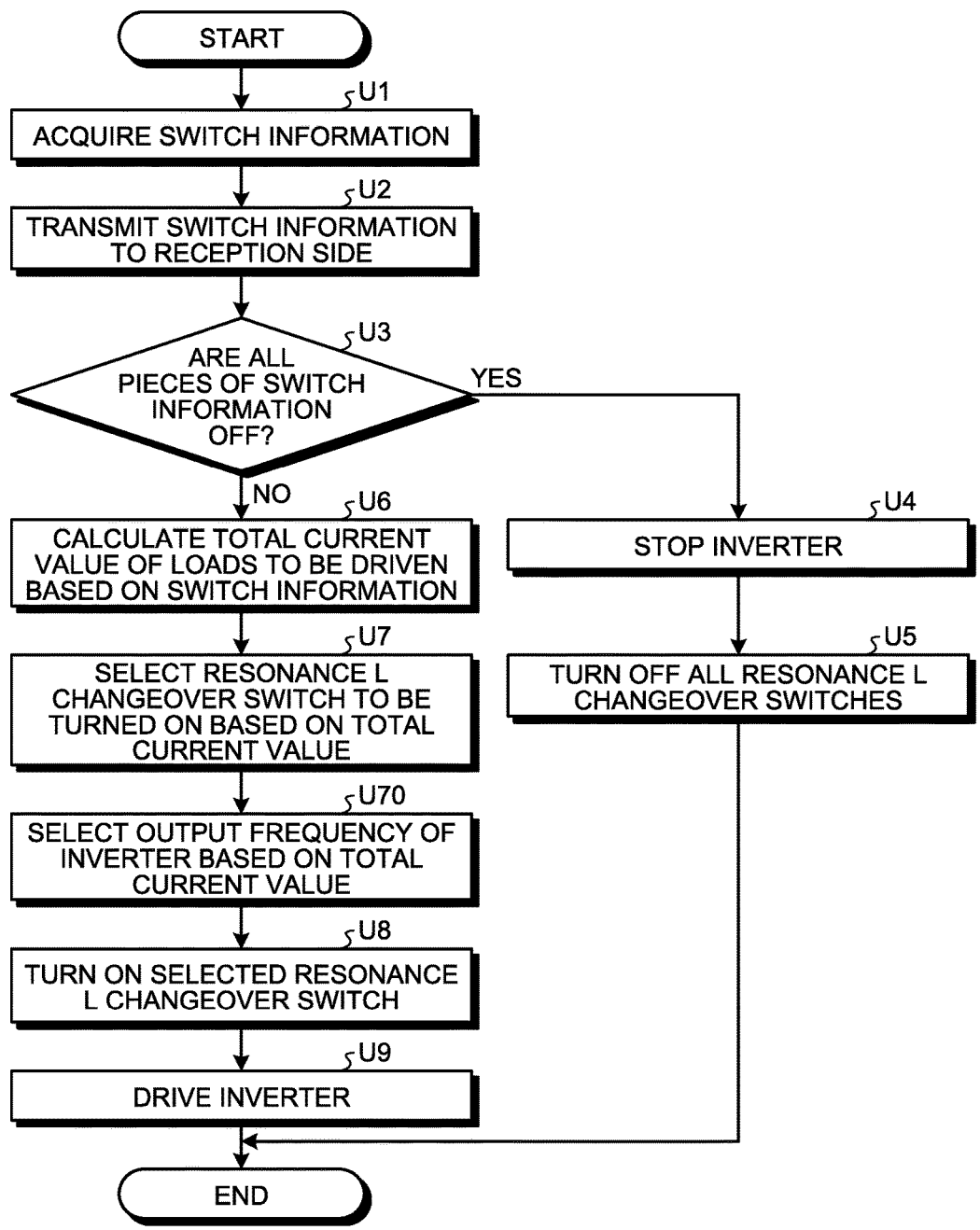
FIG. 30 is a flowchart illustrating an operation example of a power transmission side controller according to the second embodiment.

Next, the following describes an operation example of the non-contact power transmission device 1A according to the second embodiment. As illustrated in FIG. 30, the power transmission side controller 15A acquires the switch information indicating ON or OFF of the load 3 from the operation switch SW (Step U1). Next, the power transmission side controller 15A transmits the switch information to a power reception unit 20A via the Tx antenna 14 (Step U2). Subsequently, the power transmission side controller 15A determines whether all the loads 3 are set to be switched OFF based on the switch information (Step U3). If all the loads 3 are set to be switched OFF (Yes at Step U3), the power transmission side controller 15A stops the inverter 12 (Step U4), sets all the resonance L changeover switches L1_SW to be OFF (Step U5), and ends the processing.

If not all the loads 3 are set to be switched OFF at Step U3 described above (No at Step U3), the power transmission side controller 15A calculates the total current value of the loads 3 to be driven based on the switch information (Step U6). For example, the power transmission side controller 15A refers to the load current table TB1b illustrated in FIG. 28, and calculates the total current value (2.5 A) obtained by totaling the current value (0.5 A) of the first load 3a the operation switch SW of which is turned ON and the current value (2.0 A) of the second load 3b the operation switch SW of which is turned ON. Next, the power transmission side controller 15A selects the resonance L changeover switch L1_SW2 to be turned ON based on the total current value (Step U7), and selects an output frequency (resonance frequency) of the inverter 12 based on the total current value (Step U70). For example, the power transmission side controller 15A refers to a resonance L circuit selection table TB2a illustrated in FIG. 29, and selects the output frequency (25 kHz) of the inverter 12 based on the total current value (2.5 A). Next, the power transmission side controller 15A turns ON the selected resonance L changeover switch L1_SW (Step U8). For example, the power transmission side controller 15A refers to the resonance L circuit selection table TB2a, and according to the total current value (2.5 A), sets the resonance L changeover switch L1_SW2 to be ON, and sets the resonance L changeover switches L1_SW1 and L1_SW3 to be OFF. Accordingly, the power transmission side controller 15A can set, for example, the two resonance coils L1 and L2 of the impedance variable circuit 16A to perform power transmission. Thus, the power transmission side controller 15A can change the inductance value of the impedance variable circuit 16A, and change the impedance of the impedance variable circuit 16A. Accordingly, the power transmission side controller 15A can match the output impedance Z0 and the input impedance Z1 in cooperation with impedance control performed by the power reception side controller 25A. Next, the power transmission side controller 15A drives the inverter 12 to transmit electric power to the power reception unit 20A by magnetic resonance (Step U9), and ends the processing.

Figure 31:
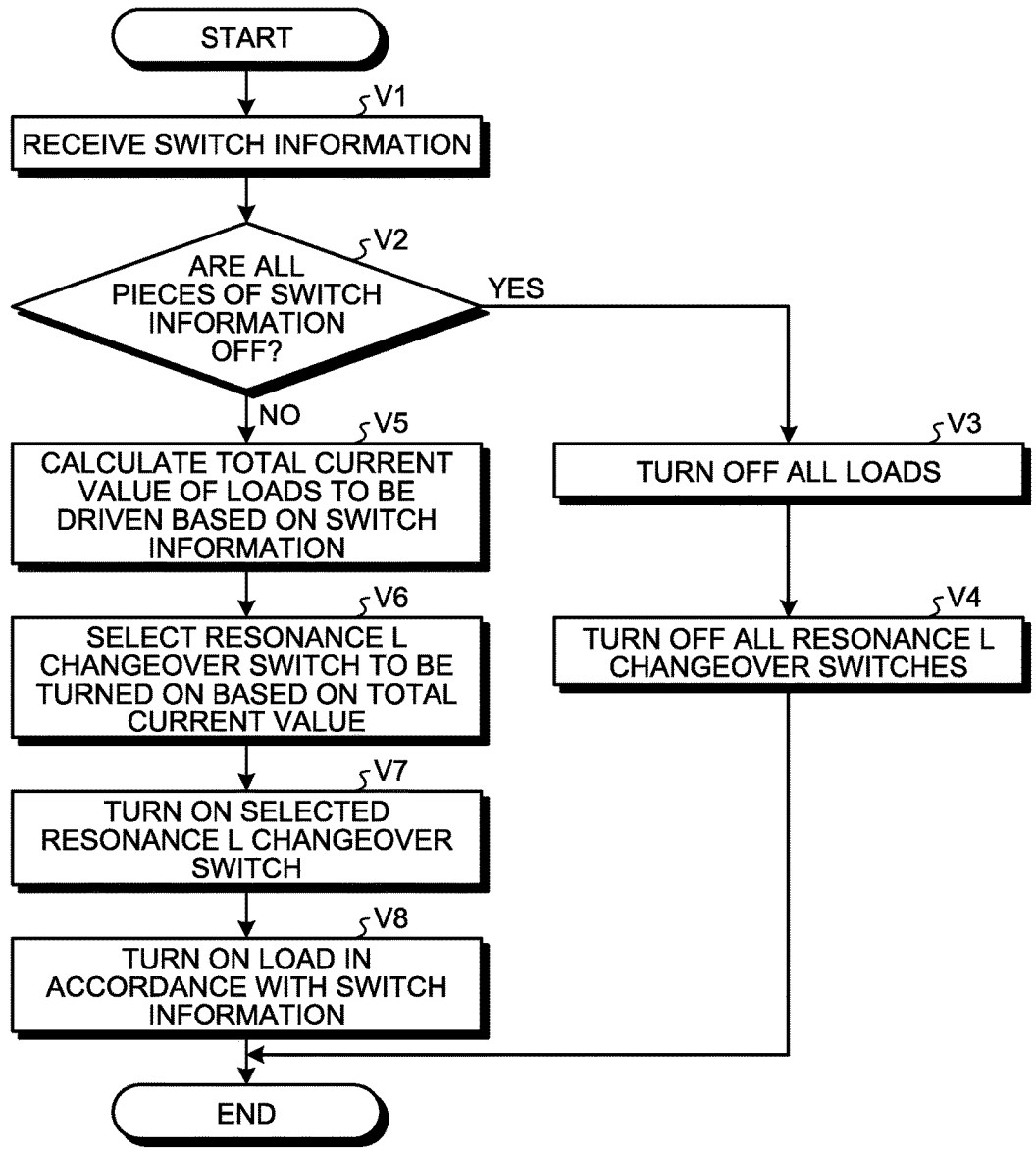
FIG. 31 is a flowchart illustrating an operation example of a power reception side controller according to the second embodiment.

Next, the following describes an operation example of the power reception side controller 25A. As illustrated in FIG. 31, the power reception side controller 25A receives the switch information transmitted from the power transmission unit 10A (Step V1). Subsequently, the power reception side controller 25A determines whether all the loads 3 are set to be switched OFF based on the switch information (Step V2). If all the loads 3 are set to be switched OFF (Yes at Step V2), the power reception side controller 25A sets all the loads 3 to be OFF (Step V3), sets all the resonance L changeover switches L2_SW to be OFF (Step V4), and ends the processing.

If not all the loads 3 are set to be switched OFF at Step V2 described above (No at Step V2), the power reception side controller 25A calculates the total current value of the loads 3 to be driven based on the switch information (Step V5). For example, the power reception side controller 25A refers to the load current table TB1b illustrated in FIG. 28, and calculates the total current value (2.5 A) obtained by totaling the current value (0.5 A) of the first load 3a the operation switch SW of which is turned ON and the current value (2.0 A) of the second load 3b the operation switch SW of which is turned ON. Next, the power reception side controller 25A selects the resonance L changeover switch L2_SW to be turned ON based on the total current value (Step V6), and turns ON the selected resonance L changeover switch L2_SW (Step V7). For example, the power reception side controller 25A refers to the resonance L circuit selection table (not illustrated), and according to the total current value (2.5 A), sets the resonance L changeover switch L2_SW2 to be ON, and sets the resonance L changeover switches L2_SW1 and L2_SW3 to be OFF. Accordingly, the power reception side controller 25A can set, for example, the two resonance coils L1 and L2 to perform power transmission. Thus, the power reception side controller 25A can change the inductance value of the impedance variable circuit 26A, and change the impedance of the impedance variable circuit 26A. Accordingly, the power reception side controller 25A can match the output impedance Z0 and the input impedance Z1 in cooperation with impedance control performed by the power transmission side controller 15A. Next, the power reception side controller 25A sets the load 3 to be ON in accordance with the switch information (Step V8), and ends the processing.

As described above, in the non-contact power transmission device 1A according to the second embodiment, the power transmission side controller 15A and the power reception side controller 25A switch a plurality of resonance coils L to be connected in series or in parallel, or selectively switch the resonance coils L to change the inductance value, and the output impedance Z0 on the power supply 2 side with respect to the power transmission coil unit 11A and the input impedance Z1 on the load 3 side with respect to the power transmission coil unit 11A are matched. Accordingly, the non-contact power transmission device 1A can perform impedance matching by changing the inductance value of the resonance coil L without using the matching circuit, and the circuit scale can be reduced.

Modification of Second Embodiment

Figure 32:
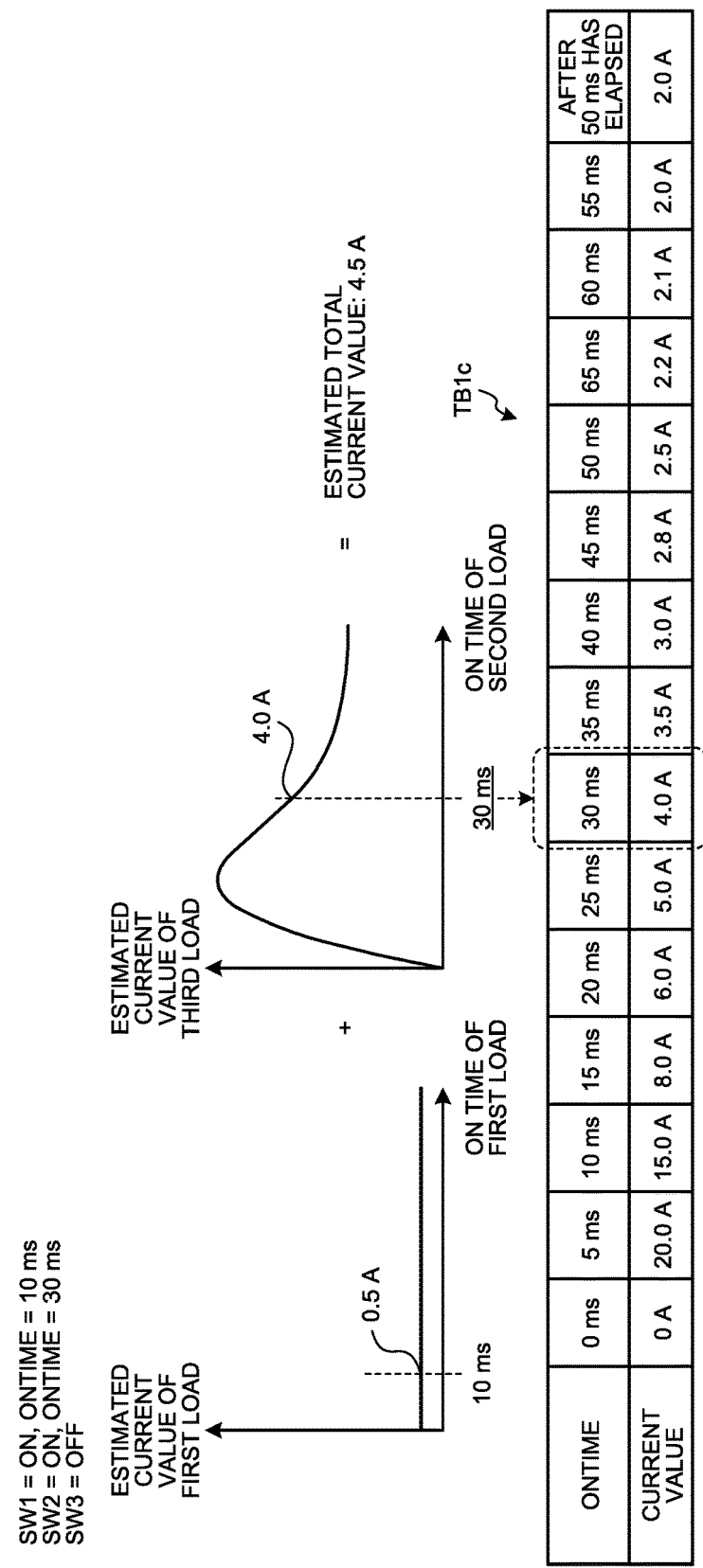
FIG. 32 is a diagram illustrating a configuration example of a load current table according to a modification of the second embodiment.

Next, the following describes an operation example of the non-contact power transmission device 1A according to a modification of the second embodiment. As illustrated in FIG. 32, a load current table TB1c is a table assuming that the current value of the electric current flowing in the load 3 varies with a lapse of time.

Figure 34:
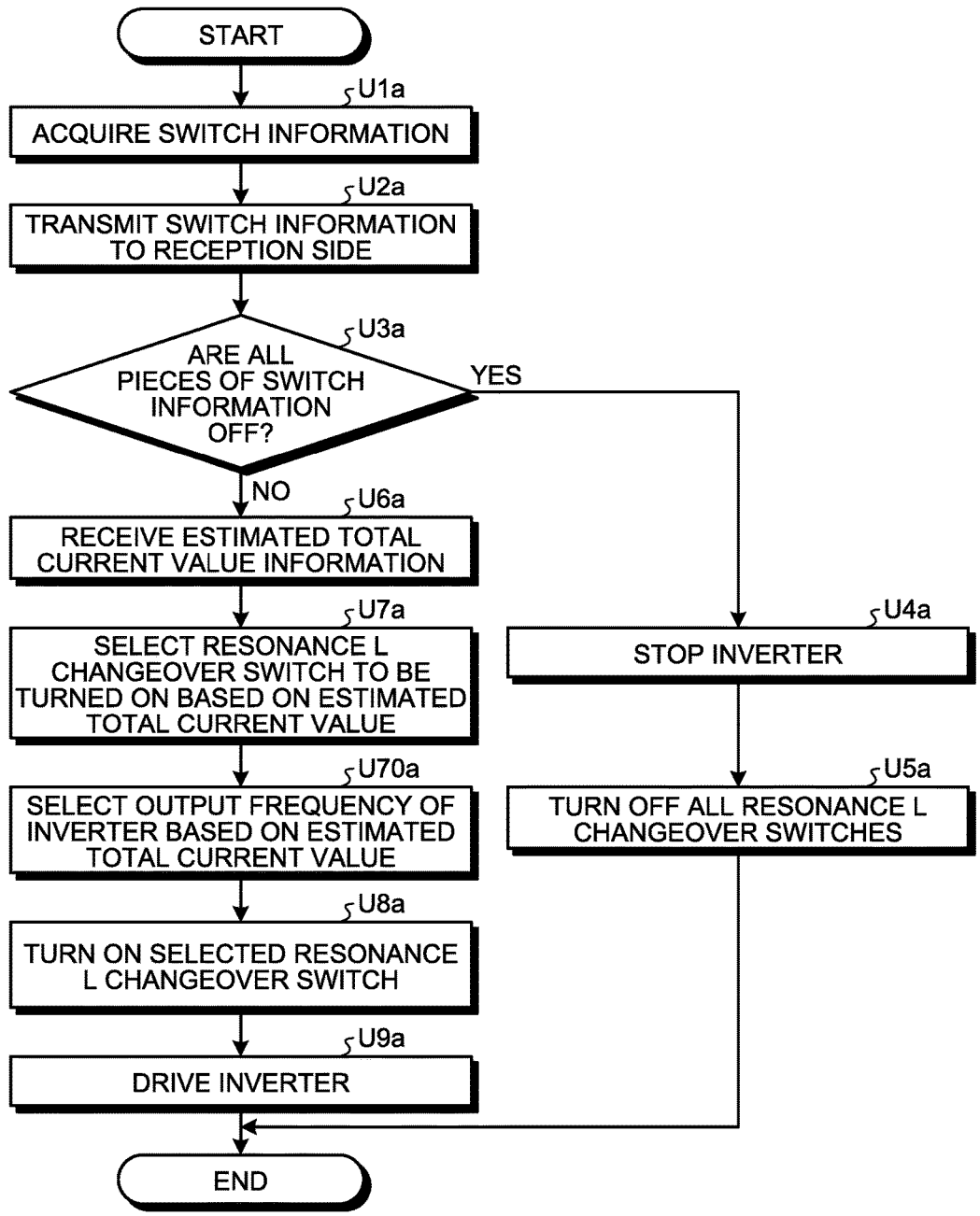
FIG. 34 is a flowchart illustrating an operation example of a power transmission side controller according to the modification of the second embodiment.

As illustrated in FIG. 34, the power transmission side controller 15A acquires the switch information indicating ON or OFF of the load 3 from the operation switch SW (Step U1a), and transmits the switch information to the power reception unit 20A via the Tx antenna 14 (Step U2a). Next, the power transmission side controller 15A determines whether all the loads 3 are set to be switched OFF based on the switch information (Step U3a). If all the loads 3 are set to be switched OFF (Yes at Step U3a), the power transmission side controller 15A stops the inverter 12 (Step U4a), sets all the resonance L changeover switches L1_SW to be OFF (Step U5a), and ends the processing.

If not all the loads 3 are set to be switched OFF at Step U3a described above (No at Step U3a), the power transmission side controller 15A receives the estimated total current value of the loads 3 to be driven from the power reception unit 20A (Step U6a). For example, the power transmission side controller 15A refers to the load current table TB1c illustrated in FIG. 32, and calculates the estimated total current value (4.5 A) totaling the current value (0.5 A) of the first load 3a the operation switch SW of which is turned ON and the current value (4.0 A) of the second load 3b the current value of which varies with a lapse of time. Next, the power transmission side controller 15A refers to the resonance L circuit selection table TB2a, selects the resonance L changeover switch L1_SW2 to be turned ON based on the estimated total current value (Step U7a), and selects the output frequency of the inverter 12 based on the estimated total current value (Step U70a). Next, the power transmission side controller 15A turns ON the selected resonance L changeover switch L1_SW2 (Step U8a).

Accordingly, even when the current value of the load 3 varies with a lapse of time, the power transmission side controller 15A can match the output impedance Z0 and the input impedance Z1 in cooperation with impedance control performed by the power reception side controller 25A. Next, the power transmission side controller 15A drives the inverter 12 to transmit electric power to the power reception unit 20A by magnetic resonance (Step U9a), and ends the processing.

Figure 35:
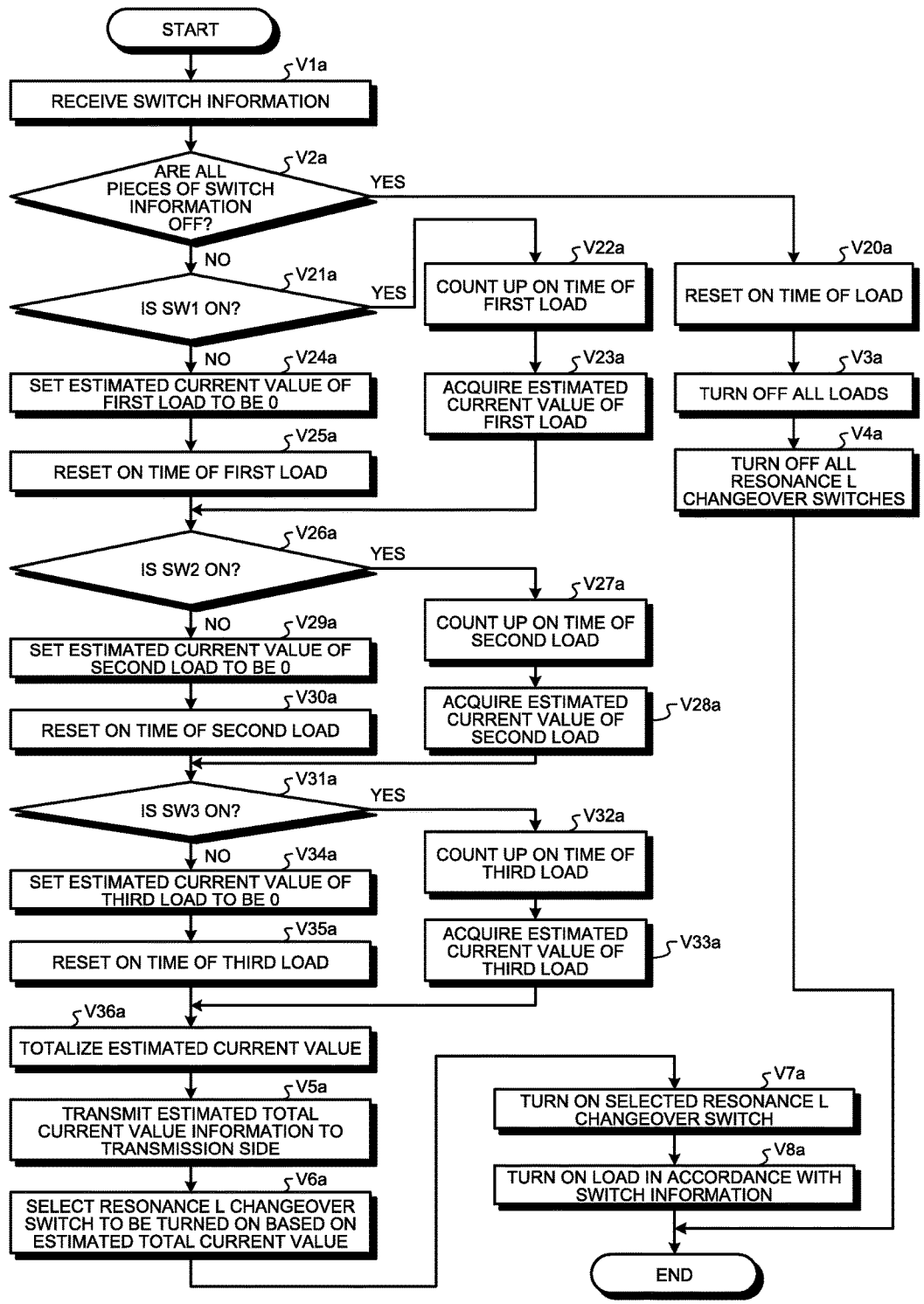
FIG. 35 is a flowchart illustrating an operation example of a power reception side controller according to the modification of the second embodiment.

Next, the following describes an operation example of the power reception side controller 25A of the power reception unit 20A. As illustrated in FIG. 35, the power reception side controller 25A of the power reception unit 20A receives the switch information transmitted from the power transmission unit 10A (Step V1a). Subsequently, the power reception side controller 25A determines whether all the loads 3 are set to be switched OFF based on the switch information (Step V2a). If all the loads 3 are set to be switched OFF (Yes at Step V2a), the power reception side controller 25A resets the ON time of the operation switch SW of each load 3 (Step V20a). Next, the power reception side controller 25A sets all the loads 3 to be OFF (Step V3a), sets all the resonance L changeover switches L2_SW to be OFF (Step V4a), and ends the processing.

If not all the loads 3 are set to be switched OFF at Step V2a described above (No at Step V2a), the power reception side controller 25A determines whether the operation switch SW1 is turned ON (Step V21a). If it is determined that the operation switch SW1 is turned ON (Yes at Step V21a), the power reception side controller 25A counts up the ON time of the operation switch SW1 of the first load 3a (Step V22a), and acquires the estimated current value of the first load 3a (Step V23a). If it is determined that the operation switch SW1 is not turned ON (No at Step V21a), the power reception side controller 25A sets the estimated current value of the first load 3a to be zero (0) (Step V24a), and resets the ON time of the operation switch SW1 of the first load 3a (Step V25a).

Next, the power reception side controller 25A determines whether the operation switch SW2 is turned ON (Step V26a). If it is determined that the operation switch SW2 is turned ON (Yes at Step V26a), the power reception side controller 25A counts up the ON time of the operation switch SW2 of the second load 3b (Step V27a), and acquires the estimated current value of the second load 3b (Step V28a). If it is determined that the operation switch SW2 is not turned ON (No at Step V26a), the power reception side controller 25A sets the estimated current value of the second load 3b to be zero (0) (Step V29a), and resets the ON time of the operation switch SW2 of the second load 3b (Step V30a).

Next, the power reception side controller 25A determines whether the operation switch SW3 is turned ON (Step V31a). If it is determined that the operation switch SW3 is turned ON (Yes at Step V31a), the power reception side controller 25A counts up the ON time of the operation switch SW3 of the third load 3c (Step V32a), and acquires the estimated current value of the third load 3c (Step V33a). If it is determined that the operation switch SW3 is not turned ON (No at Step V31a), the power reception side controller 25A sets the estimated current value of the third load 3c to be zero (0) (Step V34a), and resets the ON time of the operation switch SW3 of the third load 3c (Step V35a).

Figure 33:
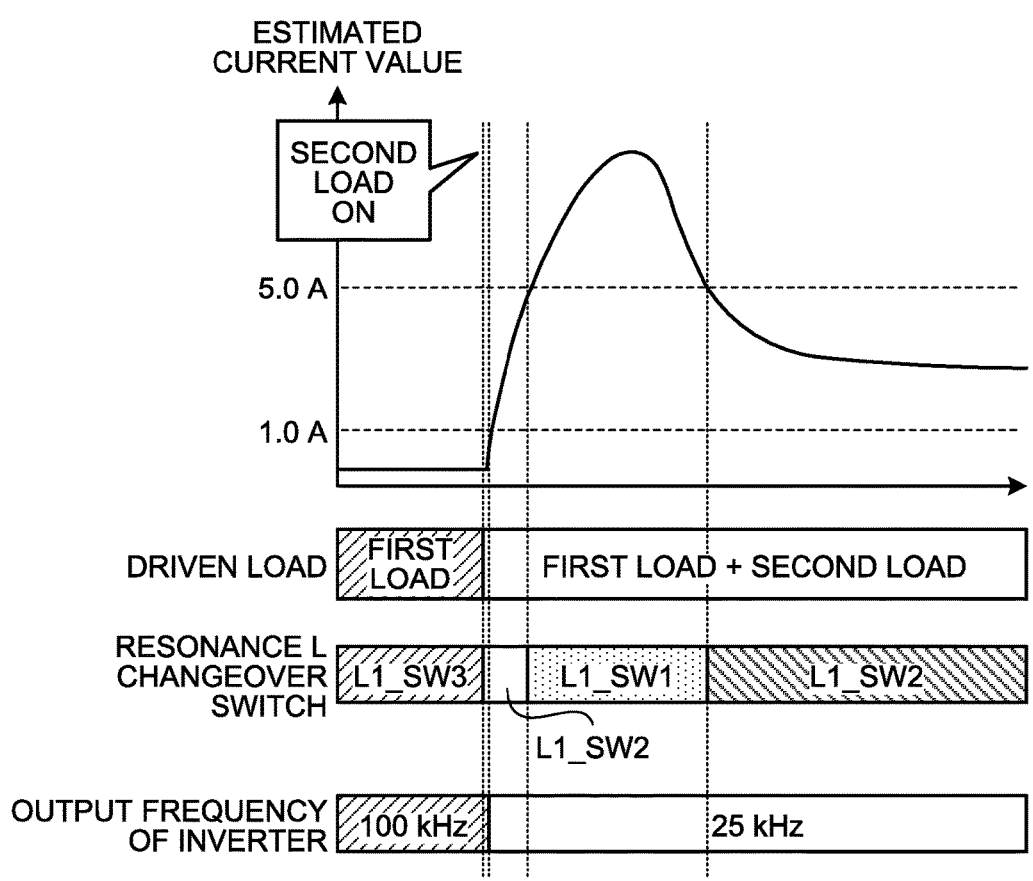
FIG. 33 is a diagram illustrating a relation between an estimated current value of a load and a resonance coil according to the modification of the second embodiment.

Next, the power reception side controller 25A obtains the estimated total current value by totaling the estimated current values of the individual loads 3 (Step V36a), and transmits the estimated total current value to the power transmission unit 10A (Step V5a). Subsequently, as illustrated in FIG. 33, the power reception side controller 25A selects the resonance L changeover switch L2_SW to be turned ON based on the estimated total current value (Step V6a), and turns ON the selected resonance L changeover switch L2_SW (Step V7a). Accordingly, even when the current value of the load 3 varies with a lapse of time, the power reception side controller 25A can match the output impedance Z0 and the input impedance Z1 in cooperation with impedance control performed by the power transmission side controller 15A. Next, the power reception side controller 25A sets the load 3 to be ON in accordance with the switch information (Step V8a), and ends the processing.

As described above, in the non-contact power transmission device 1A according to the modification of the second embodiment, the power transmission side controller 15A and the power reception side controller 25A change the impedance of the impedance variable circuit 16A based on time that has elapsed after the operation switch SW is turned ON. Accordingly, even when the impedance of the load 3 varies with a lapse of time, the non-contact power transmission device 1A can match the output impedance Z0 on the power supply 2 side with respect to the power transmission coil unit 11A and the input impedance Z1 on the load 3 side with respect to the power transmission coil unit 11A.

In the non-contact power transmission device 1A, the impedance variable circuit 16A is installed in the power transmission unit 10A, and the impedance variable circuit 26A is installed in the power reception unit 20A. However, the embodiment is not limited thereto. In the non-contact power transmission device 1A, the impedance variable circuit 26A is not necessarily installed in the power reception unit 20A, and only the impedance variable circuit 16A may be installed in the power transmission unit 10A. In the non-contact power transmission device 1A, the impedance variable circuit 16A is not necessarily installed in the power transmission unit 10A, and only the impedance variable circuit 26A may be installed in the power reception unit 20A.

The non-contact power transmission device 1A may include the matching circuit 40 similarly to the first embodiment. In the non-contact power transmission device 1A, the impedance variable circuits 16A and 26A may be configured using the variable resonance coil L the inductance value of which is variable.

Third Embodiment

Next, the following describes a non-contact power transmission device 1B according to a third embodiment. The non-contact power transmission device 1B according to the third embodiment is different from the non-contact power transmission device 1 according to the first embodiment in that impedance matching is performed by switching connection of only the resonance capacitor C of an impedance variable circuit 16B. In the third embodiment, the same component as that of the non-contact power transmission device 1 according to the first embodiment is denoted by the same reference numeral, and detailed description thereof will not be repeated.

Figure 36:
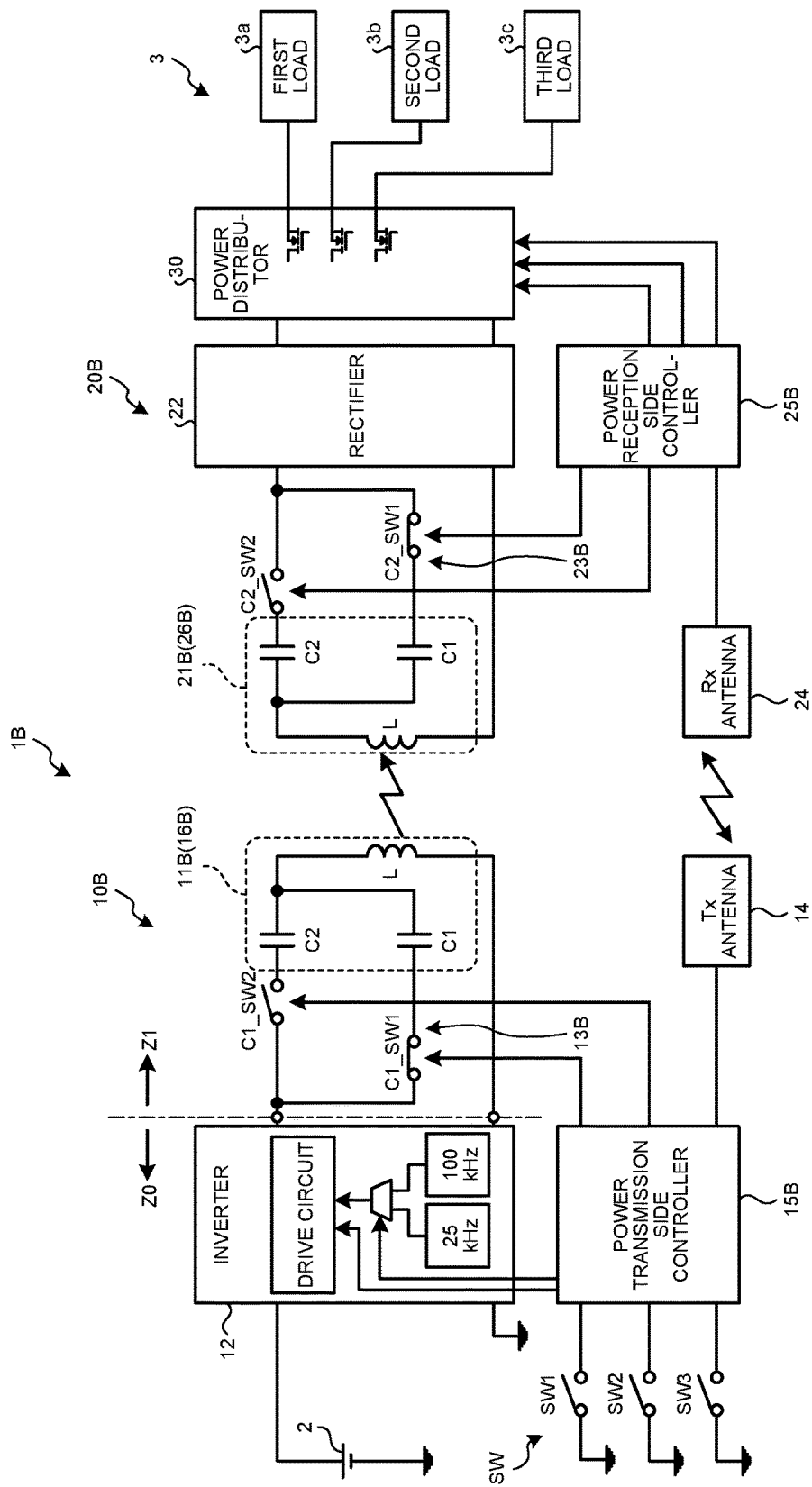
FIG. 36 is a block diagram illustrating a configuration example of a non-contact power transmission device according to a third embodiment.

As illustrated in FIG. 36, the impedance variable circuit 16B includes a plurality of individual resonance capacitors C (C1, C2) and one resonance coil L. In the impedance variable circuit 16B, the individual resonance capacitors C are selectively connected via a switching mechanism 13B. Accordingly, in the impedance variable circuit 16B, the capacitance of the resonance capacitor C is changed, and the impedance of the impedance variable circuit 16B is changed.

The switching mechanism 13B includes a plurality of resonance C changeover switches C1_SW (C1_SW1, C1_SW2), and switches connection of the individual resonance capacitors C of a power transmission coil unit 11B when the resonance C changeover switch C1_SW is controlled to be ON/OFF. Specifically, the switching mechanism 13B switches the resonance capacitors C the capacitance of which is different from each other, or sequentially switches the number of the resonance capacitors C to be connected. For example, the switching mechanism 13B connects the resonance capacitor C1 having large capacitance when the resonance C changeover switch C1_SW1 is turned ON and the resonance C changeover switch C1_SW2 is turned OFF. The switching mechanism 13B connects the resonance capacitor C2 having small capacitance when the resonance C changeover switch C1_SW2 is turned ON and the resonance C changeover switch C1_SW1 is turned OFF. As the resonance C changeover switch C1_SW of the switching mechanism 13B, a semiconductor switch, a mechanical switch, or the like is used.

A power transmission side controller 15B controls the resonance C changeover switch C1_SW of the switching mechanism 13B to be ON/OFF based on the received switch information, and switches connection of the individual resonance capacitors C in the impedance variable circuit 16B. Accordingly, even when the impedance of the load 3 is changed, the power transmission side controller 15B changes the impedance of the impedance variable circuit 16B by changing the capacitance of the impedance variable circuit 16B, and matches the output impedance Z0 and the input impedance Z1 in cooperation with impedance control performed by a power reception side controller 25B (described later).

Next, the following describes a configuration example of an impedance variable circuit 26B of a power reception unit 20B. Similarly to the impedance variable circuit 16B of a power transmission unit 10B, the impedance variable circuit 26B of the power reception unit 20B includes a plurality of resonance capacitors C (C1, C2) and one resonance coil L. In the impedance variable circuit 26B, the individual resonance capacitors C are selectively connected via a switching mechanism 23B.

Similarly to the switching mechanism 13B of the power transmission unit 10B, the switching mechanism 23B includes a plurality of resonance C changeover switches C2_SW (C2_SW1, C2_SW2), and switches connection of the individual resonance capacitors C of a power reception coil unit 21B when the resonance C changeover switch C2_SW is controlled to be ON/OFF. Specifically, the switching mechanism 23B switches the individual resonance capacitors C the capacitance of which is different from each other, or sequentially switches the number of the resonance capacitors C to be connected. For example, the switching mechanism 23B connects the resonance capacitor C1 having large capacitance when the resonance C changeover switch C2_SW2 is turned OFF and the resonance C changeover switch C2_SW1 is turned ON. The switching mechanism 23B connects the resonance capacitor C2 having small capacitance when the resonance C changeover switch C2_SW1 is turned OFF and the resonance C changeover switch C2_SW2 is turned ON. As the resonance C changeover switch C2_SW of the switching mechanism 23B, a semiconductor switch, a mechanical switch, or the like is used.

The power reception side controller 25B controls the resonance C changeover switch C2_SW of the switching mechanism 23B to be ON/OFF based on the received switch information, and switches connection of the individual resonance capacitors C in the impedance variable circuit 26B. Accordingly, even when the impedance of the load 3 is changed, the power reception side controller 25B changes the impedance of the impedance variable circuit 26B by changing the capacitance of the impedance variable circuit 26B, and matches the output impedance Z0 and the input impedance Z1 in cooperation with impedance control performed by the power transmission side controller 15B described above.

Next, the following describes switching control for the resonance capacitor C of the impedance variable circuit 16B. Switching control for the resonance capacitor C of the impedance variable circuit 26B of the power reception coil unit 21B is the same as the switching control for the resonance capacitor C of the impedance variable circuit 16B of the power transmission coil unit 11B, so that description thereof will not be repeated.

Figure 37:
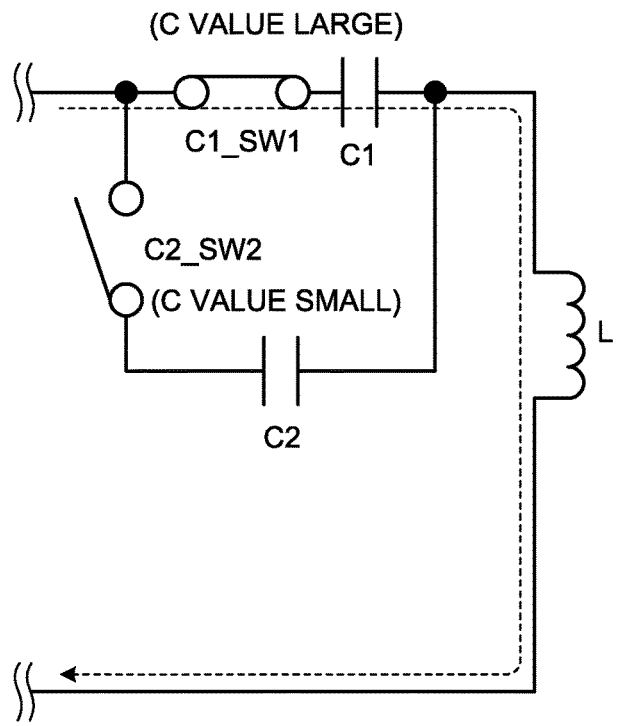
FIG. 37 is a circuit diagram illustrating a connection example (capacitance is large) of a resonance capacitor according to the third embodiment.

If it is determined that the current value of the electric current flowing in the load 3 is large and that the impedance of the load 3 is small based on the switch information, as illustrated in FIG. 37, the power transmission side controller 15B of the power transmission coil unit 11B sets the resonance C changeover switch C1_SW1 of the switching mechanism 13B to be ON and sets the resonance C changeover switch C1_SW2 to be OFF to connect the resonance capacitor C1 having large capacitance. The power transmission side controller 15B switches the capacitor to the resonance capacitor C1 having large capacitance, and lowers the output frequency of the inverter 12. Accordingly, when the impedance of the load 3 is small, the resonance frequency is lowered when the capacitance is increased, and the power transmission side controller 15B can improve transmission efficiency (refer to FIG. 26). In the power transmission side controller 15B, the current value of the electric current is increased but the skin effect of the resonance coil L can be suppressed, so that transmission efficiency can be improved. The impedance variable circuit 16B can suppress the influence of the skin effect, so that a loss in power transmission by the resonance coil L can be suppressed even when the conductor cross-sectional area of the resonance coil L per unit current is reduced. Accordingly, the impedance variable circuit 16B can suppress heat generation, and can simplify and downsize a heat radiation structure. The impedance variable circuit 16B can use the resonance coil L having a small conductor cross-sectional area, so that the size of the resonance coil L can be reduced.

Figure 38:
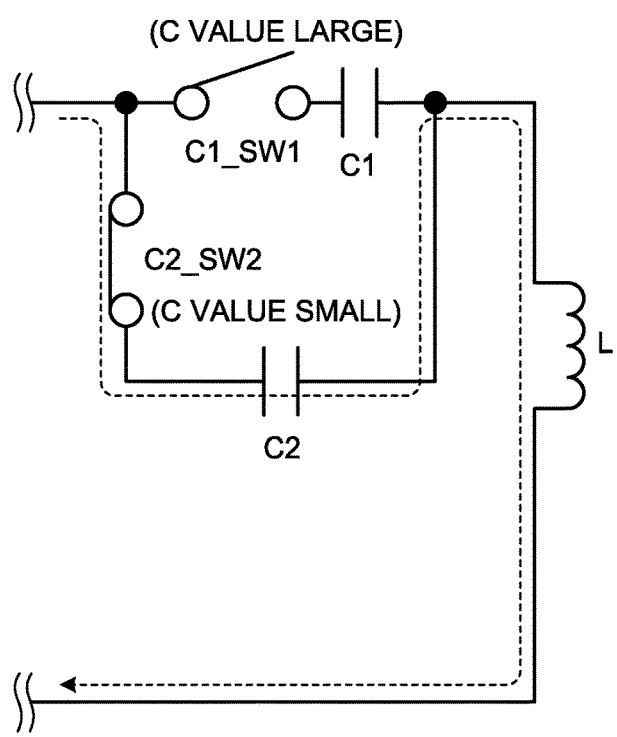
FIG. 38 is a circuit diagram illustrating a connection example (capacitance is small) of the resonance capacitor according to the third embodiment.

On the other hand, if it is determined that the current value of the electric current flowing in the load 3 is small and that the impedance of the load 3 is large based on the switch information, as illustrated in FIG. 38, the power transmission side controller 15B sets the resonance C changeover switch C1_SW2 of the switching mechanism 13B to be ON and sets the resonance C changeover switch C1_SW1 to be OFF to connect the resonance capacitor C2 having small capacitance. The power transmission side controller 15B switches the capacitor to the resonance capacitor C having small capacitance, and increases the output frequency of the inverter 12. Accordingly, when the impedance of the load 3 is large, the resonance frequency is increased when the capacitance is reduced, and the power transmission side controller 15B can improve transmission efficiency (refer to FIG. 26). In the power transmission side controller 15B, the current value of the electric current is reduced but the influence of the skin effect of the resonance coil L can be suppressed, so that transmission efficiency can be improved. In the power transmission side controller 15B, the resonance frequency is increased and the influence of the skin effect of the resonance coil L is increased, but the current value of the electric current is reduced because the impedance of the load 3 is large. Thus, transmission efficiency is not deteriorated. In the impedance variable circuit 16B, the influence of the skin effect is increased but the current value of the electric current is reduced, so that a loss in power transmission by the resonance coil L can be suppressed even when the conductor cross-sectional area of the resonance coil L per unit current is reduced. The impedance variable circuit 16B can use the resonance coil L having a small conductor cross-sectional area, so that the size of the resonance coil L can be reduced.

Figure 41:
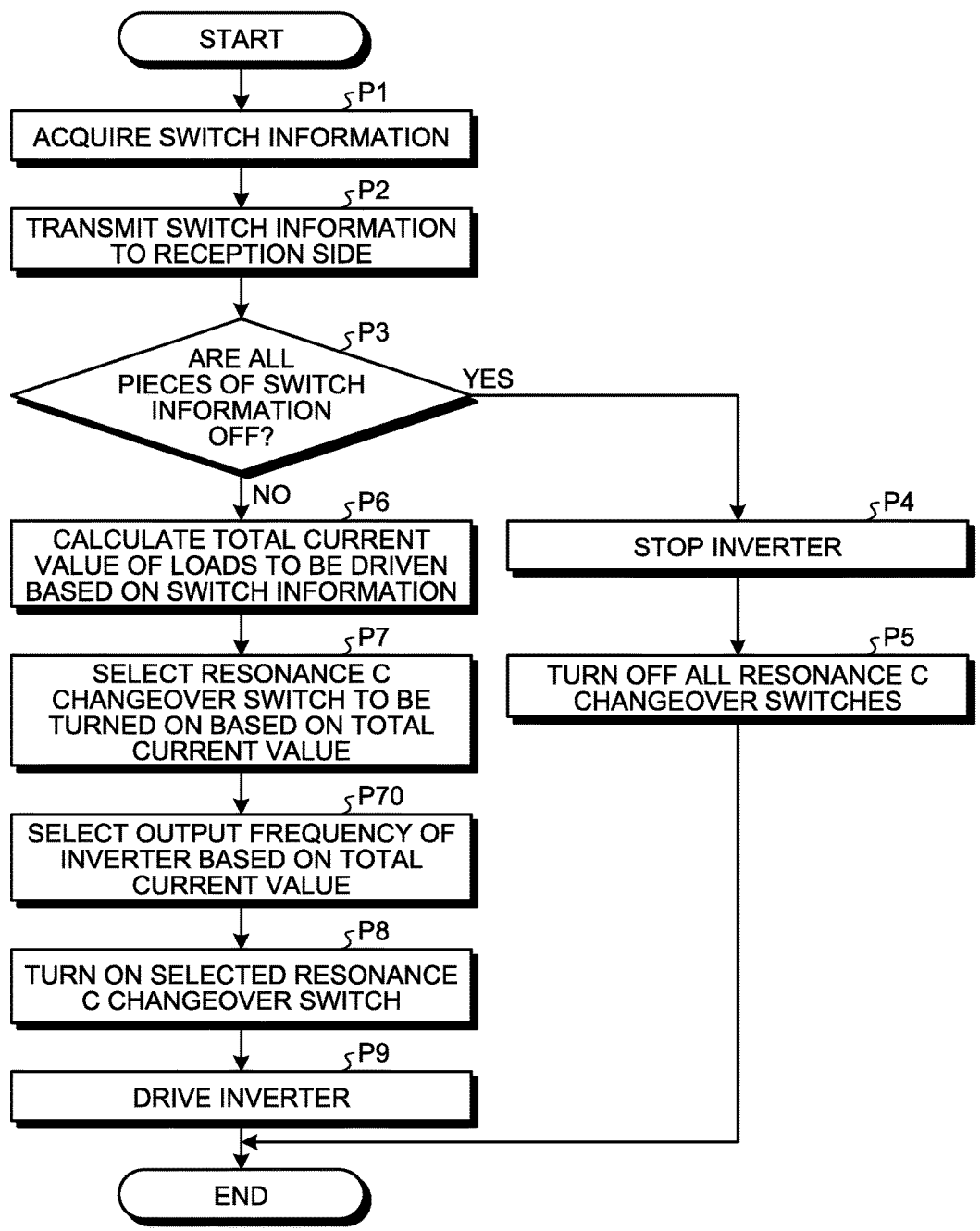
FIG. 41 is a flowchart illustrating an operation example of a power transmission side controller according to the third embodiment.

Next, the following describes an operation example of the non-contact power transmission device 1B according to the third embodiment. As illustrated in FIG. 41, the power transmission side controller 15B acquires the switch information indicating ON or OFF of the load 3 from the operation switch SW (Step P1). Next, the power transmission side controller 15B transmits the switch information to the power reception unit 20B via the Tx antenna 14 (Step P2). Subsequently, the power transmission side controller 15B determines whether all the loads 3 are set to be switched OFF based on the switch information (Step P3). If all the loads 3 are set to be switched OFF (Yes at Step P3), the power transmission side controller 15B stops the inverter 12 (Step P4), and sets all the resonance C changeover switches C1_SW to be OFF (Step P5).

Figure 39:
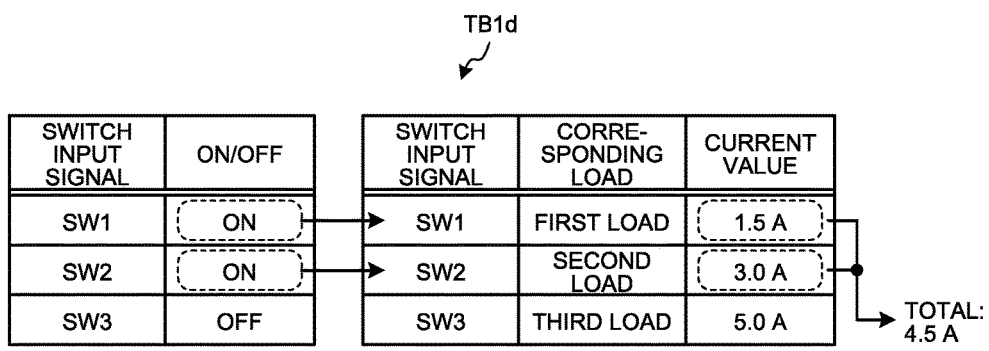
FIG. 39 is a diagram illustrating a configuration example of a load current table according to the third embodiment.
Figure 40:
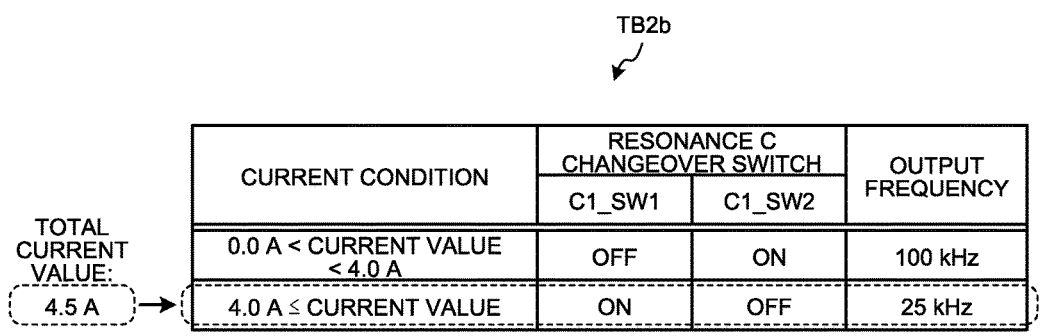
FIG. 40 is a diagram illustrating a configuration example of a resonance C circuit selection table according to the third embodiment.

If not all the loads 3 are set to be switched OFF at Step P3 described above (No at Step P3), the power transmission side controller 15B calculates the total current value of the loads 3 to be driven based on the switch information (Step P6). For example, the power transmission side controller 15B refers to a load current table TB1d illustrated in FIG. 39, and calculates the total current value (4.5 A) obtained by totaling the current value (1.5 A) of the first load 3a the operation switch SW of which is turned ON and the current value (3.0 A) of the second load 3b the operation switch SW of which is turned ON. Next, the power transmission side controller 15B selects the resonance C changeover switch C1_SW to be switched ON based on the total current value (Step P7), and selects the output frequency (resonance frequency) of the inverter 12 based on the total current value (Step P70). For example, the power transmission side controller 15B refers to a resonance C circuit selection table TB2b illustrated in FIG. 40, and selects the output frequency (25 kHz) of the inverter 12 based on the total current value (4.5 A). Next, the power transmission side controller 15B turns ON the selected resonance C changeover switch C1_SW (Step P8). For example, the power transmission side controller 15B refers to the resonance C circuit selection table TB2b, and according to the total current value (4.5 A), sets the resonance C changeover switch C1_SW2 to be OFF, and sets the resonance C changeover switch C1_SW1 to be ON. Accordingly, when the total current value of the electric current is large and the impedance of the load 3 is small, the power transmission side controller 15B can set the resonance capacitor C1 having large capacitance in the impedance variable circuit 16B to perform power transmission. Thus, the power transmission side controller 15B can change the capacitance of the impedance variable circuit 16B, and change the impedance of the impedance variable circuit 16B. Accordingly, the power transmission side controller 15B can match the output impedance Z0 and the input impedance Z1 in cooperation with impedance control performed by the power reception side controller 25B. Subsequently, the power transmission side controller 15B drives the inverter 12 to transmit electric power to the power reception unit 20B by magnetic resonance (Step P9), and ends the processing.

Figure 42:
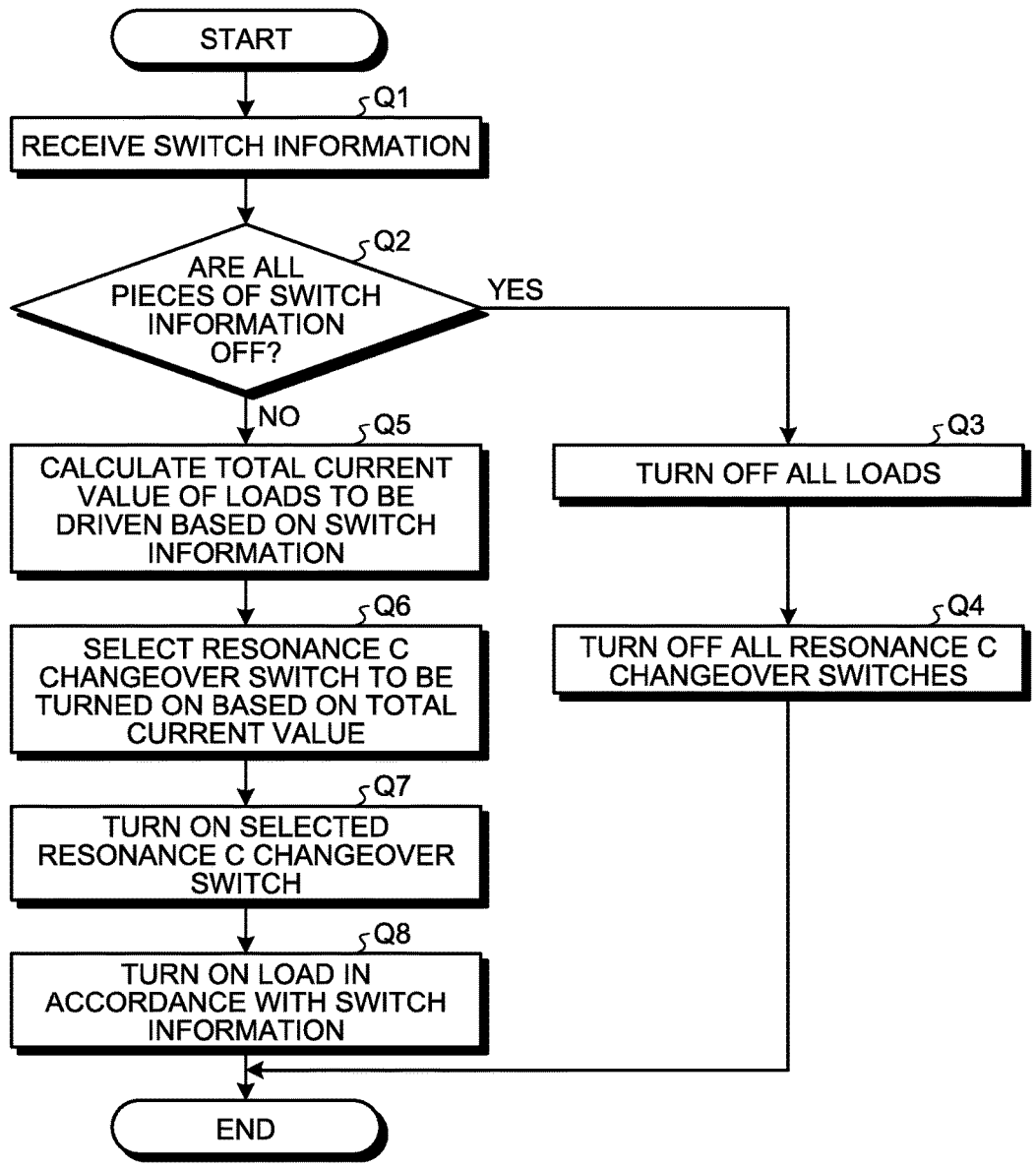
FIG. 42 is a flowchart illustrating an operation example of a power reception side controller according to the third embodiment.

Next, the following describes an operation example of the power reception side controller 25B of the power reception unit 20B. As illustrated in FIG. 42, the power reception side controller 25B of the power reception unit 20B receives the switch information transmitted from the power transmission unit 10B (Step Q1). Next, the power reception side controller 25B determines whether all the loads 3 are set to be switched OFF based on the switch information (Step Q2). If all the loads 3 are set to be switched OFF (Yes at Step Q2), the power reception side controller 25B sets all the loads 3 to be OFF (Step Q3), sets all the resonance C changeover switches C2_SW to be OFF (Step Q4), and ends the processing.

If not all the loads 3 are set to be switched OFF at Step Q2 described above (No at Step Q2), the power reception side controller 25B calculates the total current value of the loads 3 to be driven based on the switch information (Step Q5). For example, the power reception side controller 25B refers to the load current table TB1d illustrated in FIG. 39, and calculates the total current value (4.5 A) obtained by totaling the current value (1.5 A) of the first load 3a the operation switch SW of which is turned ON and the current value (3.0 A) of the second load 3b the operation switch SW of which is turned ON. Next, the power reception side controller 25B selects the resonance C changeover switch C2_SW to be turned ON based on the total current value (Step Q6), and turns ON the selected resonance C changeover switch C2_SW (Step Q7). For example, the power reception side controller 25B refers to the resonance C circuit selection table (not illustrated), and according to the total current value (4.5 A), sets the resonance C changeover switch C2_SW1 to be ON, and sets the resonance C changeover switch C1_SW2 to be OFF. Accordingly, when the total current value of the electric current is large and the impedance of the load 3 is small, the power reception side controller 25B can set the resonance capacitor C1 having large capacitance in the impedance variable circuit 16B to perform power transmission. Thus, the power reception side controller 25B can change the capacitance of the impedance variable circuit 26B, and change the impedance of the impedance variable circuit 26B. Accordingly, the power reception side controller 25B can match the output impedance Z0 and the input impedance Z1 in cooperation with impedance control performed by the power transmission side controller 15B. Subsequently, the power reception side controller 25B sets the load 3 to be ON in accordance with the switch information (Step Q8), and ends the processing.

As described above, in the non-contact power transmission device 1B according to the third embodiment, the power transmission side controller 15B and the power reception side controller 25B switch connection states of the resonance capacitors C to change the capacitance, and match the output impedance Z0 on the power supply 2 side with respect to the power transmission coil unit 11B and the input impedance Z1 on the load 3 side with respect to the power transmission coil unit 11B. Accordingly, the non-contact power transmission device 1B can perform impedance matching by changing the capacitance of the resonance capacitor C without using the matching circuit, and the circuit scale can be reduced.

Modification of Third Embodiment

Figure 43:
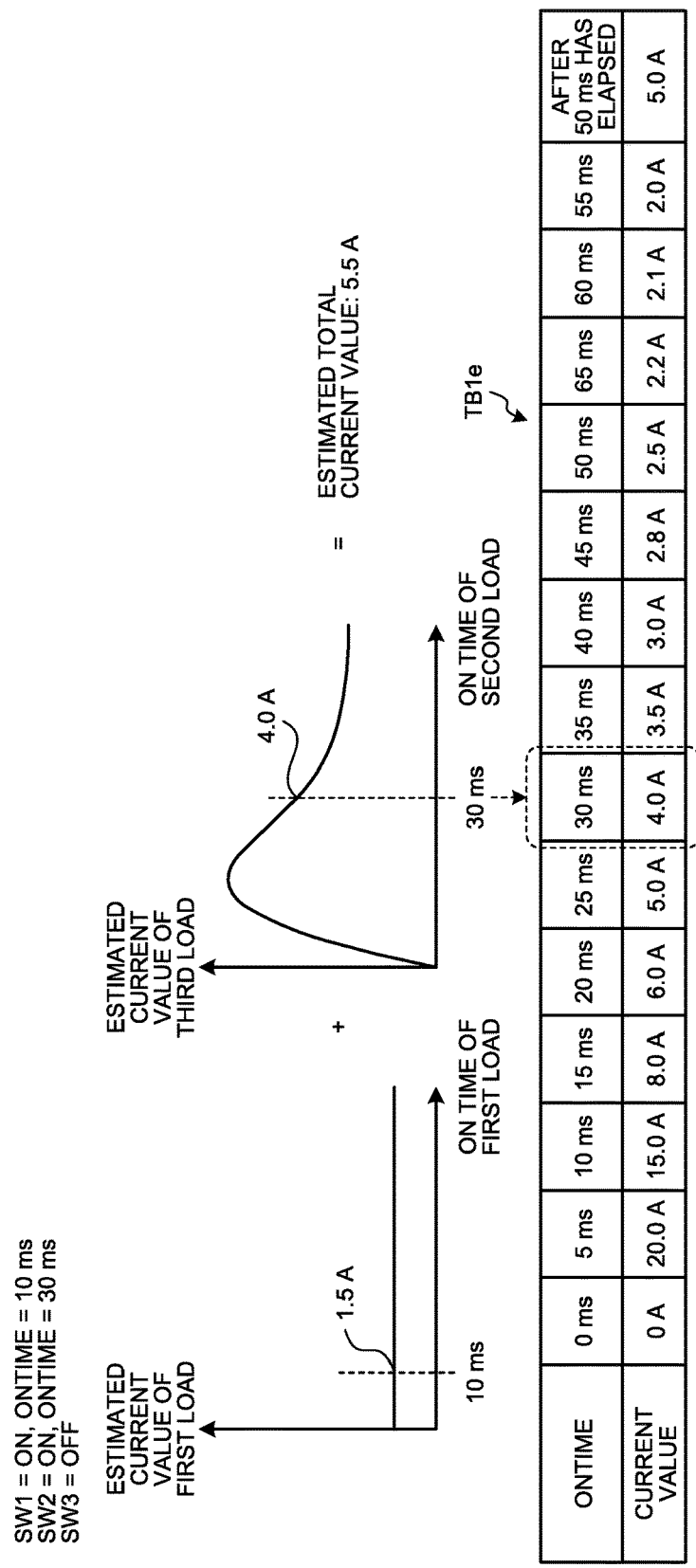
FIG. 43 is a diagram illustrating a configuration example of a load current table according to a modification of the third embodiment.

Next, the following describes an operation example of the non-contact power transmission device 1B according to a modification of the third embodiment. As illustrated in FIG. 43, a load current table TB1e is a table assuming that the current value of the electric current flowing in the load 3 varies with a lapse of time. Description of the same content as the operation example of the non-contact power transmission device 1B according to the third embodiment will not be repeated in some cases.

Figure 46:
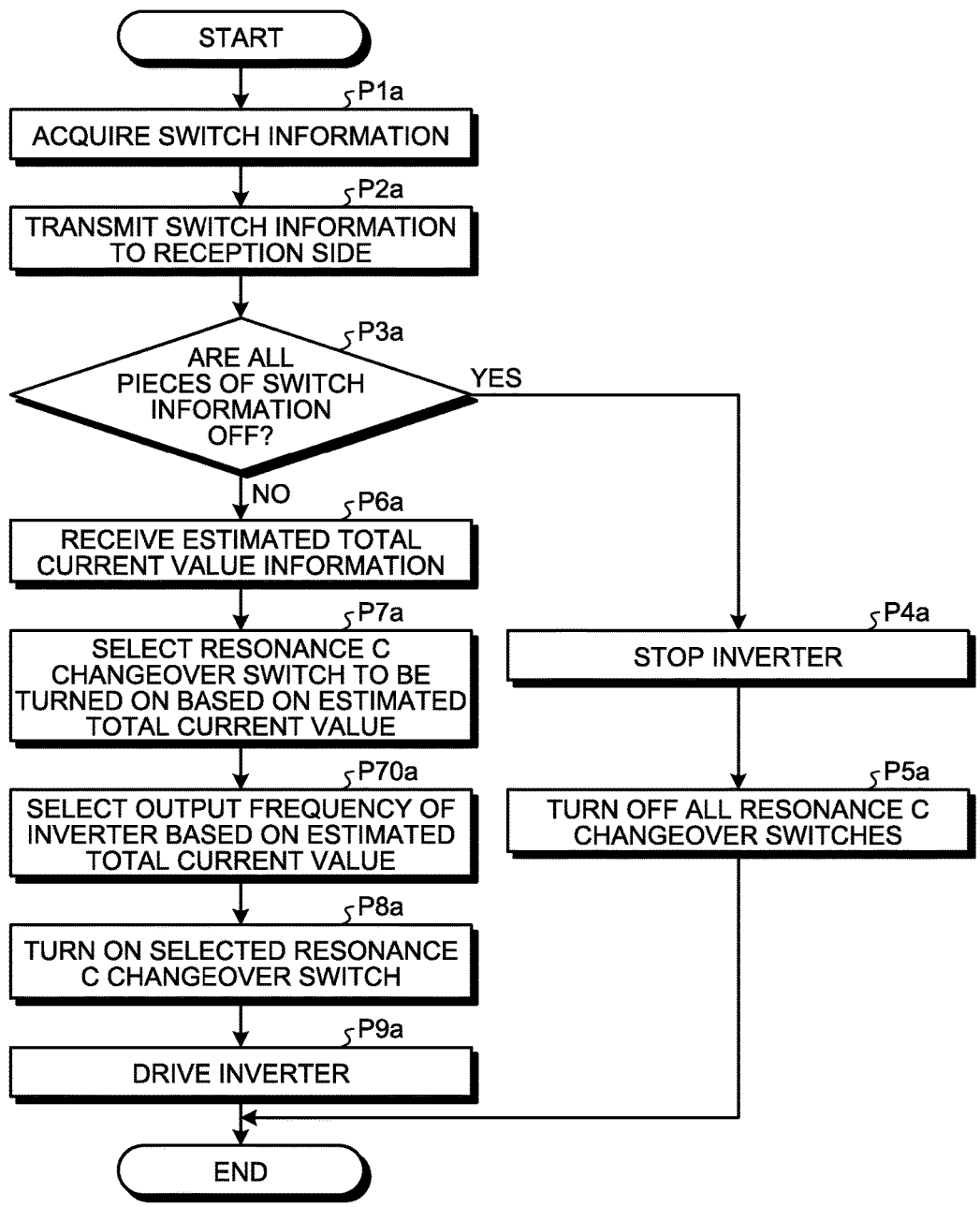
FIG. 46 is a flowchart illustrating an operation example of a power transmission side controller according to the modification of the third embodiment.

As illustrated in FIG. 46, the power transmission side controller 15B acquires the switch information indicating ON or OFF of the load 3 from the operation switch SW (Step P1a), and transmits the switch information to the power reception unit 20B via the Tx antenna 14 (Step P2a). Next, the power transmission side controller 15B determines whether all the loads 3 are set to be switched OFF based on the switch information (Step P3a). If all the loads 3 are set to be switched OFF (Yes at Step P3a), the power transmission side controller 15B stops the inverter 12 (Step P4a), and sets all the resonance C changeover switches C1_SW to be OFF (Step P5a).

Figures 44, 45:
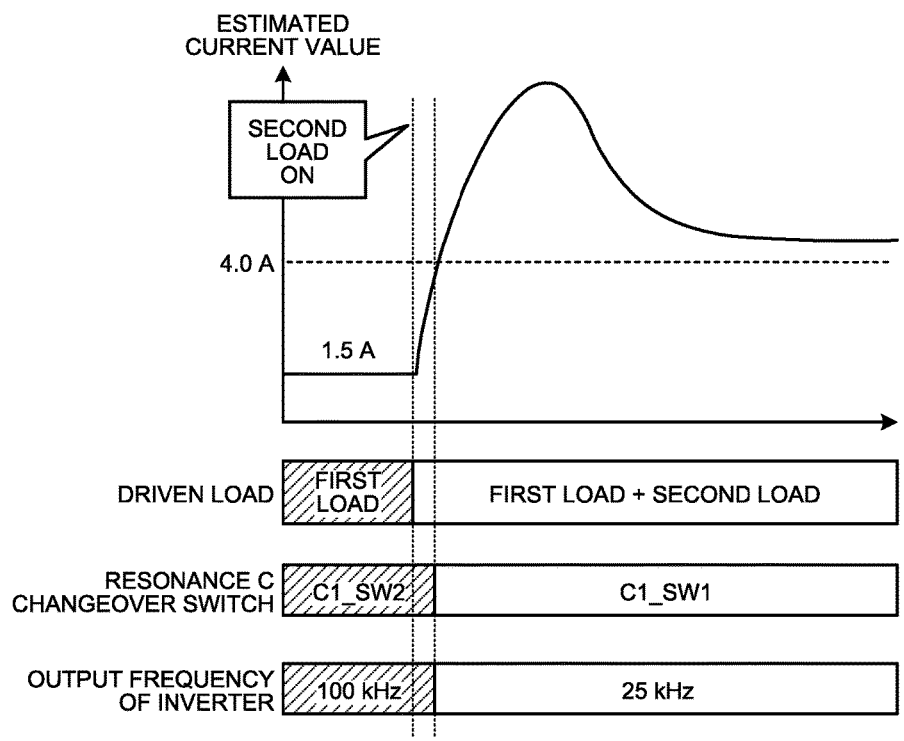
FIG. 44 is a diagram illustrating a configuration example of a resonance C circuit selection table according to the modification of the third embodiment.
FIG. 45 is a diagram illustrating a relation between an estimated current value of a load and an output frequency according to the modification of the third embodiment.

If not all the loads 3 are set to be switched OFF at Step P3a described above (No at Step P3a), the power transmission side controller 15B receives the estimated total current value of the loads 3 to be driven from the power reception unit 20B (Step P6a). For example, the power transmission side controller 15B refers to the load current table TB1e illustrated in FIG. 43, and calculates the estimated total current value (5.5 A) obtained by totaling the current value (1.5 A) of the first load 3a the operation switch SW of which is turned ON and the current value (4.0 A) of the second load 3b the current value of which varies with a lapse of time. Next, the power transmission side controller 15B refers to a resonance C circuit selection table TB2c illustrated in FIG. 44, selects the resonance C changeover switch C1_SW1 to be turned ON based on the estimated total current value (Step P7a), and selects the output frequency of the inverter 12 based on the estimated total current value (Step P70a). Next, the power transmission side controller 15B turns ON the selected resonance C changeover switch C1_SW1 (Step P8a). Accordingly, even when the current value of the load 3 varies with a lapse of time, the power transmission side controller 15B can match the output impedance Z0 and the input impedance Z1 in cooperation with impedance control performed by the power reception side controller 25B. Subsequently, the power transmission side controller 15B drives the inverter 12 to transmit electric power to the power reception unit 20B by magnetic resonance (Step P9a), and ends the processing.

Figure 47:
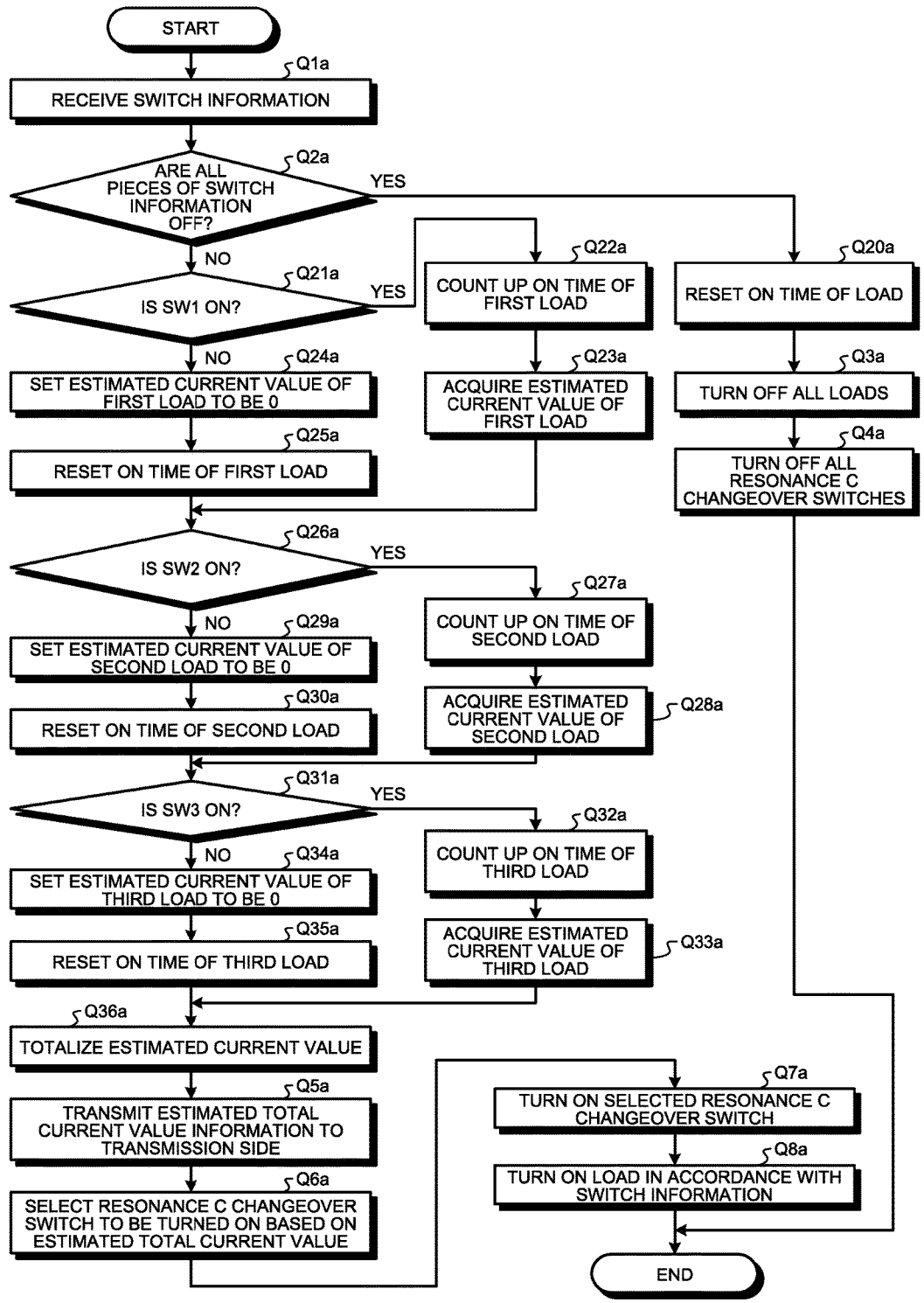
FIG. 47 is a flowchart illustrating an operation example of a power reception side controller according to the modification of the third embodiment.

Next, the following describes an operation example of the power reception side controller 25B of the power reception unit 20B. As illustrated in FIG. 47, the power reception side controller 25B of the power reception unit 20B receives the switch information transmitted from the power transmission unit 10B (Step Q1a). Next, the power reception side controller 25B determines whether all the loads 3 are set to be switched OFF based on the switch information (Step Q2a). If all the loads 3 are set to be switched OFF (Yes at Step Q2a), the power transmission side controller 15B resets the ON time of the operation switch SW of each load 3 (Step Q20a). Subsequently, the power reception side controller 25B sets all the loads 3 to be OFF (Step Q3a), and sets all the resonance C changeover switches C2_SW to be OFF (Step Q4a).

If not all the loads 3 are set to be switched OFF at Step Q2a described above (No at Step Q2a), the power reception side controller 25B determines whether the operation switch SW1 is turned ON (Step Q21a). If it is determined that the operation switch SW1 is turned ON (Yes at Step W21a), the power reception side controller 25B counts up the ON time of the operation switch SW1 of the first load 3a (Step Q22a), and acquires the estimated current value of the first load 3a (Step Q23a). If it is determined that the operation switch SW1 is not turned ON (No at Step Q21a), the power reception side controller 25B sets the estimated current value of the first load 3a to be zero (0) (Step Q24a), and resets the ON time of the operation switch SW1 of the first load 3a (Step Q25a).

Next, the power reception side controller 25B determines whether the operation switch SW2 is turned ON (Step Q26a). If it is determined that the operation switch SW2 is turned ON (Yes at Step Q26a), the power reception side controller 25B counts up the ON time of the operation switch SW2 of the second load 3b (Step Q27a), and acquires the estimated current value of the second load 3b (Step Q28a). If it is determined that the operation switch SW2 is not turned ON (No at Step Q26a), the power reception side controller 25B sets the estimated current value of the second load 3b to be zero (0) (Step Q29a), and resets the ON time of the operation switch SW2 of the second load 3b (Step Q30a).

Next, the power reception side controller 25B determines whether the operation switch SW3 is turned ON (Step Q31a). If it is determined that the operation switch SW3 is turned ON (Yes at Step Q31a), the power reception side controller 25B counts up the ON time of the operation switch SW3 of the third load 3c (Step Q32a), and acquires the estimated current value of the third load 3c (Step Q33a). If it is determined that the operation switch SW3 is not turned ON (No at Step Q31a), the power reception side controller 25B sets the estimated current value of the third load 3c to be zero (0) (Step Q34a), and resets the ON time of the operation switch SW3 of the third load 3c (Step Q35a).

Next, the power reception side controller 25B totals the estimated current values of the individual loads 3 to obtain the estimated total current value (Step Q36a), and transmits the estimated total current value to the power transmission unit 10B (Step Q5a). Subsequently, the power reception side controller 25B selects the resonance C changeover switch C1_SW to be ON based on the estimated total current value (Step Q6a), and turns ON the selected resonance C changeover switch C1_SW (Step Q7a). Accordingly, even when the current value of the load 3 varies with a lapse of time, the power reception side controller 25B can match the output impedance Z0 and the input impedance Z1 in cooperation with impedance control performed by the power transmission side controller 15B. Subsequently, the power reception side controller 25B sets the load 3 to be ON in accordance with the switch information (Step Q8a), and ends the processing.

As described above, in the non-contact power transmission device 1B according to the modification of the third embodiment, the power transmission side controller 15B and the power reception side controller 25B change the capacitance of the impedance variable circuit 16B based on time that has elapsed after the operation switch SW is turned ON. Accordingly, even when the impedance of the load 3 varies with a lapse of time, the non-contact power transmission device 1B can match the output impedance Z0 on the power supply 2 side with respect to the power transmission coil unit 11B and the input impedance Z1 on the load 3 side with respect to the power transmission coil unit 11B.

In the non-contact power transmission device 1B, the impedance variable circuit 16B is installed in the power transmission unit 10B, and the impedance variable circuit 26B is installed in the power reception unit 20B. However, the embodiment is not limited thereto. In the non-contact power transmission device 1B, the impedance variable circuit 26B is not necessarily installed in the power reception unit 20B, and only the impedance variable circuit 16B may be installed in the power transmission unit 10B. In the non-contact power transmission device 1B, the impedance variable circuit 16B is not necessarily installed in the power transmission unit 10B, and only the impedance variable circuit 26B may be installed in the power reception unit 20B.

The non-contact power transmission device 1B may include the matching circuit 40 similarly to the first embodiment. In the non-contact power transmission device 1B, the impedance variable circuits 16B and 26B may be configured using the resonance capacitor C the capacitance of which is variable.

Figure 48:
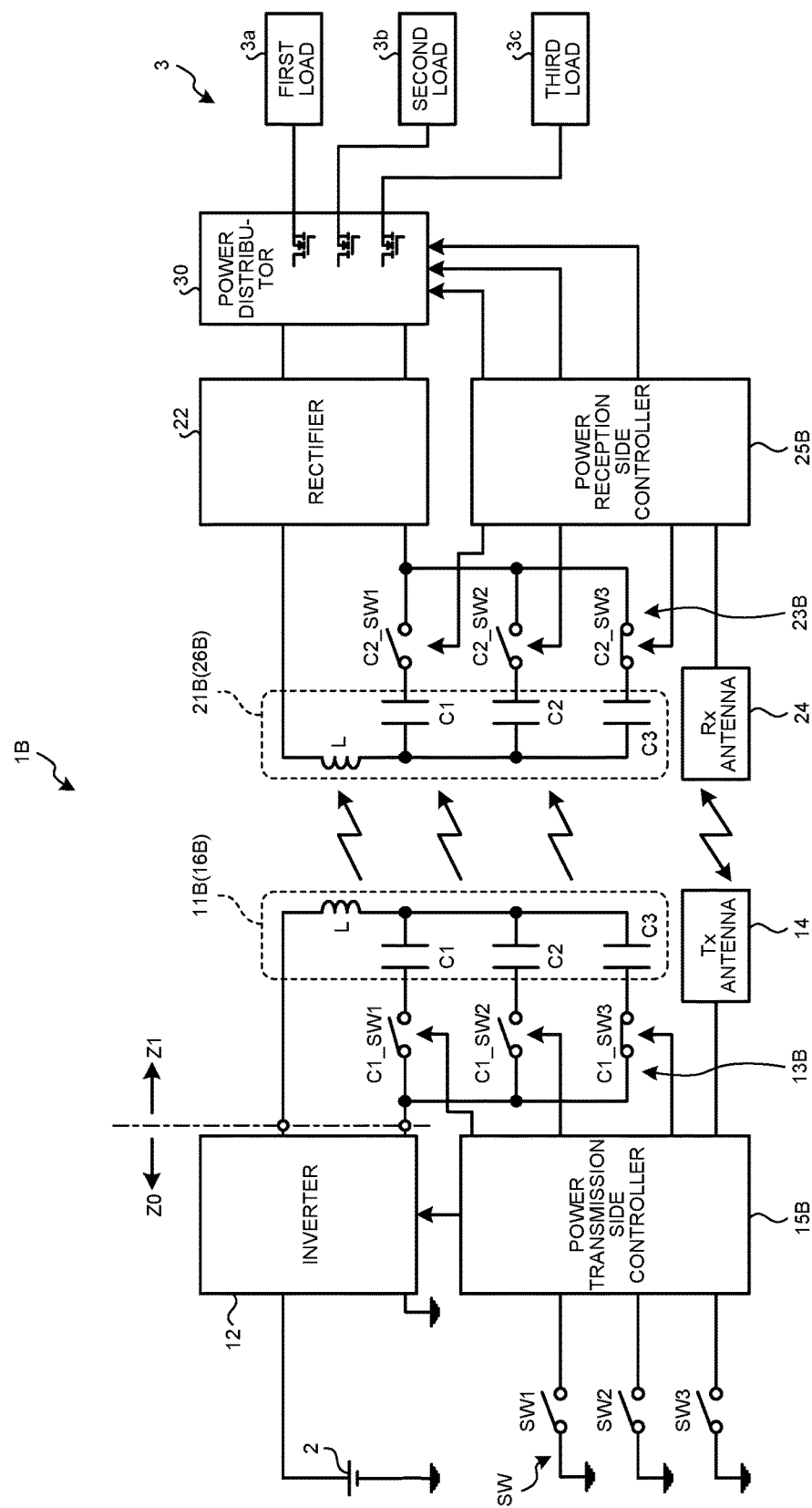
FIG. 48 is a block diagram illustrating a configuration example of a non-contact power transmission device according to the modification of the third embodiment.

As illustrated in FIG. 48, in the non-contact power transmission device 1B according to the third embodiment, one or more of the three resonance capacitors C may be selected by the resonance C changeover switches C1_SW and C2_SW, or a plurality of resonance capacitors C may be selected.

The non-contact power transmission device according to the present embodiments changes impedance of an impedance variable circuit including a resonance coil and a resonance capacitor to match output impedance on the power supply side with respect to the power transmission coil unit and the input impedance on the load side with respect to the power transmission coil unit. Accordingly, the non-contact power transmission device can properly match the output impedance and the input impedance.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A non-contact power transmission device comprising:
a power supply that supplies electric power;
a power transmission coil unit that is connected to the power supply and transmits electric power in a non-contact manner;
a power reception coil unit that is connected to a load that consumes electric power, receives the electric power transmitted from the power transmission coil unit in a non-contact manner, and supplies the received electric power to the load; and
a controller configured to control the power transmission coil unit and the power reception coil unit, wherein
at least one of the power transmission coil unit and the power reception coil unit includes an impedance variable circuit an impedance of which is variable,
the impedance variable circuit includes a plurality of resonance coils capable of changing an inductance value of the impedance variable circuit and at least one resonance capacitor,
the controller configured to change impedance of the impedance variable circuit, and match an output impedance on the power supply side with respect to the power transmission coil unit and an input impedance on the load side with respect to the power transmission coil unit, and
the impedance variable circuit further includes a switch mechanism connected to the controller and configured to selectively connect at least two of the resonance coils in a first configuration in which the at least two resonance coils are connected to each other in series and in a second configuration in which the at least two resonance coils are connected to each other in parallel.

2. The non-contact power transmission device according to claim 1, wherein
the impedance variable circuit includes a plurality of resonance capacitors and a plurality of LC circuits, each of the LC circuits includes a pair of a respective one of the resonance coils and a respective one of the resonance capacitors, and
the controller configured to signal the switch mechanism to switch the LC circuits to be connected in series or in parallel to change the inductance value and the capacitance, and match the output impedance and the input impedance.

3. The non-contact power transmission device according to claim 1, wherein
the impedance variable circuit includes one resonance capacitor.

4. A non-contact power transmission device comprising:
a power supply that supplies electric power;
a power transmission coil unit that is connected to the power supply and transmits electric power in a non-contact manner;
a power reception coil unit that is connected to a load that consumes electric power, receives the electric power transmitted from the power transmission coil unit in a non-contact manner, and supplies the received electric power to the load; and
a controller configured to control the power transmission coil unit and the power reception coil unit, wherein
at least one of the power transmission coil unit and the power reception coil unit includes an impedance variable circuit an impedance of which is variable,
the impedance variable circuit includes at least one of a resonance coil capable of changing an inductance value of the impedance variable circuit and a resonance capacitor capable of changing a capacitance of the impedance variable circuit,
the controller configured to change impedance of the impedance variable circuit, and match an output impedance on the power supply side with respect to the power transmission coil unit and an input impedance on the load side with respect to the power transmission coil unit,
the impedance variable circuit includes a plurality of LC circuits including a pair of a resonance coil and a resonance capacitor,
the controller configured to switch the LC circuits to be connected in series or in parallel to change the inductance value and the capacitance, and match the output impedance and the input impedance, and
the resonance coils are sequentially connected in series, and a conductor cross-sectional area of the resonance coil at a later stage is smaller than a conductor cross-sectional area of the resonance coil at a former stage.

5. A non-contact power transmission device comprising:
a power supply that supplies electric power;

a power transmission coil unit that is connected to the power supply and transmits electric power in a non-contact manner;

a power reception coil unit that is connected to a load that consumes electric power, receives the electric power transmitted from the power transmission coil unit in a non-contact manner, and supplies the received electric power to the load; and a controller configured to control the power transmission coil unit and the power reception coil unit, wherein at least one of the power transmission coil unit and the power reception coil unit includes an impedance variable circuit an impedance of which is variable, the impedance variable circuit includes at least one of a resonance coil capable of changing an inductance value of the impedance variable circuit and a resonance capacitor capable of changing a capacitance of the impedance variable circuit, the controller configured to change impedance of the impedance variable circuit, and match an output impedance on the power supply side with respect to the power transmission coil unit and an input impedance on the load side with respect to the power transmission coil unit, the load is operated with an operation switch that causes electric current to flow when being turned on and causes the electric current to be stopped when being turned off, the controller configured to change impedance of the impedance variable circuit based on an on or off operation of the operation switch, and the controller configured to further change the impedance of the impedance variable circuit based on time that has elapsed after the operation switch is turned on.

6. The non-contact power transmission device according to claim 1, wherein the controller configured to report anomaly when a current value of electric current actually supplied to the load does not satisfy a predetermined threshold value of electric current.

7. The non-contact power transmission device according to claim 1, further comprising:

a matching circuit including a variable coil different from the resonance coil and a variable capacitor different from the resonance capacitor, wherein the controller configured to cause the impedance variable circuit to cooperate with the matching circuit, and match the output impedance and the input impedance.

8. The non-contact power transmission device according to claim 3, wherein the resonance coils are sequentially connected in series, and a conductor cross-sectional area of the resonance coil at a later stage is smaller than a conductor cross-sectional area of the resonance coil at a former stage.

9. The non-contact power transmission device according to claim 2, wherein the load is operated with an operation switch that causes electric current to flow when being turned on and causes the electric current to be stopped when being turned off, and the controller configured to change impedance of the impedance variable circuit based on an on or off operation of the operation switch.

10. The non-contact power transmission device according to claim 3, wherein the load is operated with an operation switch that causes electric current to flow when being turned on and causes the electric current to be stopped when being turned off, and the controller configured to change impedance of the impedance variable circuit based on an on or off operation of the operation switch.

11. The non-contact power transmission device according to claim 4, wherein the load is operated with an operation switch that causes electric current to flow when being turned on and causes the electric current to be stopped when being turned off, and the controller configured to change impedance of the impedance variable circuit based on an on or off operation of the operation switch.

12. The non-contact power transmission device according to claim 2, wherein the controller configured to report anomaly when a current value of electric current actually supplied to the load does not satisfy a predetermined threshold value of electric current.

13. The non-contact power transmission device according to claim 3, wherein the controller configured to report anomaly when a current value of electric current actually supplied to the load does not satisfy a predetermined threshold value of electric current.

14. The non-contact power transmission device according to claim 4, wherein the controller configured to report anomaly when a current value of electric current actually supplied to the load does not satisfy a predetermined threshold value of electric current.

15. The non-contact power transmission device according to claim 5, wherein the controller configured to report anomaly when a current value of electric current actually supplied to the load does not satisfy a predetermined threshold value of electric current.

* * * * *